(12) United States Patent
Wu et al.

(10) Patent No.: US 12,419,072 B2
(45) Date of Patent: Sep. 16, 2025

(54) TRANSISTOR SOURCE/DRAIN CONTACTS AND METHODS OF FORMING THE SAME

(71) Applicant: Taiwan Semiconductor Manufacturing Co., Ltd., Hsinchu (TW)

(72) Inventors: Pei-Wen Wu, Xinfeng Township (TW); Chun-Hsien Huang, Hsinchu (TW); Wei-Jung Lin, Hsinchu (TW); Chih-Wei Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 718 days.

(21) Appl. No.: 17/651,721

(22) Filed: Feb. 18, 2022

(65) Prior Publication Data

US 2023/0155004 A1    May 18, 2023

Related U.S. Application Data

(60) Provisional application No. 63/278,535, filed on Nov. 12, 2021.

(51) Int. Cl.
*H10D 30/01* (2025.01)
*H10D 30/62* (2025.01)
(Continued)

(52) U.S. Cl.
CPC ......... *H10D 30/024* (2025.01); *H10D 30/031* (2025.01); *H10D 30/6211* (2025.01); *H10D 30/6219* (2025.01); *H10D 30/6713* (2025.01); *H10D 30/6757* (2025.01); *H10D 62/115* (2025.01); *H10D 62/118* (2025.01);
(Continued)

(58) Field of Classification Search
CPC ..... H01L 21/823412; H01L 21/823418; H01L 21/823431; H01L 21/823481; H01L 29/66795; H01L 29/0649; H01L 29/0665; H01L 29/41791; H01L 29/66742; H01L 29/7851; H01L 29/78696; H10D 30/024; H10D 30/6211; H10D 30/6757; H10D 30/6713; H10D 30/6219; H10D 30/031; H10D 84/0151; H10D 84/013;
(Continued)

(56) References Cited

U.S. PATENT DOCUMENTS 9,105,490 B2    8/2015 Wang et al.
9,209,247 B2    12/2015 Colinge et al.
(Continued)

*Primary Examiner* — Igwe U Anya
(74) *Attorney, Agent, or Firm* — Slater Matsil, LLP

(57) ABSTRACT

A method includes depositing an inter-layer dielectric (ILD) over a source/drain region; forming a contact opening through the ILD, wherein the contact opening exposes the source/drain region; forming a metal-semiconductor alloy region on the source/drain region; depositing a first layer of a conductive material on the metal-semiconductor alloy region; depositing an isolation material along sidewalls of the contact opening and over the first layer of the conductive material; etching the isolation material to expose the first layer of the conductive material, wherein the isolation material extends along sidewalls of the contact opening after etching the isolation material; and depositing a second layer of the conductive material on the first layer of the conductive material.

20 Claims, 40 Drawing Sheets

(51) Int. Cl.
*H10D 30/67* (2025.01)
*H10D 62/10* (2025.01)
*H10D 84/01* (2025.01)
*H10D 84/03* (2025.01)

(52) U.S. Cl.
CPC ....... *H10D 84/0128* (2025.01); *H10D 84/013* (2025.01); *H10D 84/0151* (2025.01); *H10D 84/0158* (2025.01); *H10D 84/038* (2025.01)

(58) Field of Classification Search
CPC ........... H10D 84/0158; H10D 84/0128; H10D 84/038; H10D 62/118; H10D 62/115
USPC ......................................................... 257/20
See application file for complete search history.

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,412,817 B2 | 8/2016 | Yang et al. |
| 9,412,828 B2 | 8/2016 | Ching et al. |
| 9,443,769 B2 | 9/2016 | Wang et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,366 B1 | 1/2017 | Ho et al. |
| 9,576,814 B2 | 2/2017 | Wu et al. |
| 9,608,116 B2 | 3/2017 | Ching et al. |
| 9,831,183 B2 | 11/2017 | Lin et al. |
| 9,859,386 B2 | 1/2018 | Ho et al. |
| 11,532,520 B2 * | 12/2022 | More .................... H10D 62/116 |
| 2018/0151560 A1 * | 5/2018 | Hsu ........................ H01L 29/78 |
| 2018/0277681 A1 * | 9/2018 | Lin ...................... H01L 21/0332 |
| 2021/0257474 A1 * | 8/2021 | Lee ........................ H01L 21/845 |
| 2021/0320180 A1 * | 10/2021 | Chen .................... H10D 84/038 |

* cited by examiner

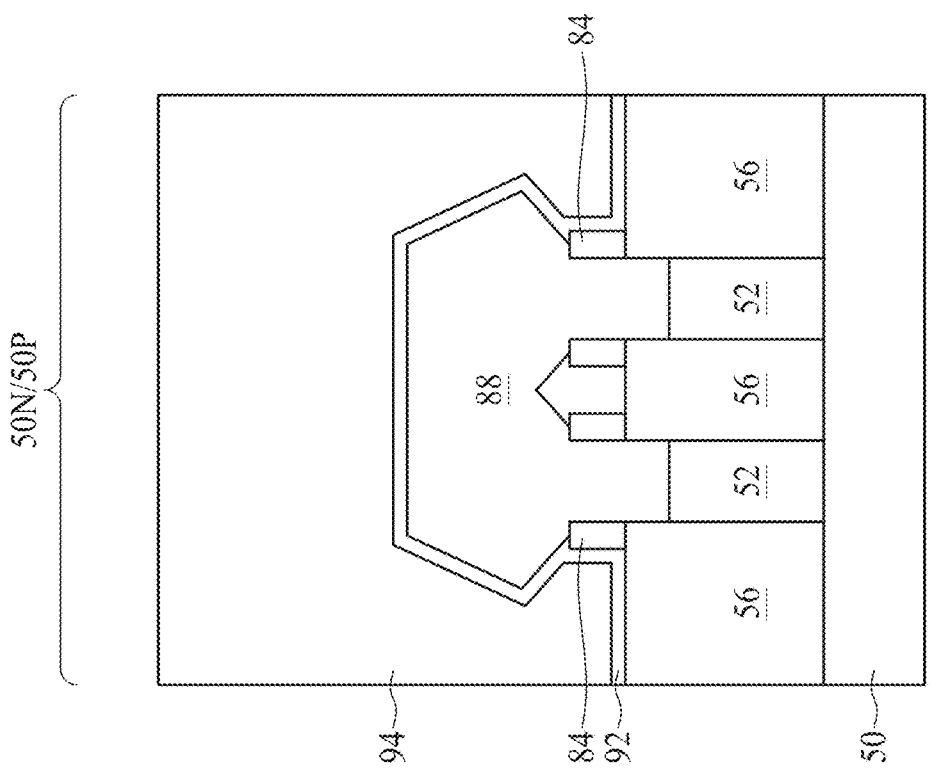
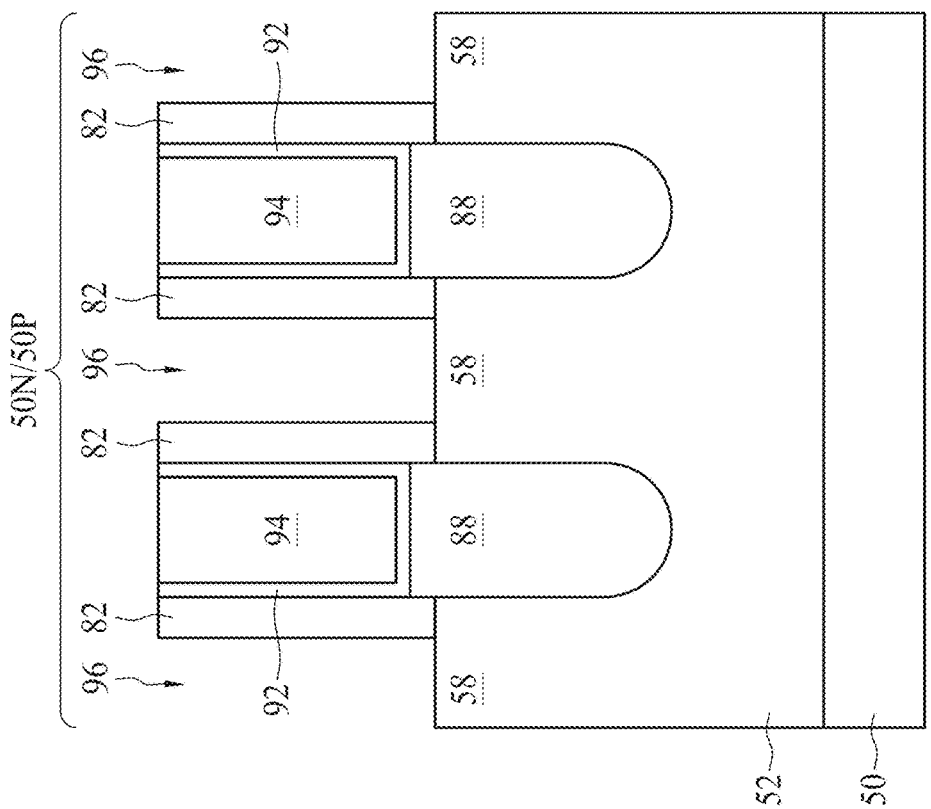

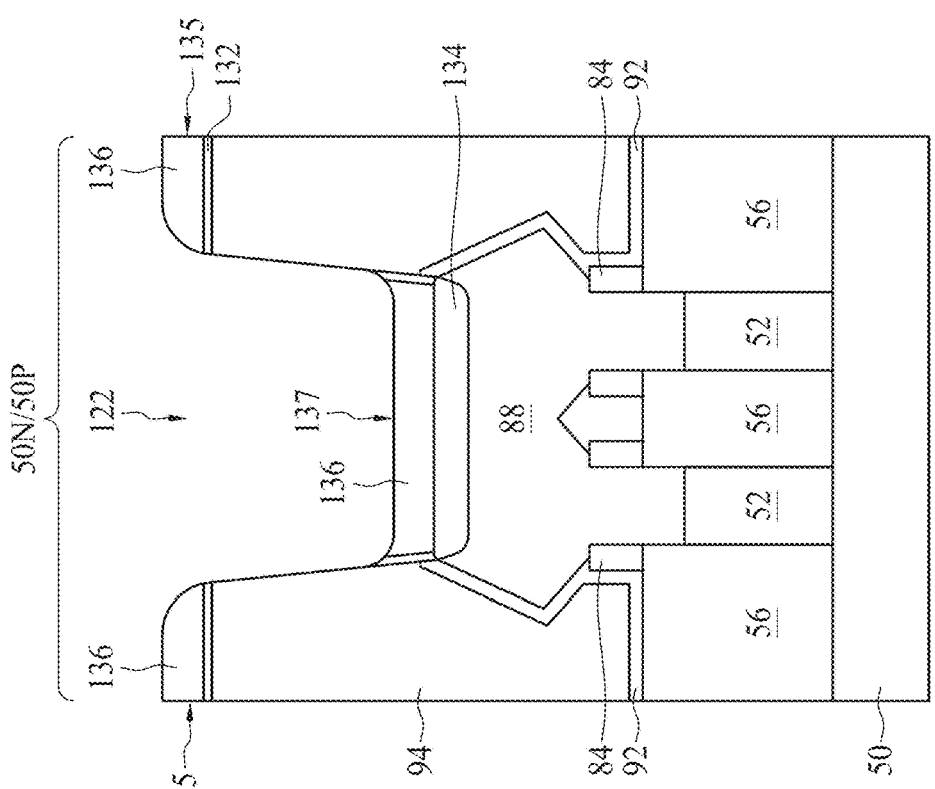
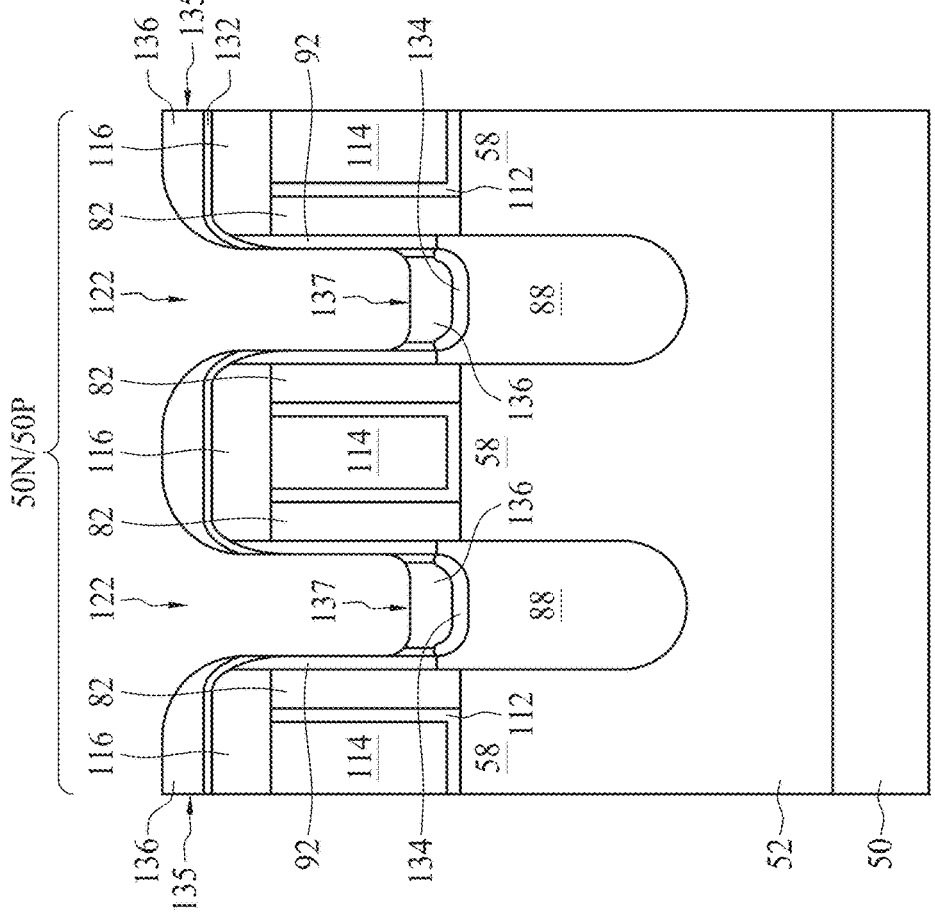
Figure 17A
Figure 17B

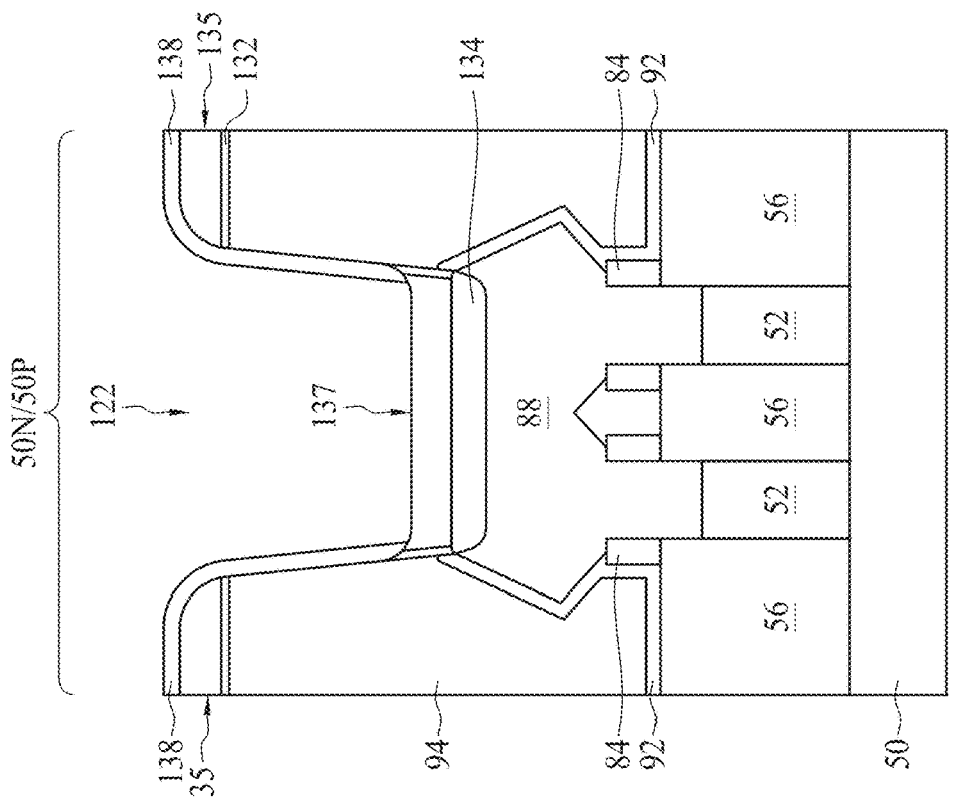
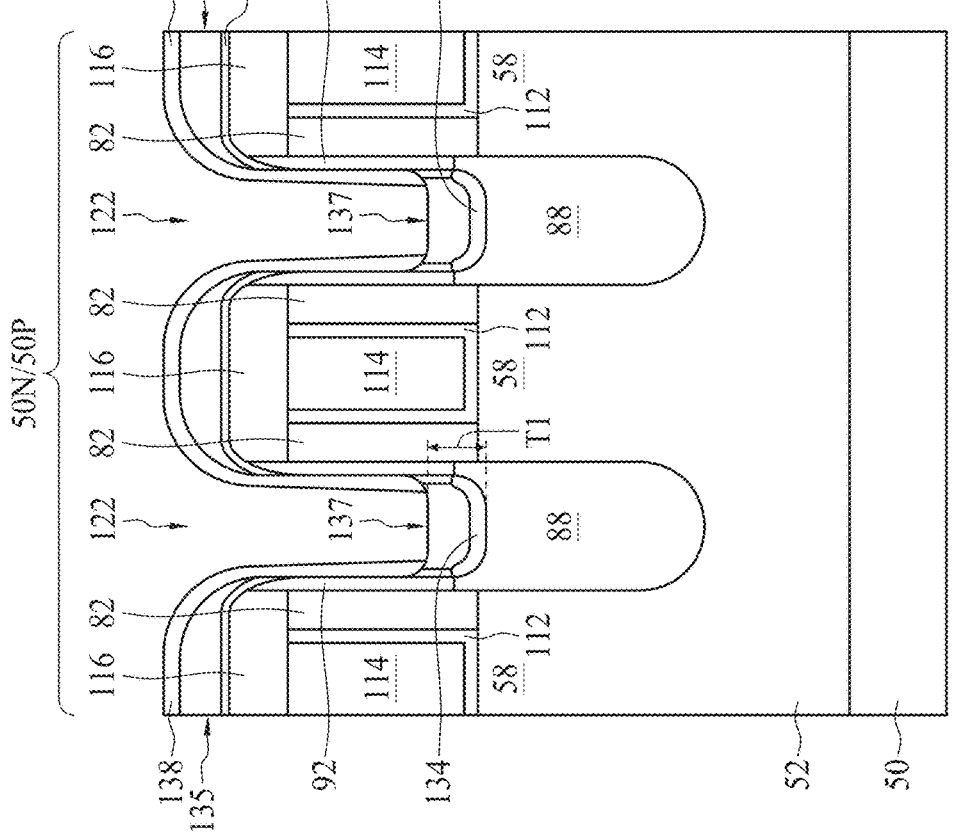

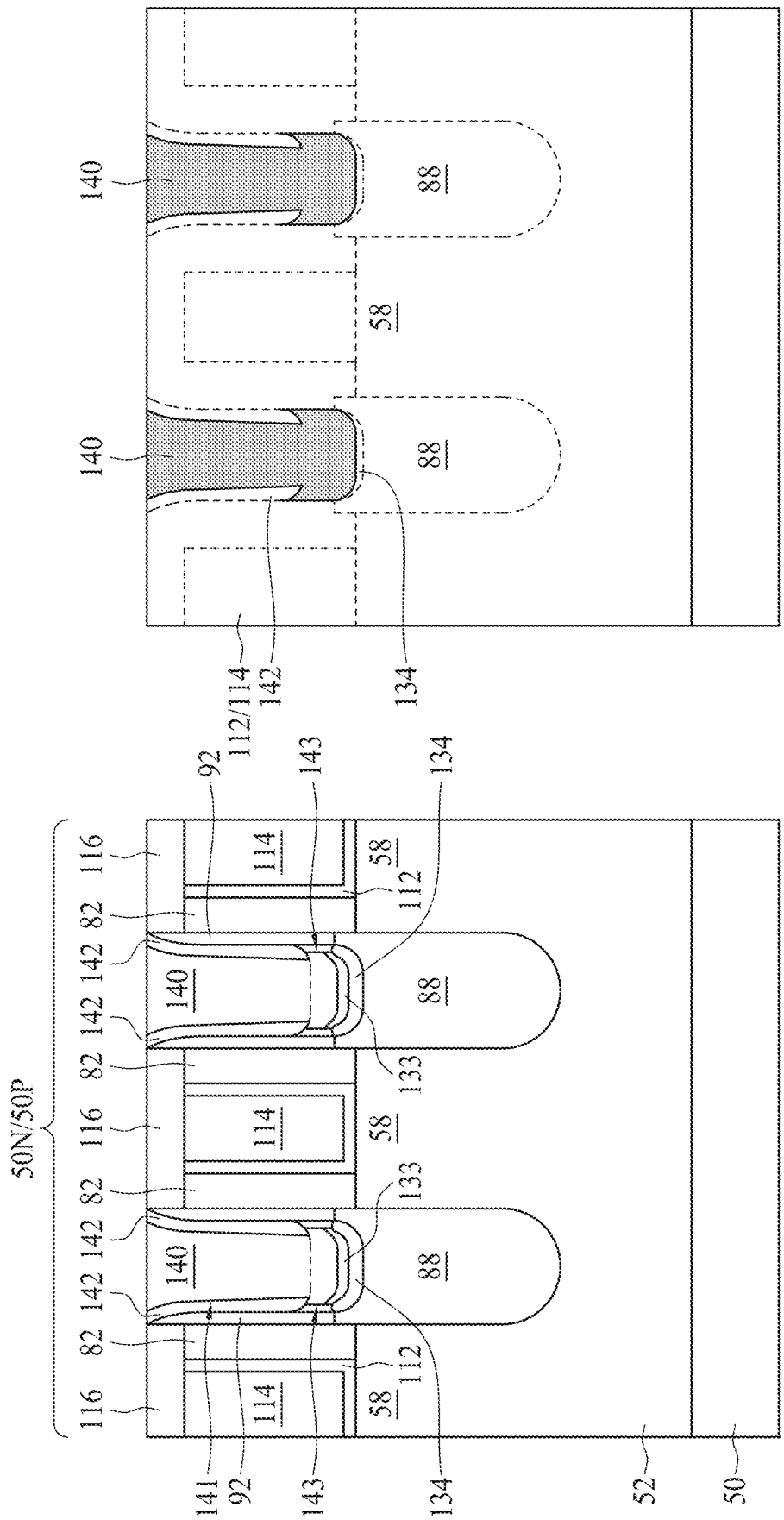

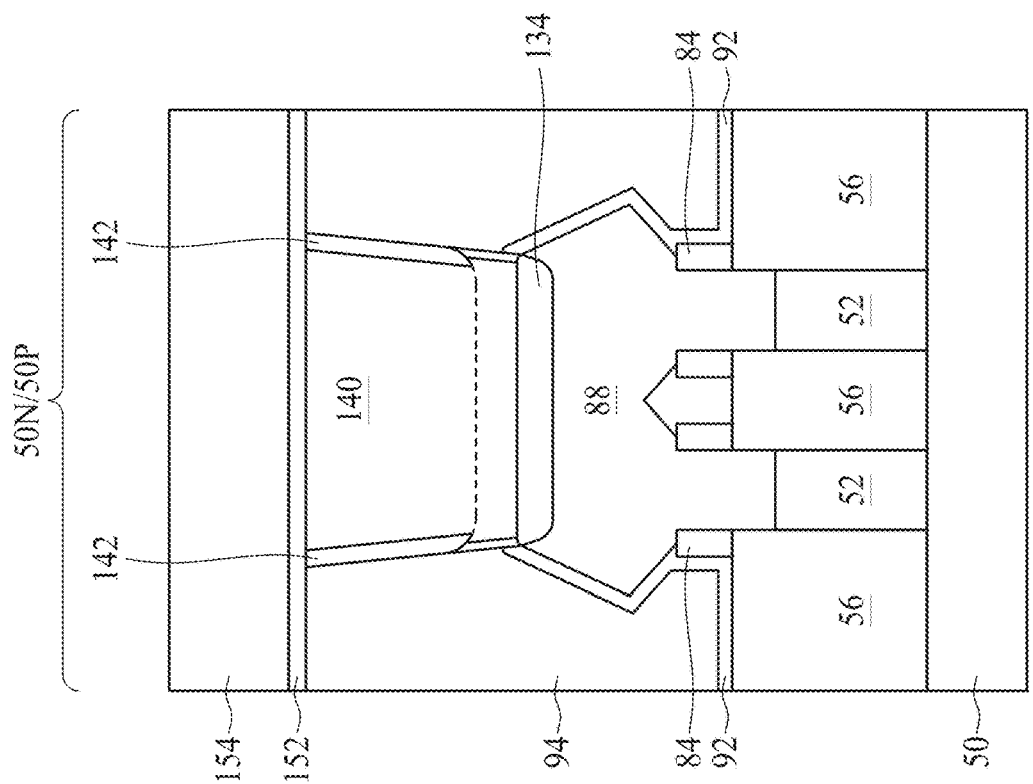
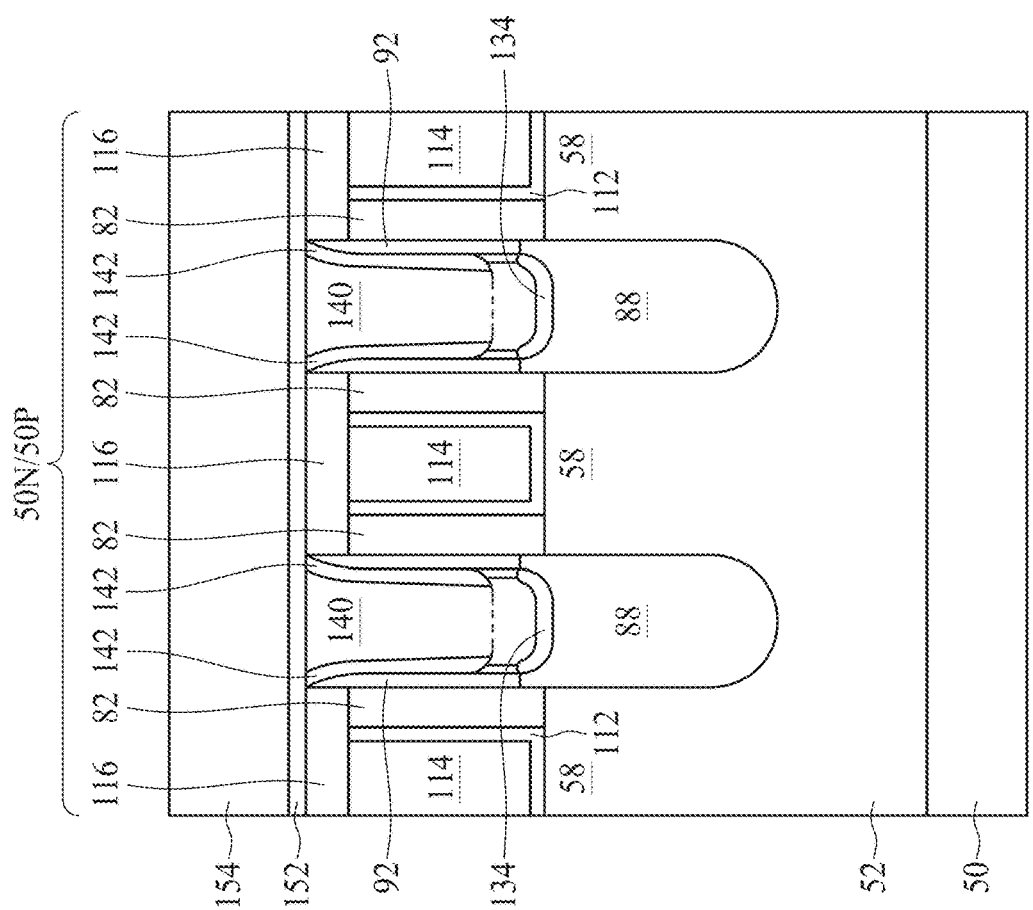
Figure 24A
Figure 24B

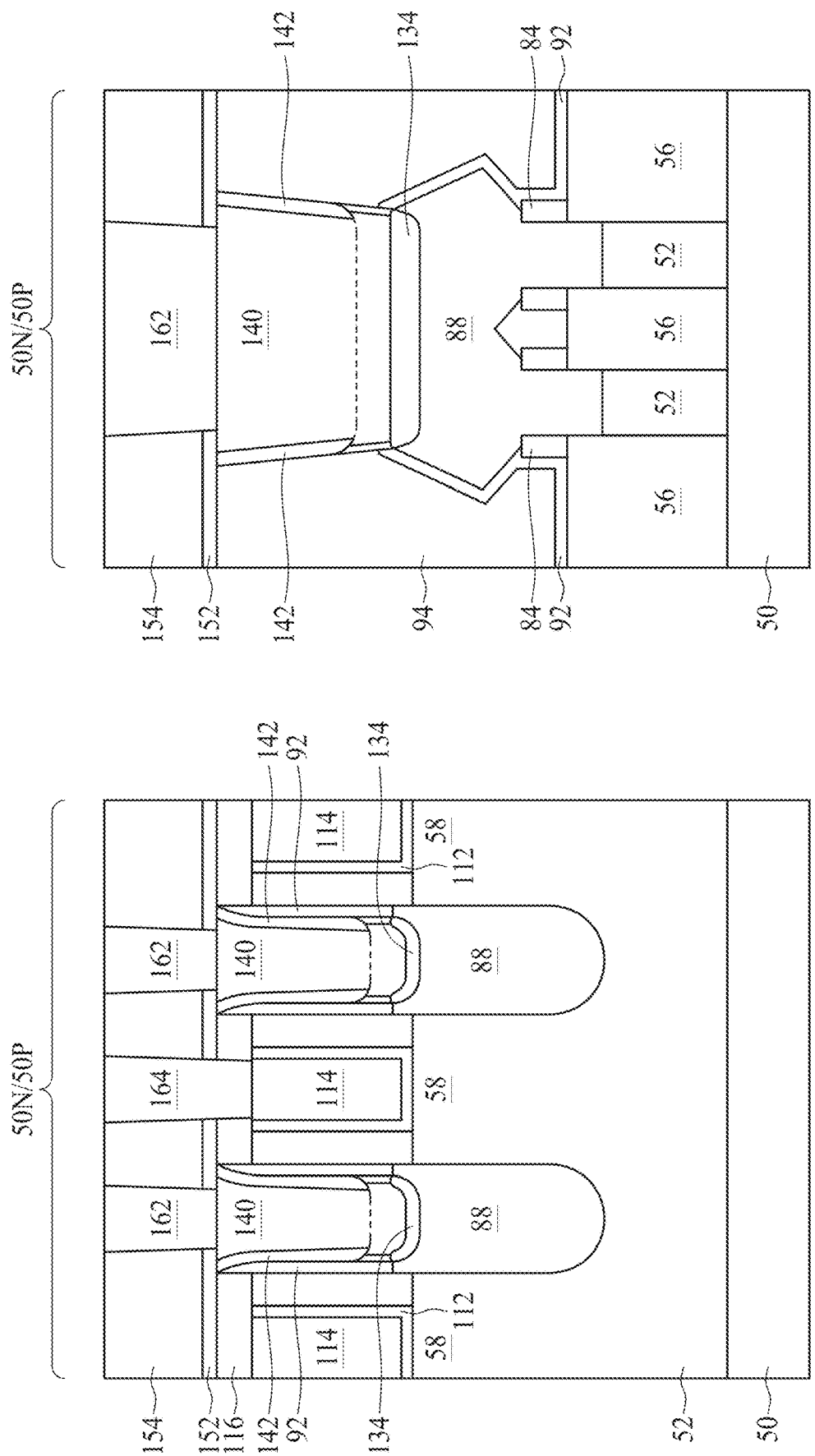

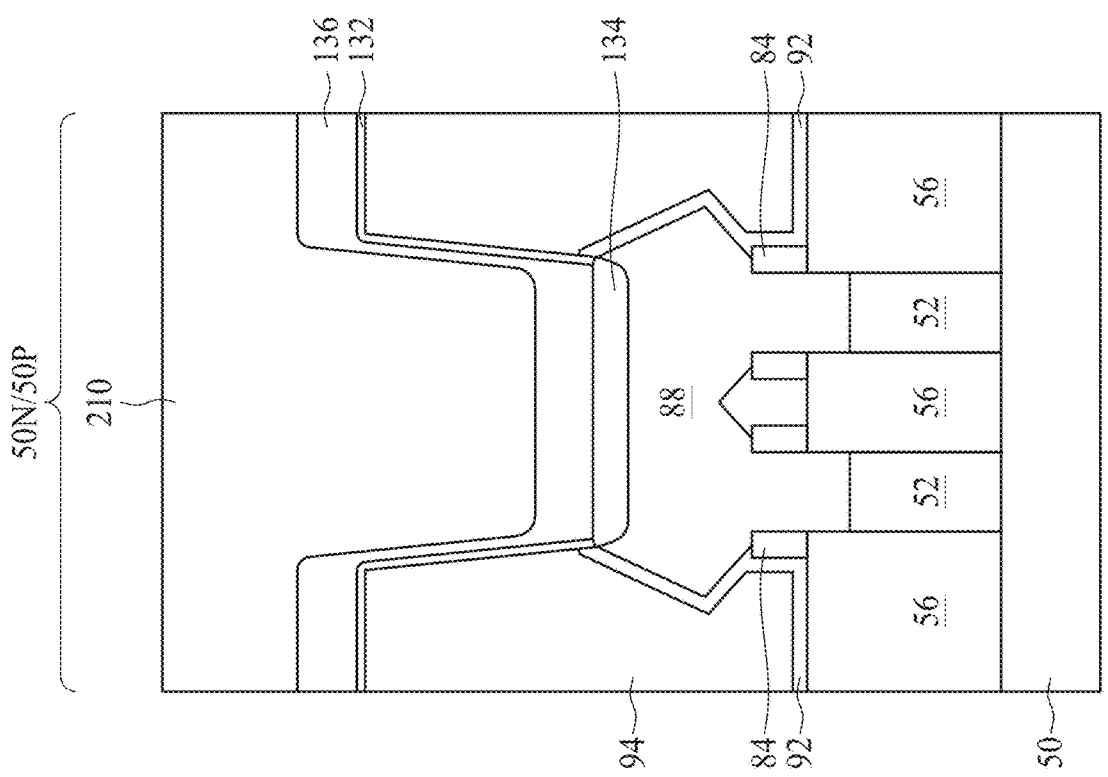
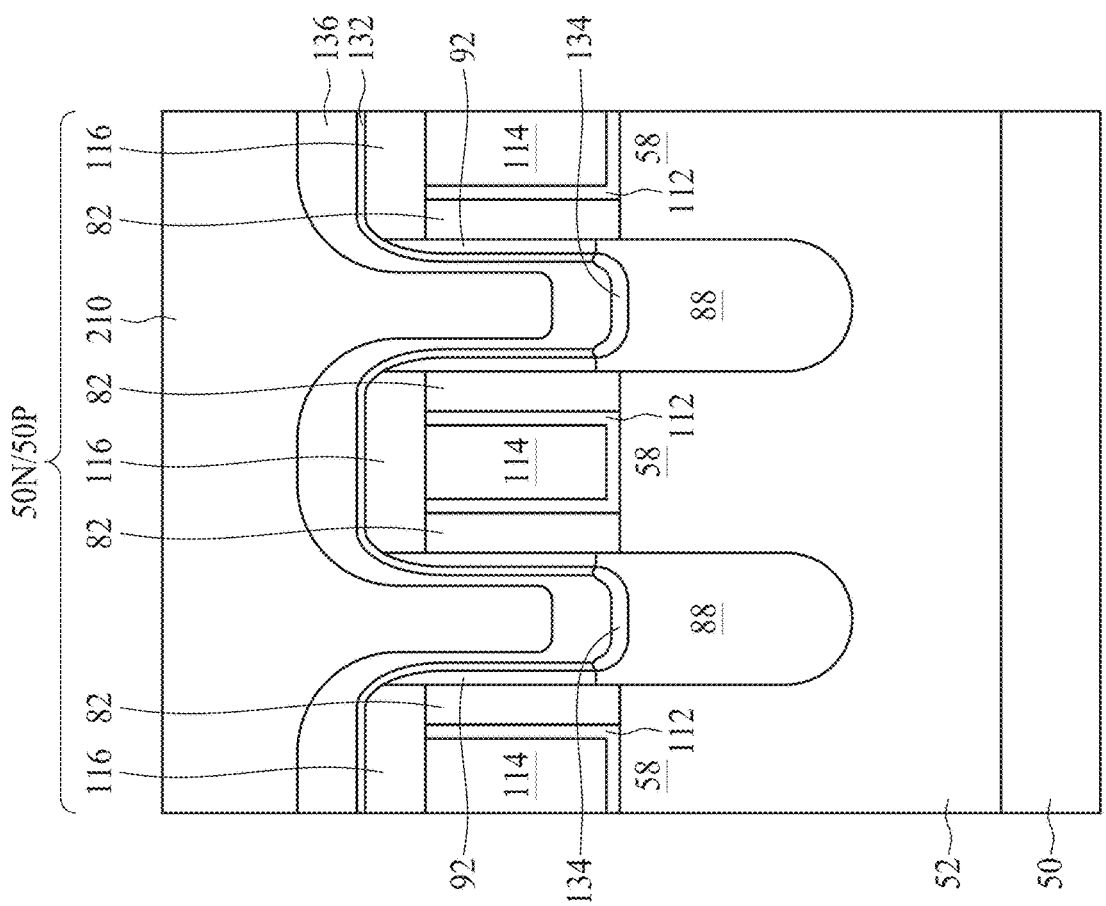
Figure 26A
Figure 26B

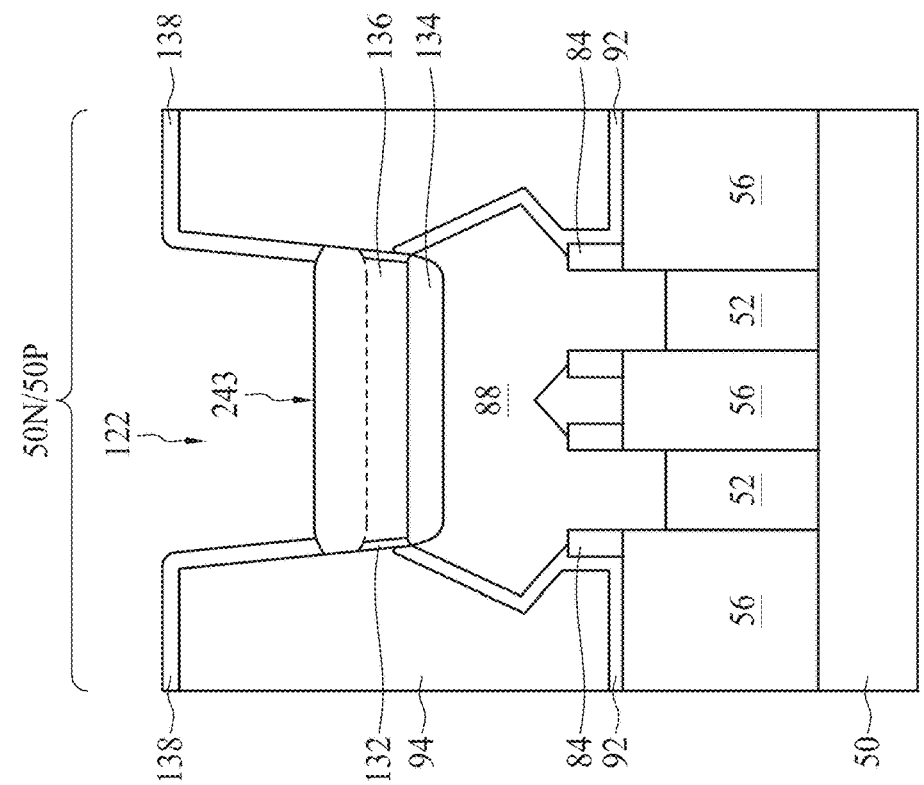
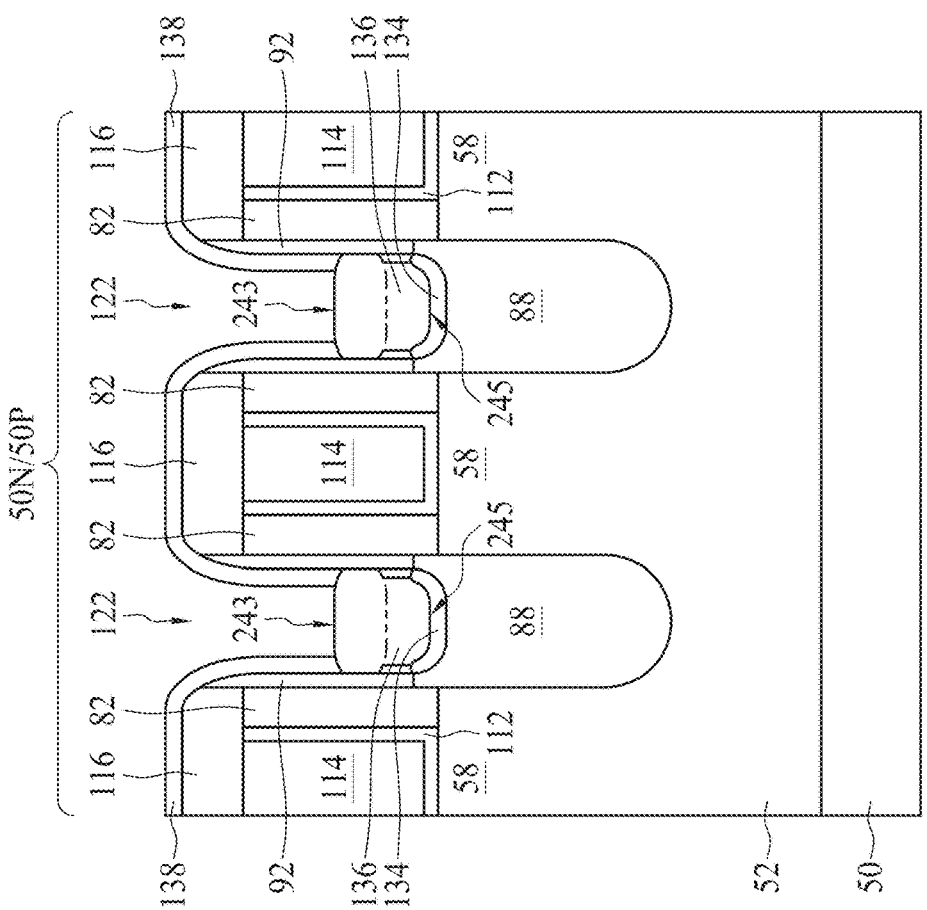
Figure 33A
Figure 33B

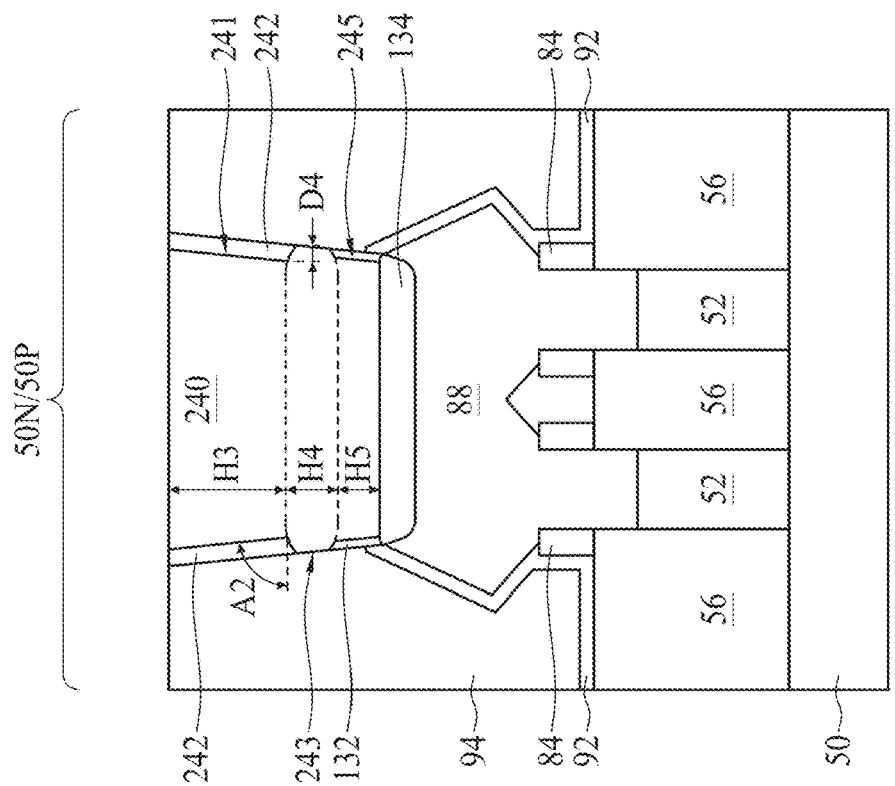
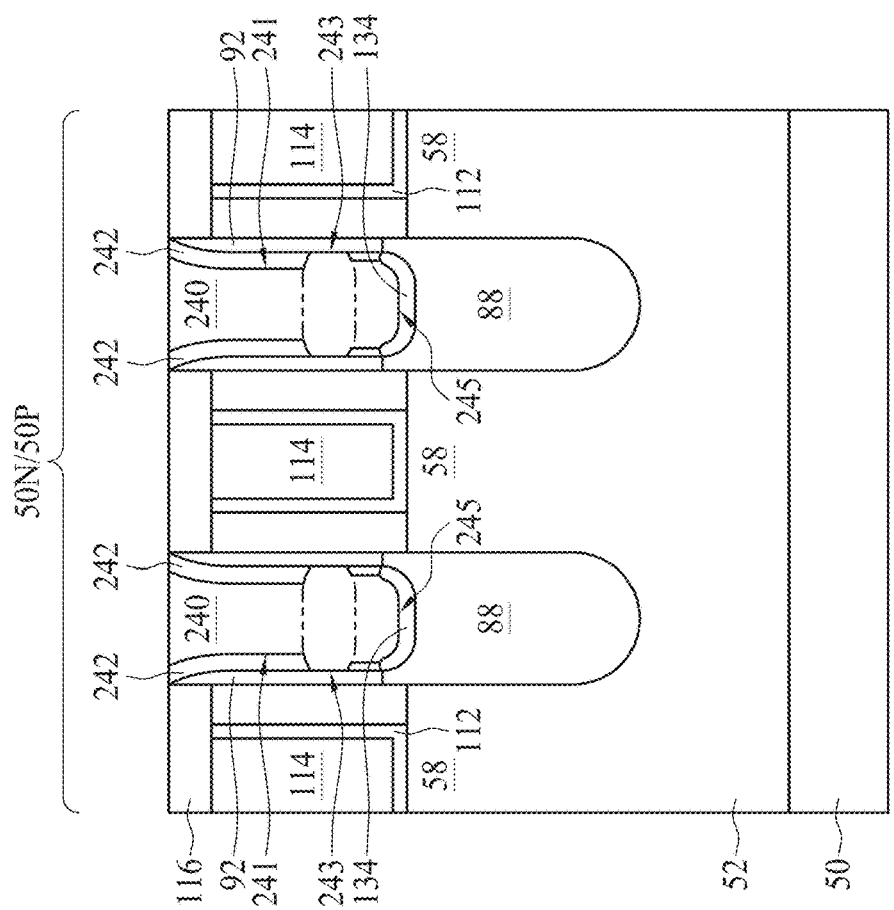
Figure 35B
Figure 35A

TRANSISTOR SOURCE/DRAIN CONTACTS AND METHODS OF FORMING THE SAME

PRIORITY CLAIM AND CROSS-REFERENCE

This application claims the benefit of U.S. Provisional Application No. 63/278,535, filed on Nov. 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-22D are various cross-sectional views of intermediate stages in the manufacturing of FinFETs, in accordance with some embodiments.

FIGS. 24A-25B are various cross-sectional views of intermediate stages in the manufacturing of FinFETs, in accordance with some embodiments.

FIGS. 26A-35B are various cross-sectional views of intermediate stages in the manufacturing of FinFETs, in accordance with some embodiments.

DETAILED DESCRIPTION

Figure 1:
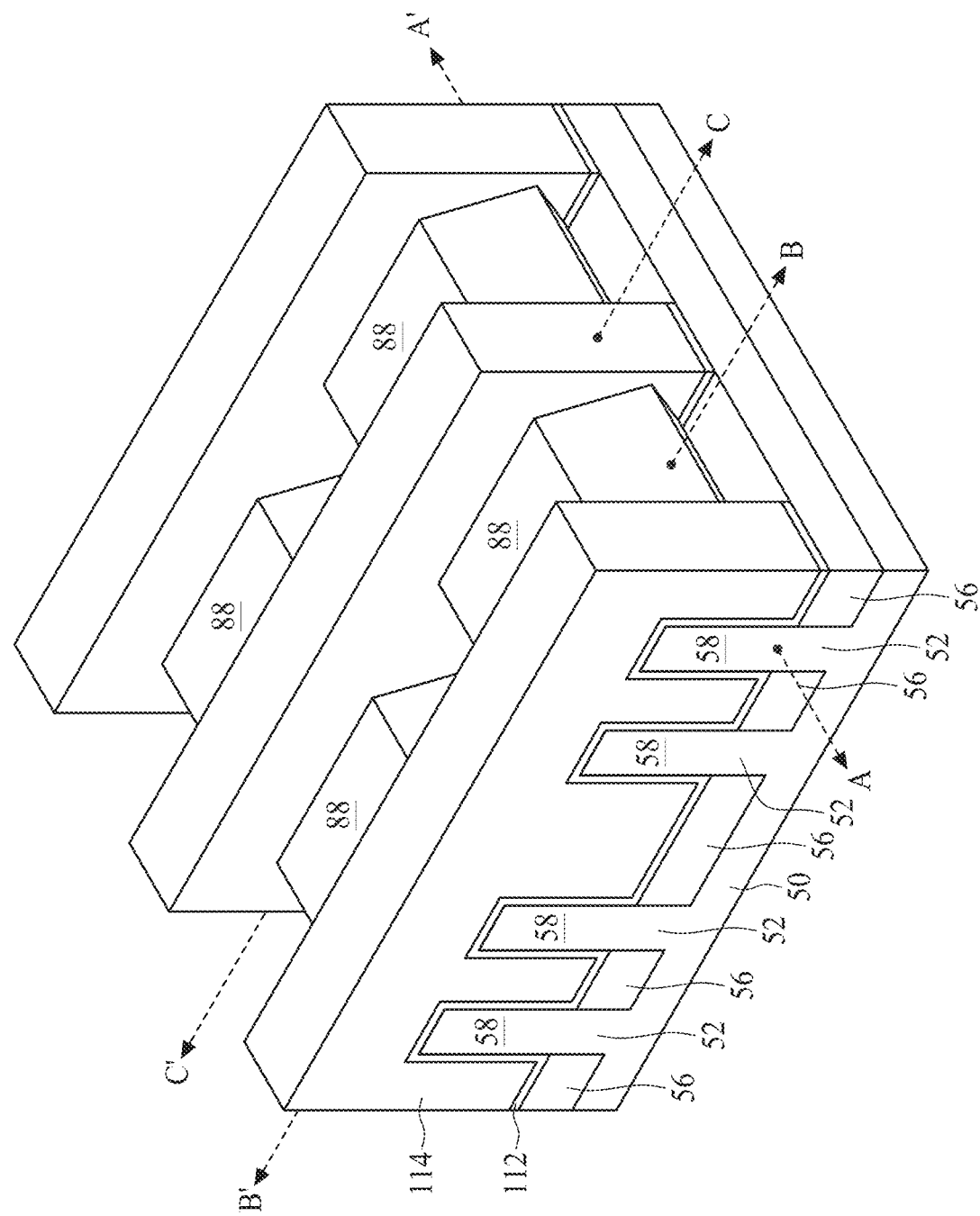
FIG. 1 illustrates an example of a fin field-effect transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, the formation of source/drain contacts includes initially forming metal-semiconductor alloy regions and a layer of conductive material within the contact openings. The dielectric material that forms contact spacers may be deposited over the layer of conductive material and then etched to expose the layer of conductive material. By first forming the metal-semiconductor alloy regions and the layer of conductive material, the metal-semiconductor alloy regions and the source/drain regions may be protected from etching during etching of the dielectric material. By avoiding etching of the metal-semiconductor alloy regions and the source/drain regions in this manner, contact resistance can be improved and undesirable etching of the metal-semiconductor alloy regions can be avoided. Additionally, the dielectric material may cover metallic regions and thus avoid subsequent deposition of undesired conductive material on some surfaces. In this manner, manufacturing yield and device performance may be improved.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending from a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials. In this context, the fins 52 refer to the portion extending from between the adjacent isolation regions 56.

Gate dielectrics 112 are along sidewalls and over top surfaces of the fins 52. Gate electrodes 114 are over the gate dielectrics 112. The gate dielectrics 112 and the overlying gate electrodes 114 may collectively be referred to herein as "gate stacks" or "gate structures." Epitaxial source/drain regions 88 are disposed in opposite sides of the fin 52 with respect to the gate dielectrics 112 and gate electrodes 114. The epitaxial source/drain regions 88 may be shared between various fins 52. For example, adjacent epitaxial source/drain regions 88 may be electrically connected, such as through coalescing the epitaxial source/drain regions 88 by epitaxial growth, or through coupling the epitaxial source/drain regions 88 with a same source/drain contact.

FIG. 1 further illustrates reference cross-sections that are used in later figures. Cross-section A-A' is along a longitudinal axis of a fin 52 and in a direction of, for example, a current flow between the epitaxial source/drain regions 88 of a FinFET. Cross-section B-B' is perpendicular to cross-section A-A' and extends through epitaxial source/drain regions 88 of the FinFETs. Cross-section C-C' is parallel to cross-section B-B' and extends through gate structures of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
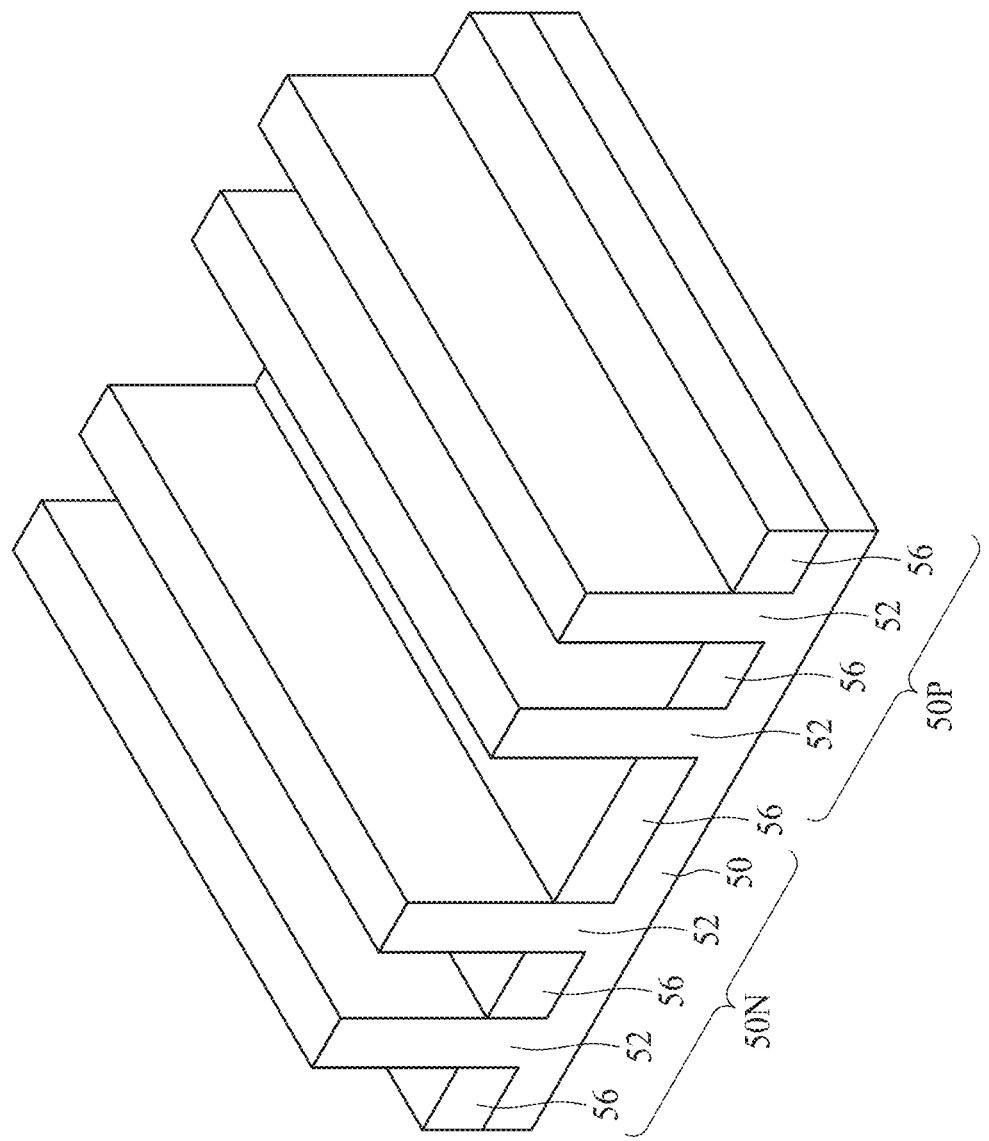
Figure 3:
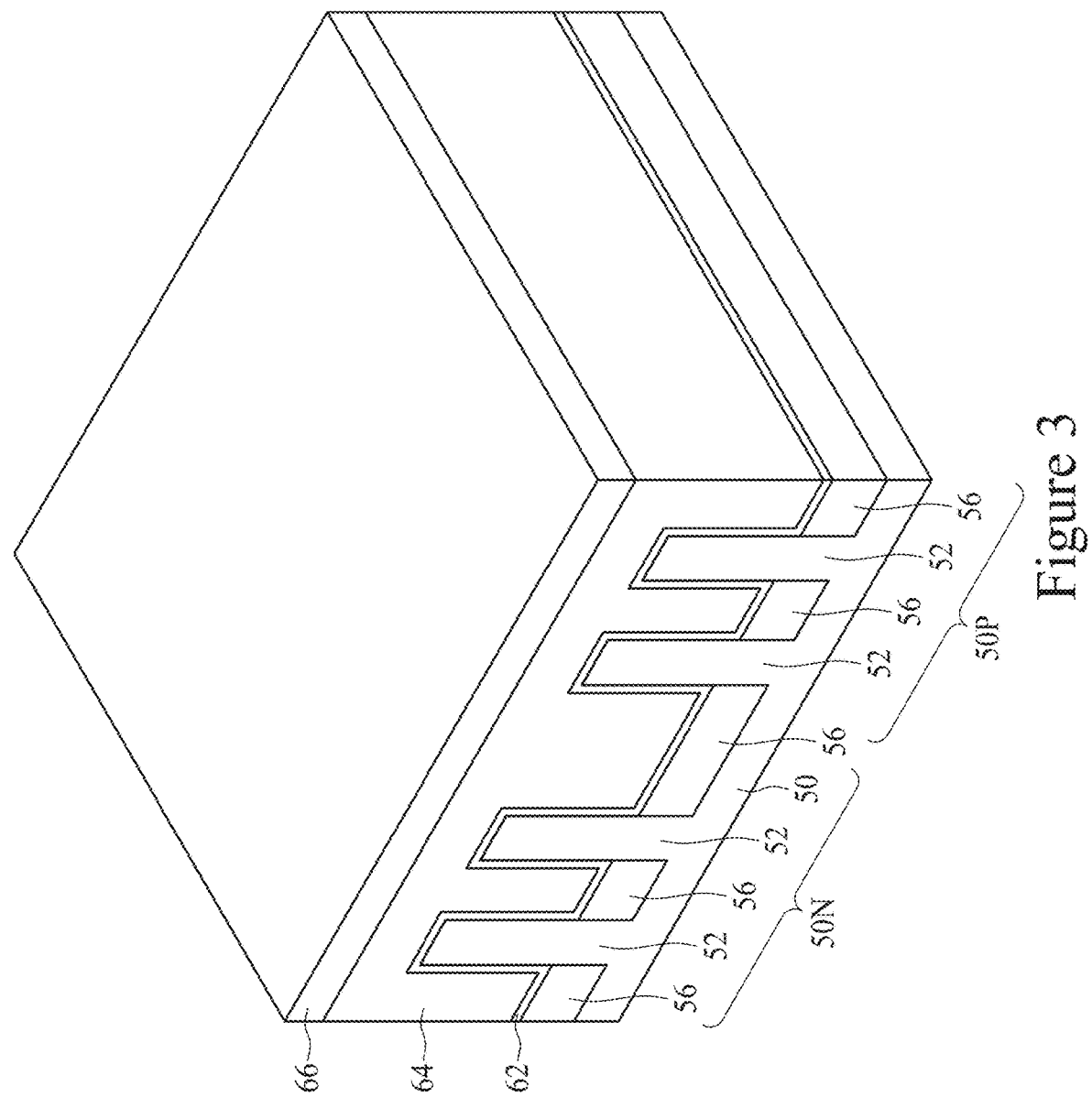
Figure 4:
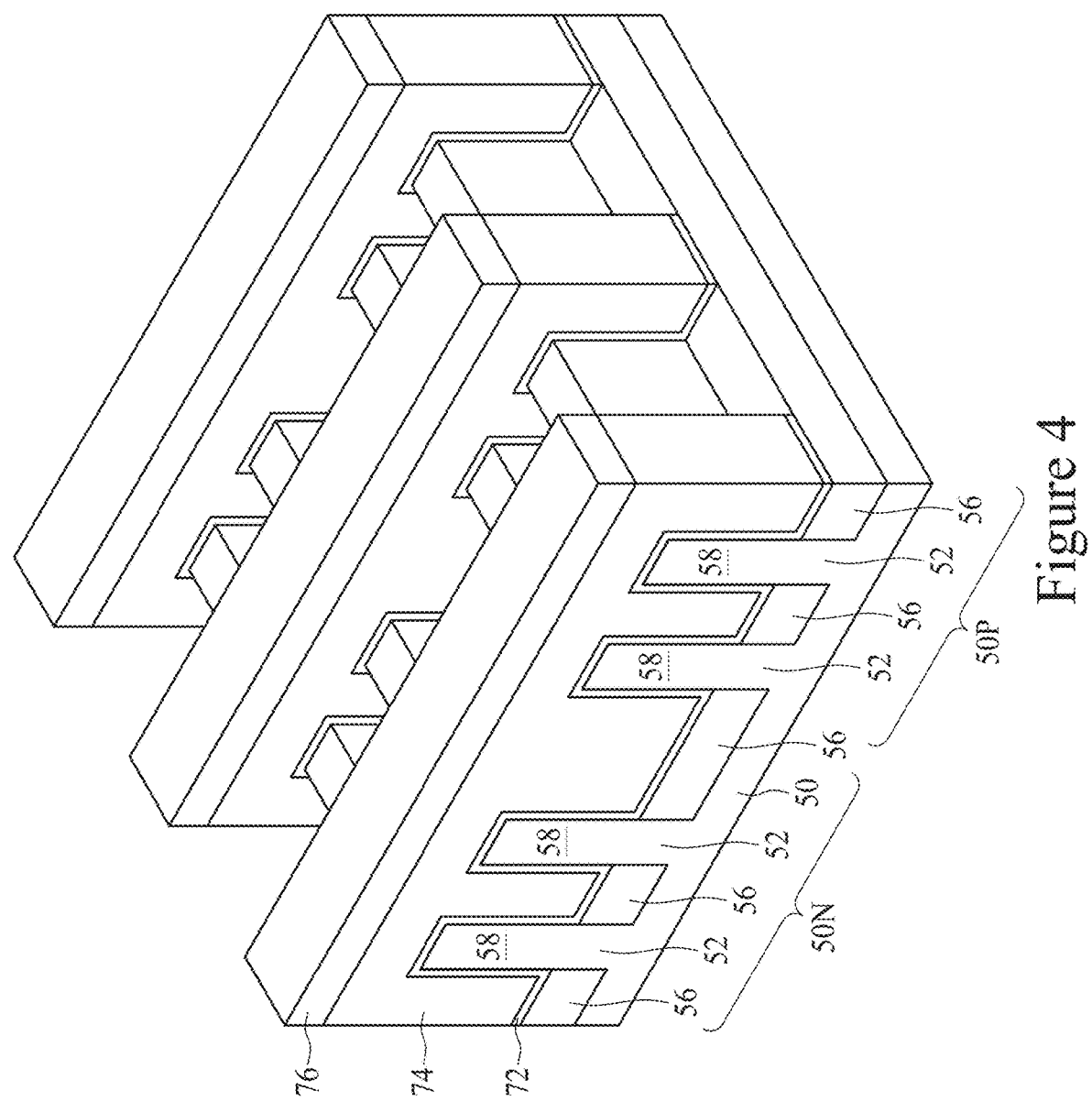

FIGS. 2-25B are views of intermediate stages in the manufacturing of FinFETs, in accordance with some embodiments. FIGS. 2, 3, and 4, are three-dimensional views showing a similar three-dimensional view as FIG. 1. FIGS. 5A, 6A, 7A, 8A, 9A, 10A, 11A, 12A, 13A, 14A, 15A, 15C, 16A, 17A, 18A, 19A, 20A, 21A, 22A, 22C, 22D, 23A, 24A, and 25A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19B, 20B, 21B, 22B, 23B, 24B, and 25B are cross-sectional views illustrated along a similar cross-section as reference cross-section B-B' in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 52. In some embodiments, the mask (or other layer) may remain on the fins 52.

STI regions 56 are formed over the substrate 50 and between adjacent fins 52. The STI regions 56 are disposed around lower portions of the fins 52 such that upper portions of the fins 52 protrude from between adjacent STI regions 56. In other words, the upper portions of the fins 52 extend above the top surfaces of the STI regions 56. The STI regions 56 separate the features of adjacent devices.

The STI regions 56 may be formed by any suitable method. For example, an insulation material can be formed over the substrate 50 and between adjacent fins 52. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. Although the STI regions 56 are each illustrated as a single layer, some embodiments may utilize multiple layers. For example, in some embodiments a liner (not separately illustrated) may first be formed along surfaces of the substrate 50 and the fins 52. Thereafter, a fill material, such as a layer of the insulation material previously described may be formed over the liner. In an embodiment, the insulation material is formed such that excess insulation material covers the fins 52. A removal process is then applied to the insulation material to remove excess insulation material over the fins 52. In some embodiments, a planarization process such as a chemical mechanical polish (CMP), an etch-back process, combinations thereof, or the like may be utilized. In embodiments in which a mask remains on the fins 52, the planarization process may expose the mask or remove the mask. After the planarization process, the top surfaces of the insulation material and the mask (if present) or the fins 52 are coplanar (within process variations). Accordingly, the top surfaces of the mask (if present) or the fins 52 are exposed through the insulation material. In the illustrated embodiment, no mask remains on the fins 52. The insulation material is then recessed to form the STI regions 56. The insulation material is recessed such that upper portions of the fins 52 protrude from between adjacent portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using any acceptable etching process, such as one that is selective to the material of the insulation material (e.g., selectively etches the insulation material of the STI regions 56 at a faster rate than the material of the fins 52). For example, an oxide removal may be performed using dilute hydrofluoric (dHF) acid.

The process previously described is just one example of how the fins 52 and the STI regions 56 may be formed. In some embodiments, the fins 52 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 52. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in n-type region 50N different from the material in p-type region 50P. In various embodiments, upper portions of the fins 52 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ $cm^{-3}$ to about $10^{14}$ $cm^{-3}$. After the implant, the photoresist is removed, such as by any acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ $cm^{-3}$ to $10^{14}$ $cm^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

In FIG. 3, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from the etching of insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 may cover only the fins 52.

In FIG. 4, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gates 74, or may be removed during subsequent processing.

FIGS. 5A-25B illustrate various additional steps in the manufacturing of embodiment devices. FIGS. 5A-25B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 5B:
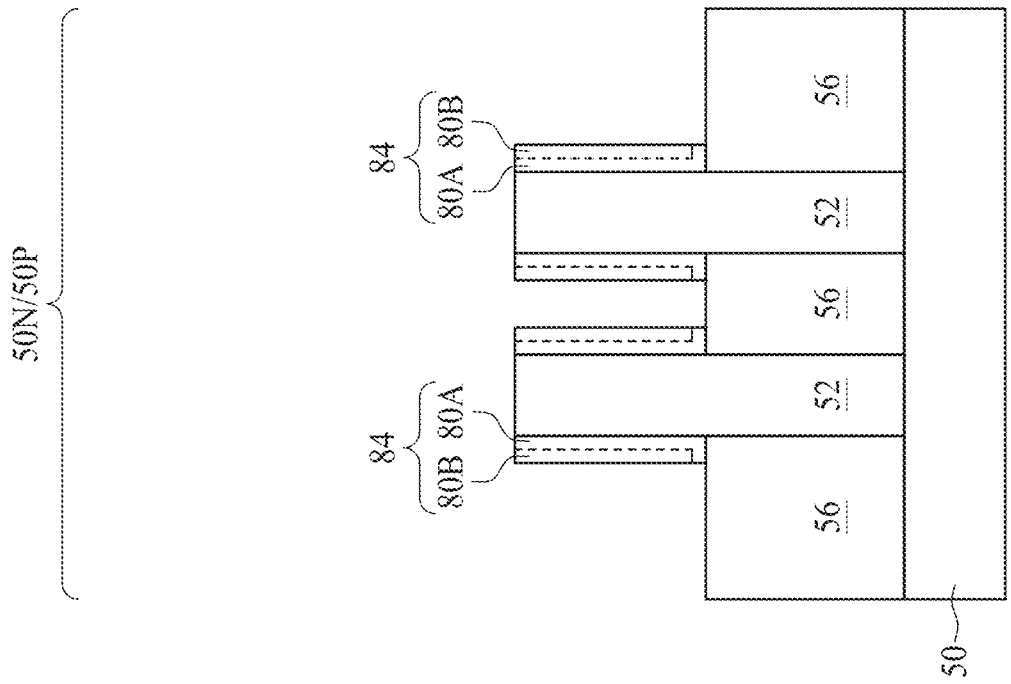
Figure 5A:
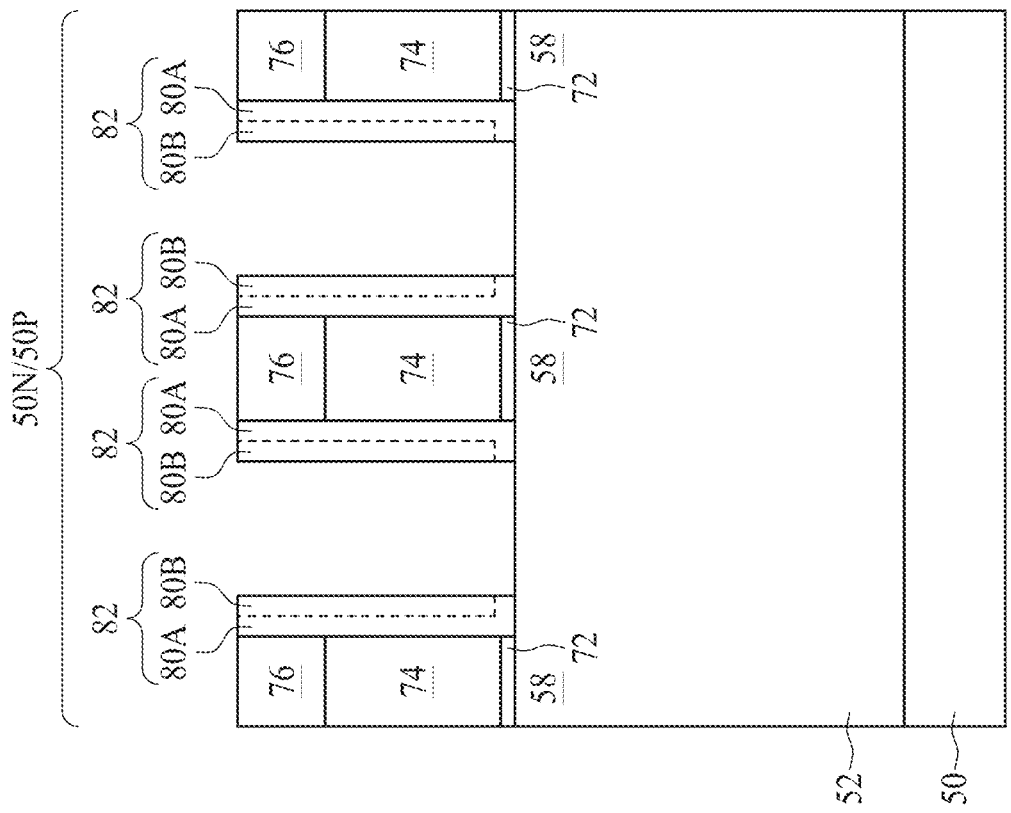

In FIGS. 5A-5B, gate spacers 82 are formed over the fins 52, on exposed sidewalls of the masks 76 (if present), the dummy gates 74, and the dummy dielectrics 72. The gate spacers 82 may be formed, for example, by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In the illustrated embodiment, the gate spacers 82 each include multiple layers, e.g., a first spacer layer 80A and a second spacer layer 80B. In some embodiments, the first spacer layers 80A and the second spacer layers 80B are formed of silicon oxycarbonitride (e.g., $SiO_x N_y C_{1-x-y}$, where x and y are in the range of 0 to 1), with the first spacer layers 80A formed of a similar or a different composition of silicon oxycarbonitride than the second spacer layers 80B. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82). In some embodiments, the etch used to form the gate spacers 82 is adjusted so that the dielectric material(s), when etched, also have portions left on the sidewalls of the fins 52 (thus forming fin spacers 84). After etching, the fin spacers 84 (if present) and the gate spacers 82 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of about $10^{15}$ $cm^{-3}$ to about $10^{19}$ $cm^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 6B:
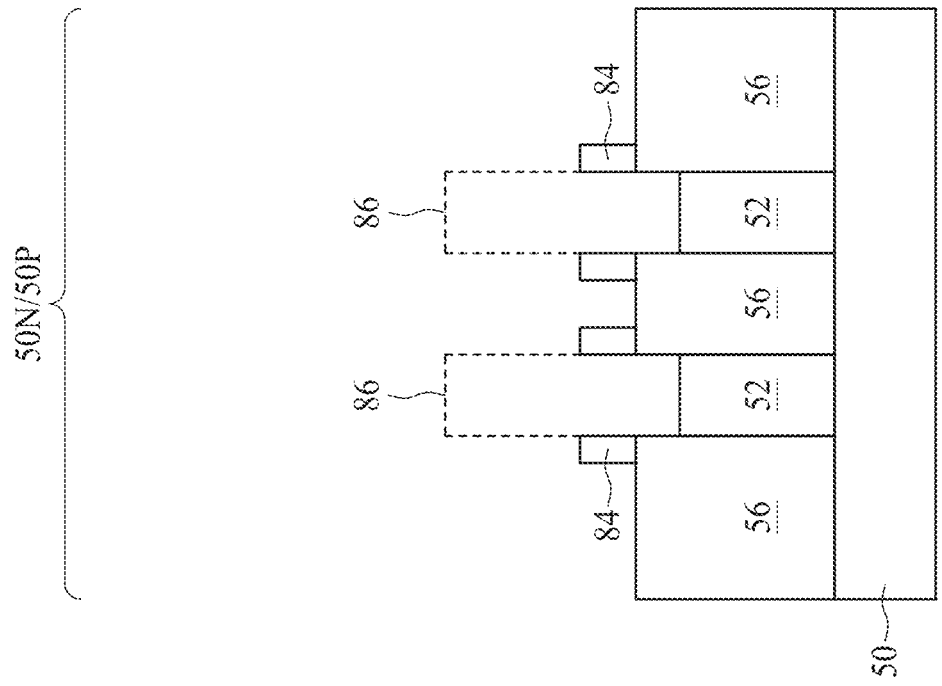
Figure 6A:
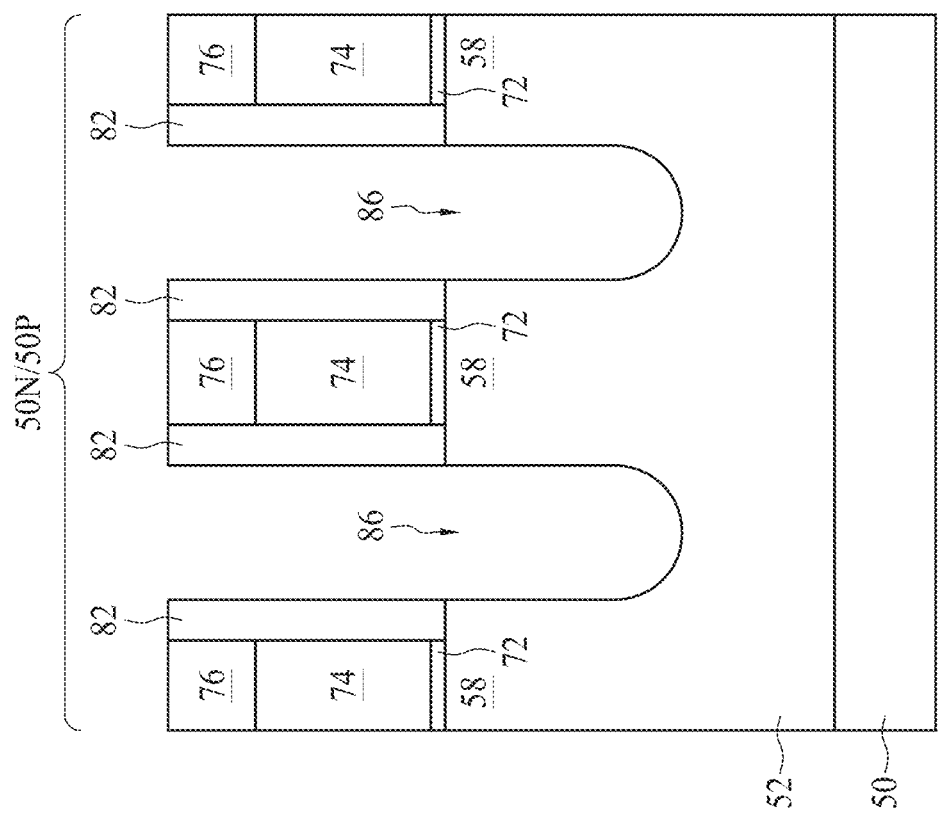

In FIGS. 6A-6B, source/drain recesses 86 are formed in the fins 52, in accordance with some embodiments. In the illustrated embodiment, the source/drain recesses 86 extend into the fins 52. The source/drain recesses 86 may also extend into the substrate 50. In various embodiments, the source/drain recesses 86 may extend to a top surface of the substrate 50 without etching the substrate 50; the fins 52 may be etched such that bottom surfaces of the source/drain recesses 86 are disposed below the top surfaces of the STI regions 56; or the like. The source/drain recesses 86 may be formed by etching the fins 52 using an anisotropic etching process, such as a RIE, a NBE, or the like. The gate spacers 82 and the dummy gates 74 collectively mask portions of the fins 52 during the etching processes used to form the source/drain recesses 86. Timed etch processes may be used to stop the etching of the source/drain recesses 86 after the source/drain recesses 86 reach a desired depth. The fin spacers 84 (if present) may be etched during or after the etching of the source/drain recesses 86, so that the height of the fin spacers 84 is reduced and the fin spacers 84 cover a portion of the sidewalls of the fins 52. The size and dimensions of the epitaxial source/drain regions 88 (see FIGS. 7A-7C) that are subsequently formed in the source/drain recesses 86 may be controlled by adjusting the height of the fin spacers 84, in some embodiments.

Figure 7B:
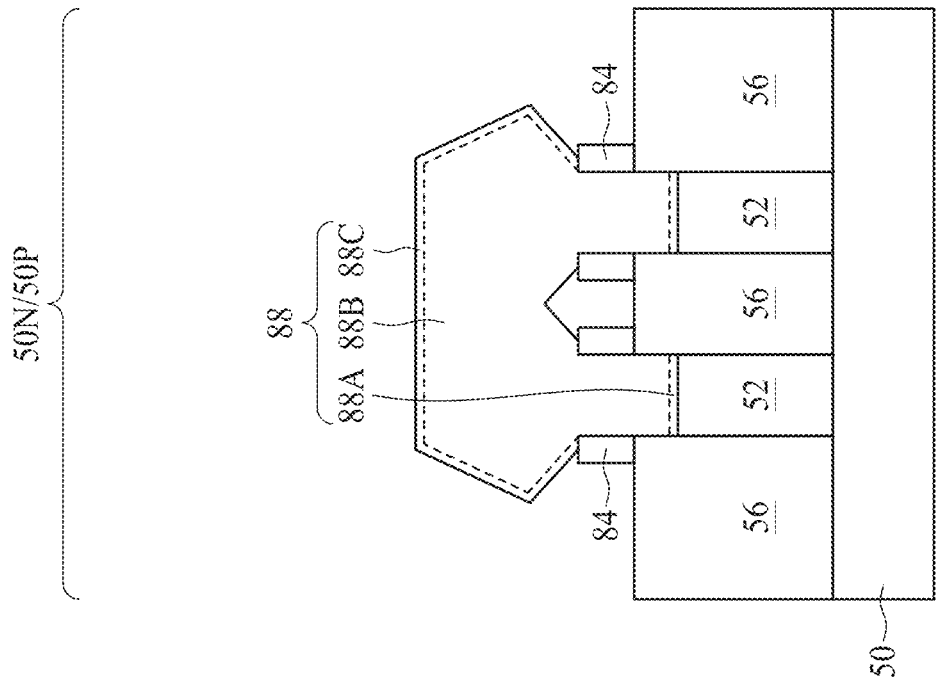
Figure 7A:
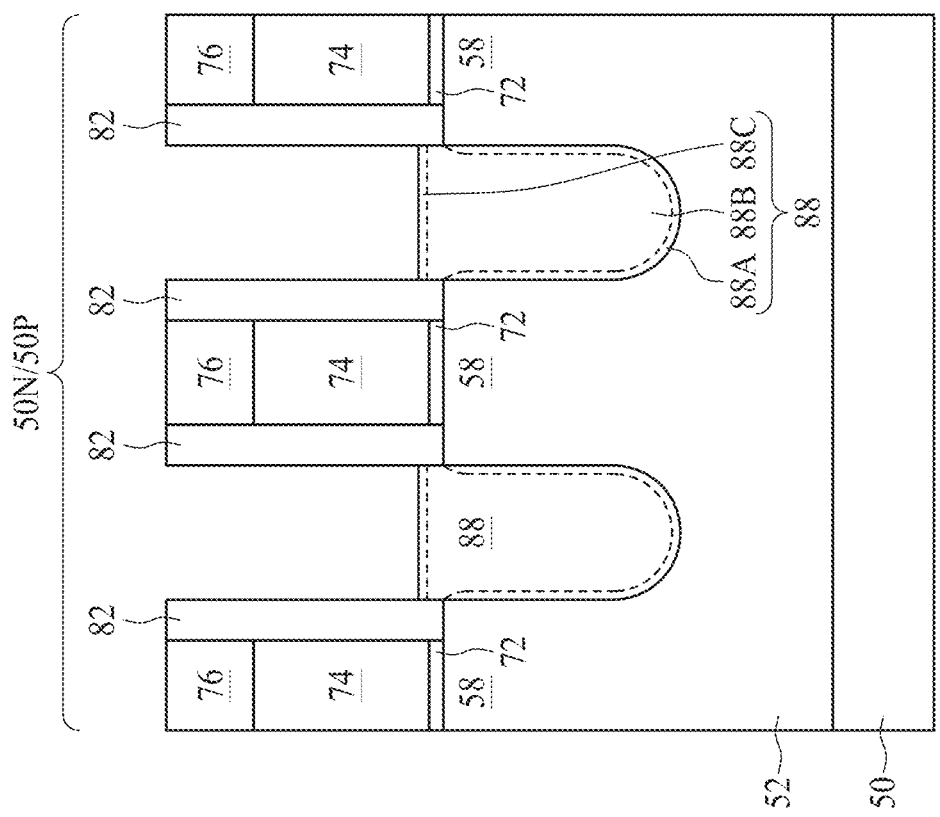
Figure 7C:
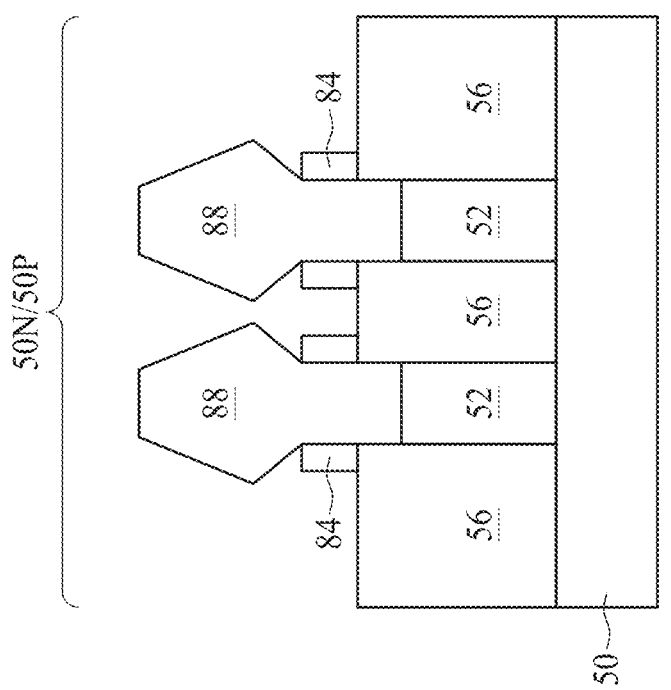

In FIGS. 7A-7C, epitaxial source/drain regions 88 are formed in the source/drain recesses 86, in accordance with some embodiments. The epitaxial source/drain regions 88 are thus disposed in the fins 52 such that each dummy gate 74 (and corresponding channel region 58) is between respective adjacent pairs of the epitaxial source/drain regions 88. The epitaxial source/drain regions 88 thus adjoin the channel regions 58. In some embodiments, the gate spacers 82 are used to separate the epitaxial source/drain regions 88 from the dummy gates 74 by an appropriate lateral distance so that the epitaxial source/drain regions 88 do not short out with subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P. Then, the epitaxial source/drain regions 88 in the n-type region 50N are epitaxially grown in the source/drain recesses 86 in the n-type region 50N. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N. Then, the epitaxial source/drain regions 88 in the p-type region 50P are epitaxially grown in the source/drain recesses 86 in the p-type region 50P. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with impurities to form source/drain regions, similar to the process previously described for forming LDD regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously described. In some embodiments, the epitaxial source/drain regions 88 may be in situ doped during growth. In some embodiments, the epitaxial source/drain regions 88 may be implanted with impurities prior to formation of source/drain contacts 140 (see FIGS. 22A-22B).

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge, as illustrated by FIG. 7B. In other embodiments, adjacent epitaxial source/drain regions 88 remain separated after the epitaxy process is completed, as illustrated by FIG. 7C. In the illustrated embodiments, the fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

The epitaxial source/drain regions 88 may include one or more semiconductor material layers. For example, the epitaxial source/drain regions 88 may each include a liner layer 88A, a main layer 88B, and a finishing layer 88C (or more generally, a first semiconductor material layer, a second semiconductor material layer, and a third semiconductor material layer). Example liner layers 88A, the main layers 88B, and the finishing layers 88C are indicated in FIGS. 7A-7B for illustrative purposes. Any number of semiconductor material layers may be used for the epitaxial source/drain regions 88. The liner layers 88A, the main layers 88B, and the finishing layers 88C may be formed of different semiconductor materials and may be doped to different impurity concentrations. In some embodiments, the main layers 88B have a greater concentration of impurities than the finishing layers 88C, and the finishing layers 88C have a greater concentration of impurities than the liner layers 88A. In embodiments in which the epitaxial source/drain regions 88 include three semiconductor material layers, the liner layers 88A may be grown in the source/drain recesses 86, the main layers 88B may be grown on the liner layers 88A, and the finishing layers 88C may be grown on the main layers 88B. Forming the liner layers 88A with a lesser concentration of impurities than the main layers 88B may increase adhesion in the source/drain recesses 86, and forming the finishing layers 88C with a lesser concentration of impurities than the main layers 88B may reduce out-diffusion of dopants from the main layers 88B during subsequent processing.

Figure 8B:
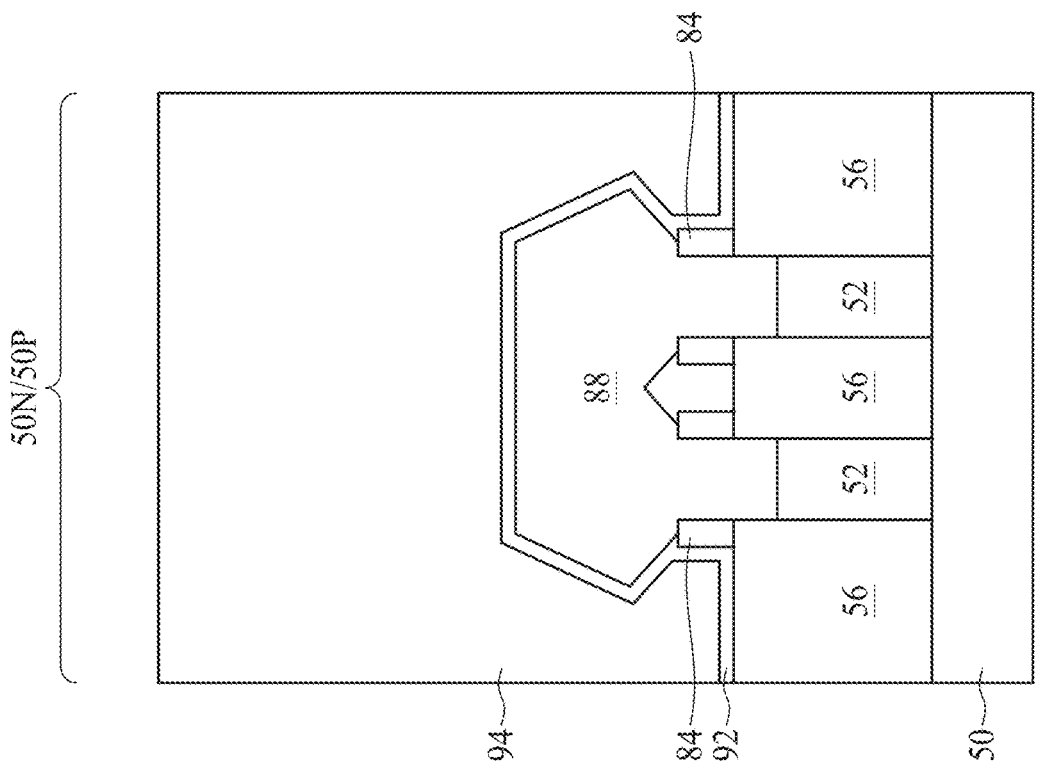
Figure 8A:
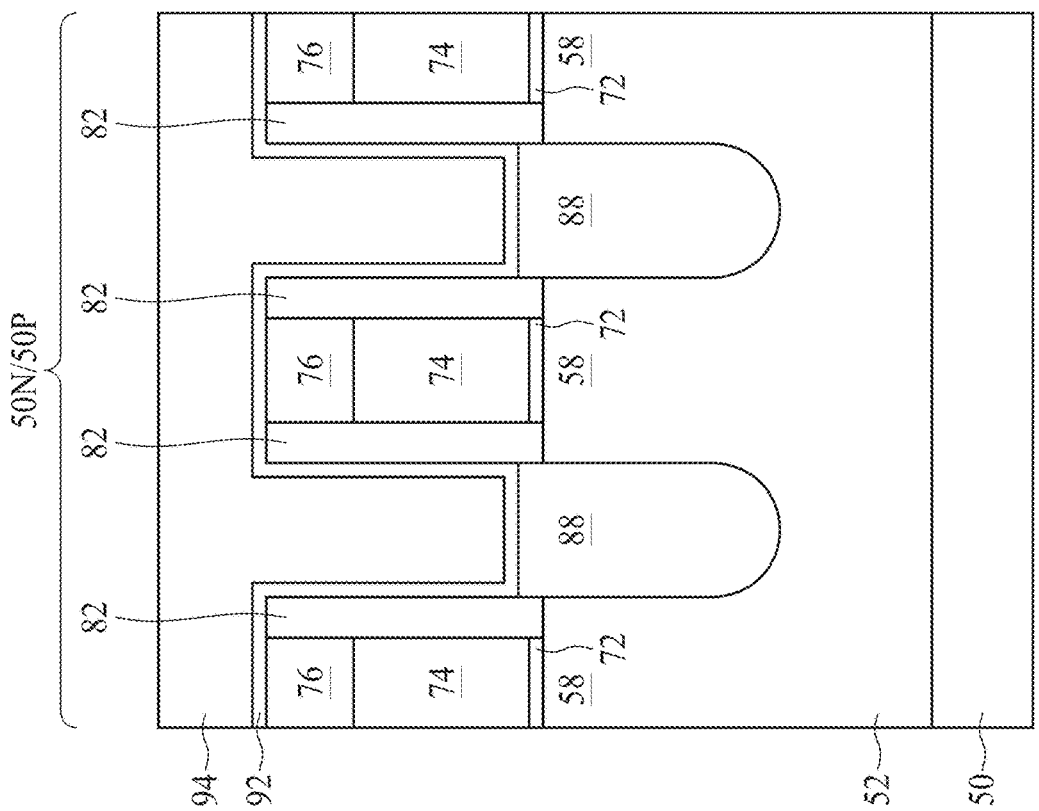

In FIGS. 8A-8B, a first inter-layer dielectric (ILD) 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, PECVD, FCVD, or the like. Acceptable dielectric materials may include phospho-silicate glass (PSG), borosilicate glass (BSG), boron-doped phospho-silicate glass (BPSG), undoped silicate glass (USG), or the like. Other insulation materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material, such as silicon nitride, silicon oxide, silicon oxynitride, or the like, having a high etching selectivity from the etching of the first ILD 94. The CESL 92 may be formed by any suitable method, such as CVD, ALD, or the like.

Figure 9B:
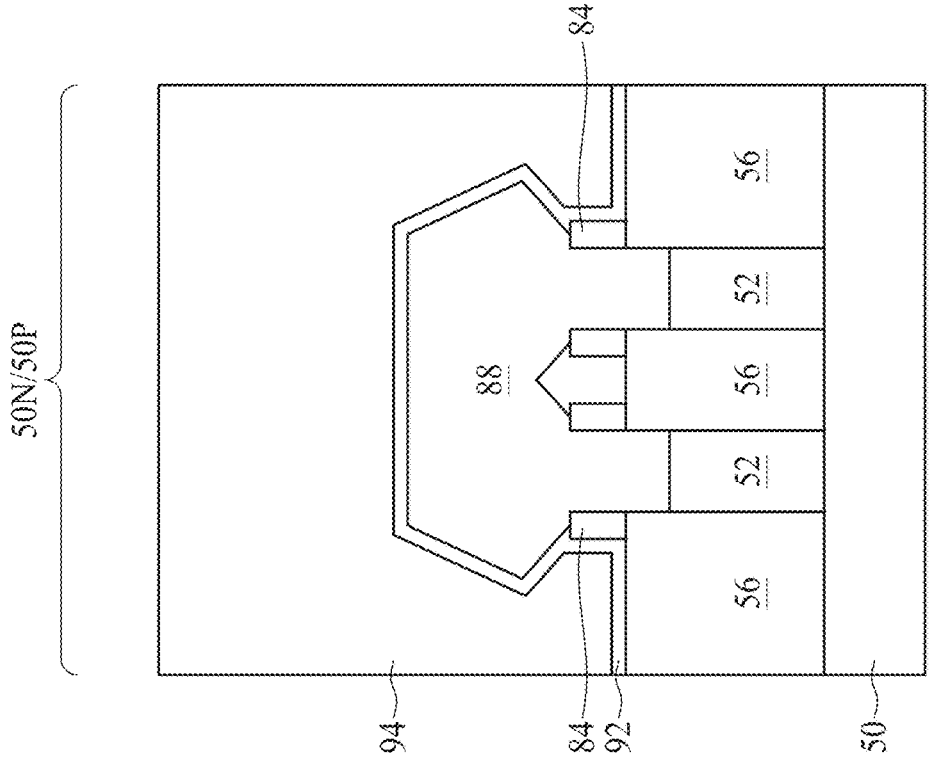
Figure 9A:
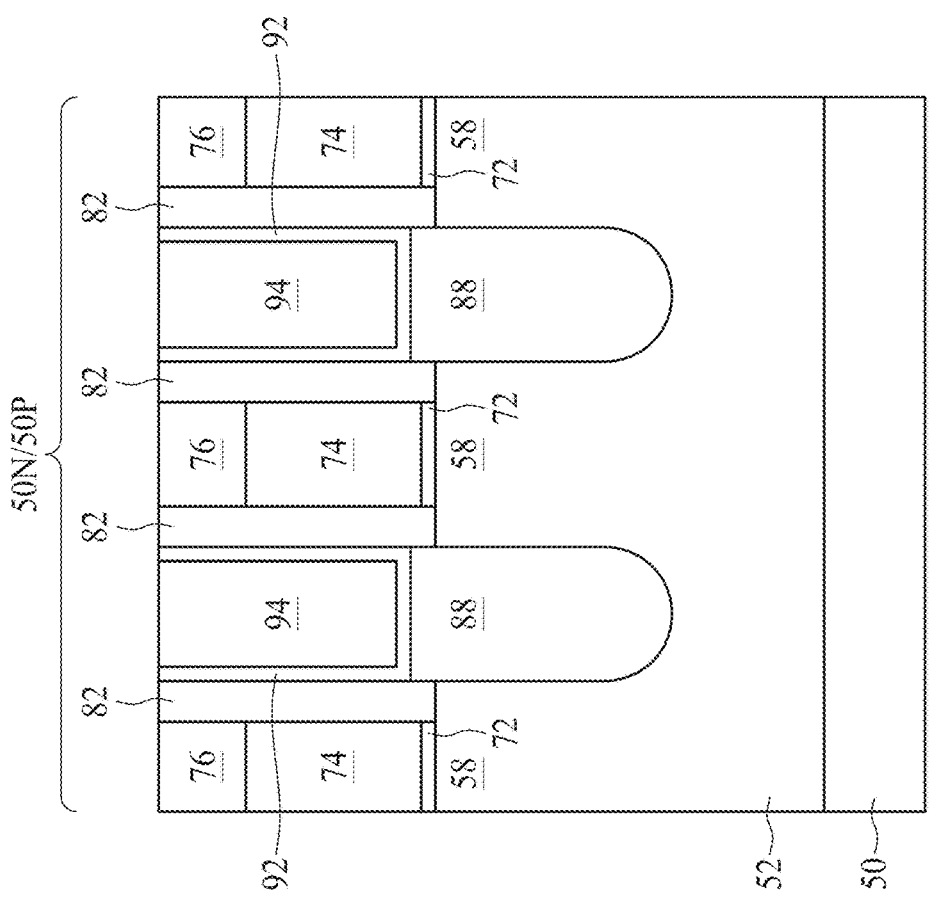

In FIGS. 9A-9B, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are coplanar (within process variations). Accordingly, the top surfaces of the masks 76 (if present) or the dummy gates 74 are exposed. In the illustrated embodiment, the masks 76 remain, and the planarization process levels the top surfaces of the first ILD 94 with the top surfaces of the masks 76.

In FIGS. 10A-10B, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figure 11B:
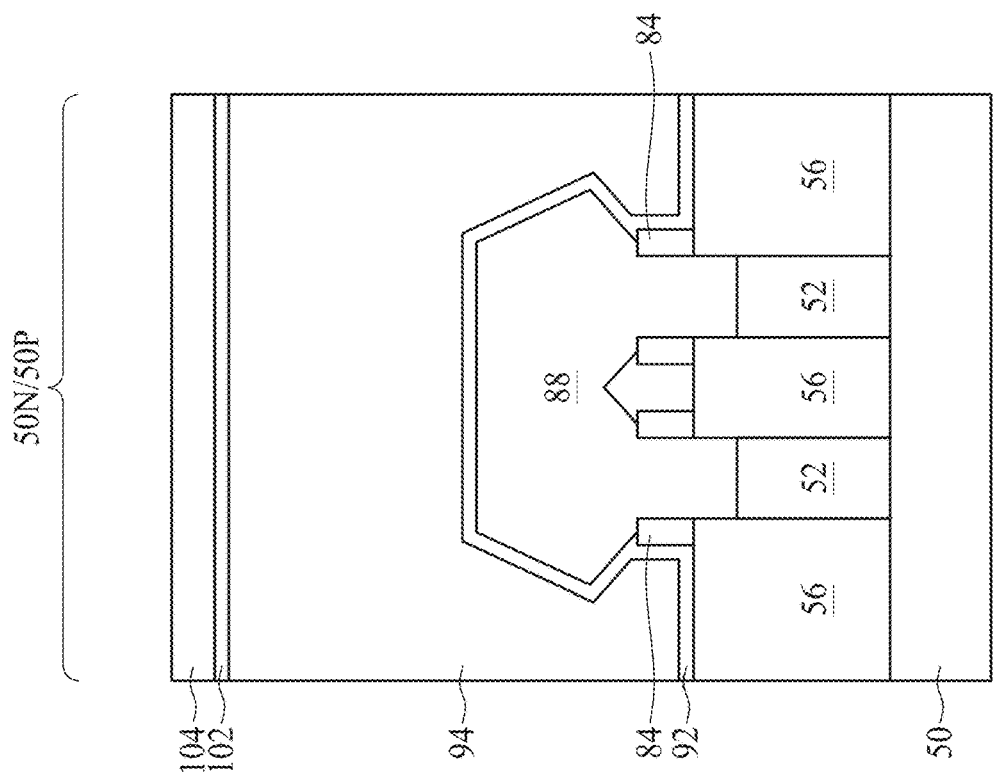
Figure 11A:
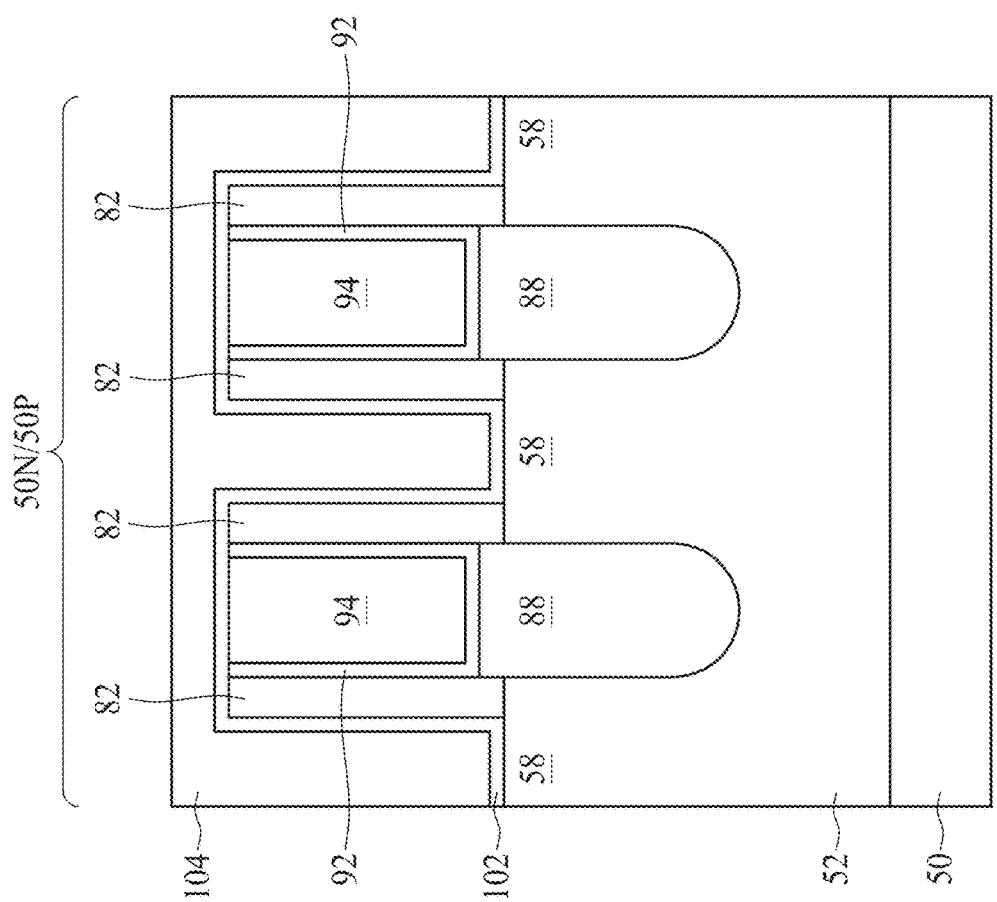

In FIGS. 11A-11B, a gate dielectric layer 102 is formed in the recesses 96. A gate electrode layer 104 is formed on the gate dielectric layer 102. The gate dielectric layer 102 and the gate electrode layer 104 are layers for replacement gates, and each extend along sidewalls and over top surfaces of the channel regions 58.

The gate dielectric layer 102 is disposed on the sidewalls and/or the top surfaces of the fins 52 and on the sidewalls of the gate spacers 82. The gate dielectric layer 102 may also be formed on the top surfaces of the first ILD 94 and the gate spacers 82. The gate dielectric layer 102 may include an oxide such as silicon oxide or a metal oxide, a silicate such as a metal silicate, combinations thereof, multi-layers thereof, or the like. The gate dielectric layer 102 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. The formation methods of the gate dielectric layer 102 may include molecular-beam deposition (MBD), ALD, PECVD, and the like. In embodiments where portions of the dummy dielectrics 72 remain in the recesses 96, the gate dielectric layer 102 includes a material of the dummy dielectrics 72 (e.g., silicon oxide). Although a single-layered gate dielectric layer 102 is illustrated, the gate dielectric layer 102 may include any number of interfacial layers and any number of main layers. For example, the gate dielectric layer 102 may include an interfacial layer and an overlying high-k dielectric layer.

The gate electrode layer 104 may include a metal-containing material such as titanium nitride, titanium oxide, tantalum nitride, tantalum carbide, tungsten, cobalt, ruthenium, aluminum, combinations thereof, multi-layers thereof, or the like. Although a single-layered gate electrode layer 104 is illustrated, the gate electrode layer 104 may include any number of work function tuning layers, any number of barrier layers, any number of glue layers, and a fill material.

The formation of the gate dielectric layer 102 in the n-type region 50N and the p-type region 50P may occur simultaneously such that the gate dielectric layer 102 in each region is formed of the same material(s), and the formation of the gate electrode layer 104 may occur simultaneously such that the gate electrode layer 104 in each region is formed of the same material(s). In some embodiments, the gate dielectric layers 102 in each region may be formed by distinct processes, such that the gate dielectric layers 102 may be different materials and/or have a different number of layers, and/or the gate electrode layers 104 in each region may be formed by distinct processes, such that the gate electrode layers 104 may be different materials and/or have a different number of layers. Various masking steps may be used to mask and expose appropriate regions when using distinct processes.

Figure 12B:
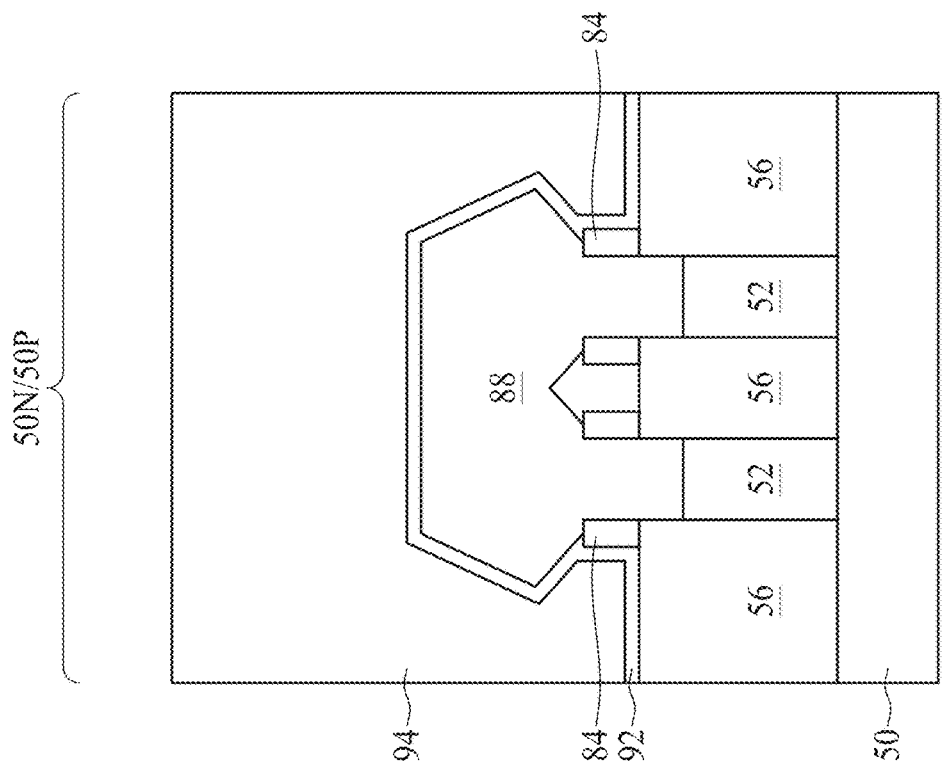
Figure 12A:
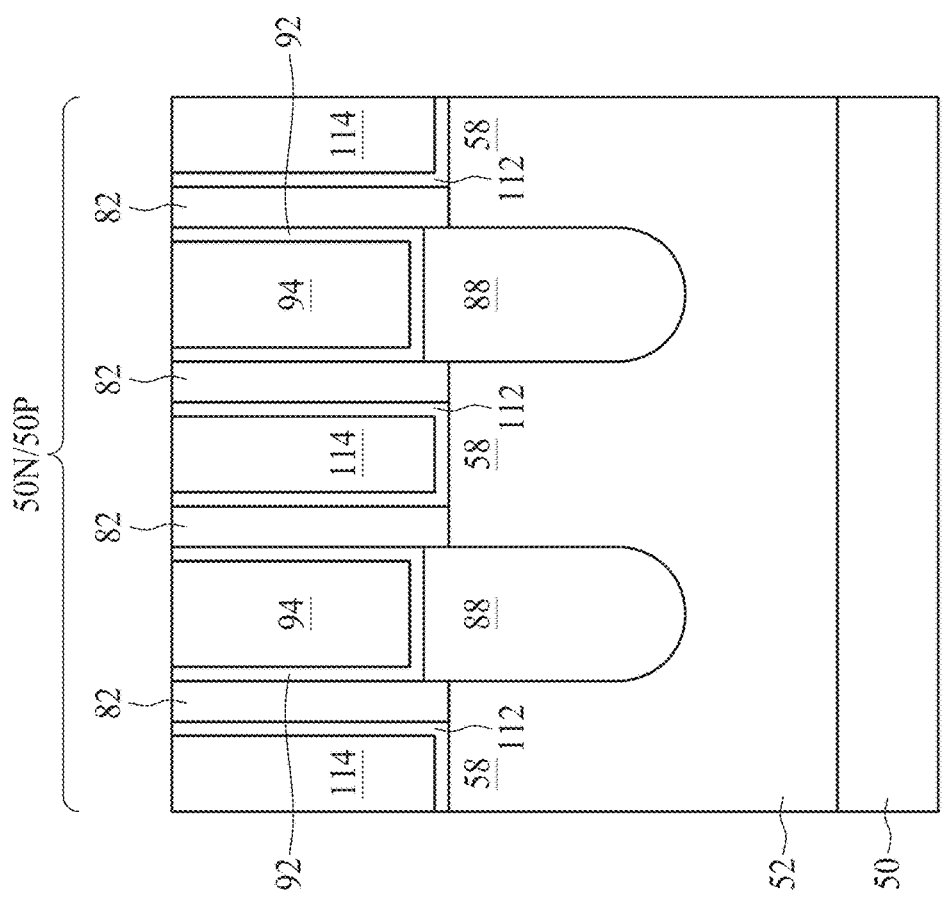

In FIGS. 12A-12B, a removal process is performed to remove the excess portions of the materials of the gate dielectric layer 102 and the gate electrode layer 104, which excess portions are over the top surfaces of the first ILD 94, the CESL 92, and the gate spacers 82, thereby forming gate dielectrics 112 and gate electrodes 114. In some embodiments, a planarization process such as a chemical mechanical polish (CMP), an etch-back process, combinations thereof, or the like may be utilized. The gate dielectric layer 102, when planarized, has portions left in the recesses 96 (thus forming the gate dielectrics 112). The gate electrode layer 104, when planarized, has portions left in the recesses 96 (thus forming the gate electrodes 114). The top surfaces of the gate spacers 82, the CESL 92, the first ILD 94, the gate dielectrics 112, and the gate electrodes 114 are coplanar (within process variations). The gate dielectrics 112 and the gate electrodes 114 form replacement gates of the resulting FinFETs. Each respective pair of a gate dielectric 112 and a gate electrode 114 may be collectively referred to as a "gate stack" or a "gate structure." The gate structures each extend along top surfaces, sidewalls, and bottom surfaces of a channel region 58 of fins 52.

Figure 13B:
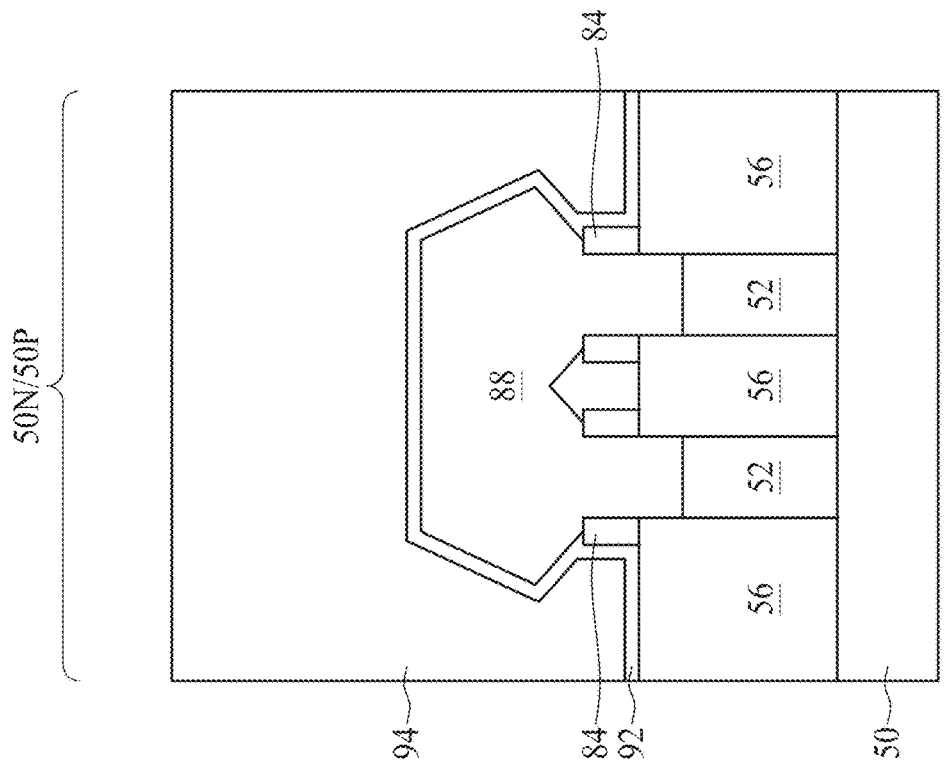
Figure 13A:
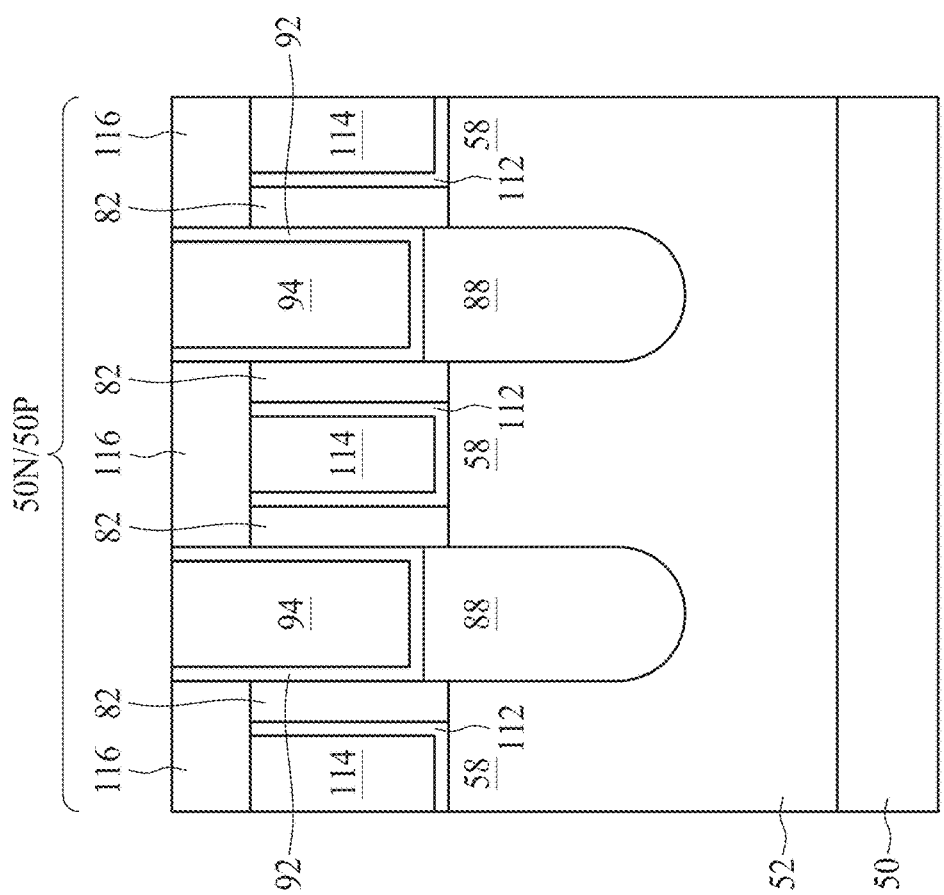

In FIGS. 13A-13B, gate masks 116 are formed over the gate structures (including the gate dielectrics 112 and the gate electrodes 114) and optionally the gate spacers 82. The gate masks 116 are formed of one or more dielectric material(s) that have a high etching selectivity from the etching of the first ILD 94. Acceptable dielectric materials may include silicon nitride, silicon carbonitride, silicon oxynitride, silicon oxycarbonitride, or the like, which may be formed by a conformal deposition process such as CVD, PECVD, ALD, PEALD, or the like. Other insulation materials formed by any acceptable process may be used.

As an example to form the gate masks 116, the gate structures (including the gate dielectrics 112 and the gate electrodes 114) and optionally the gate spacers 82 may be recessed using any acceptable etching process. In the illustrated embodiment, the gate spacers 82 and the gate structures are recessed to the same depth. In another embodiment, the gate structures are recessed to a greater depth than the gate spacers 82. In yet another embodiment, the gate structures are recessed but the gate spacers 82 are not recessed. The dielectric material(s) are then conformally deposited in the recesses, and may also be formed on the top surfaces of the first ILD 94. A removal process is performed to remove the excess portions of the dielectric material(s), which excess portions are over the top surfaces of the first ILD 94, thereby forming the gate masks 116. In some embodiments, a planarization process such as a chemical mechanical polish (CMP), an etch-back process, combinations thereof, or the like may be utilized. The dielectric material(s), when planarized, have portions left in the recesses (thus forming the gate masks 116). Gate contacts will be subsequently formed to penetrate through the gate masks 116 to contact the top surfaces of the gate electrodes 114.

Figure 14B:
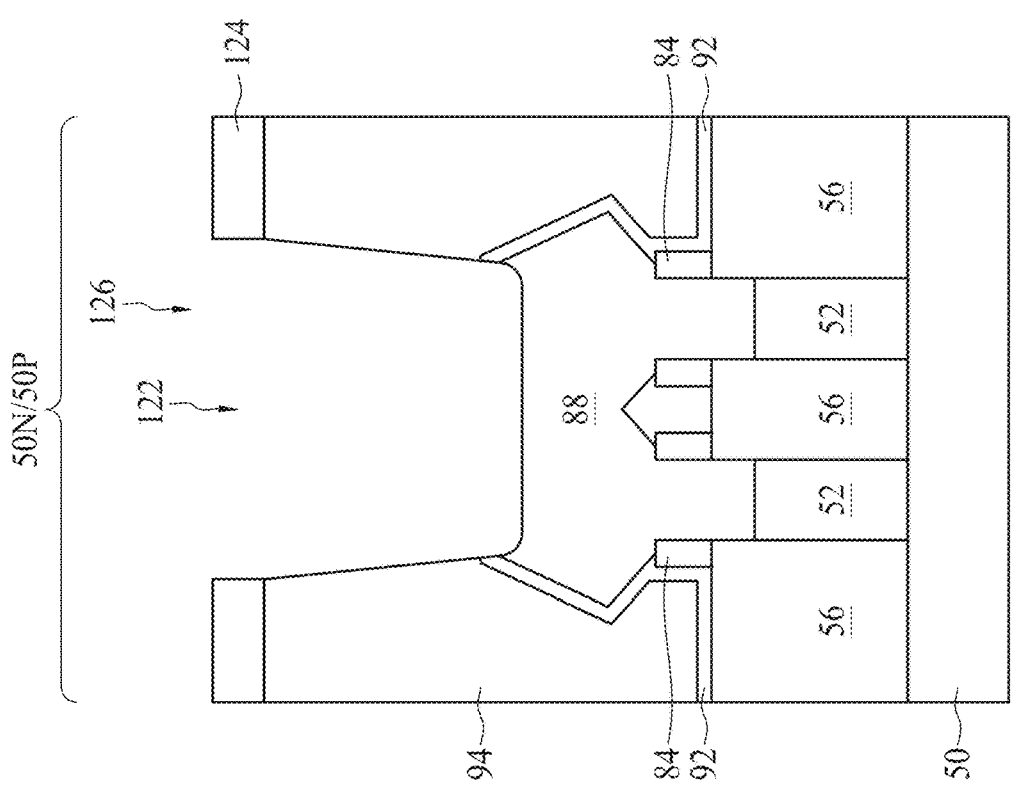
Figure 14A:
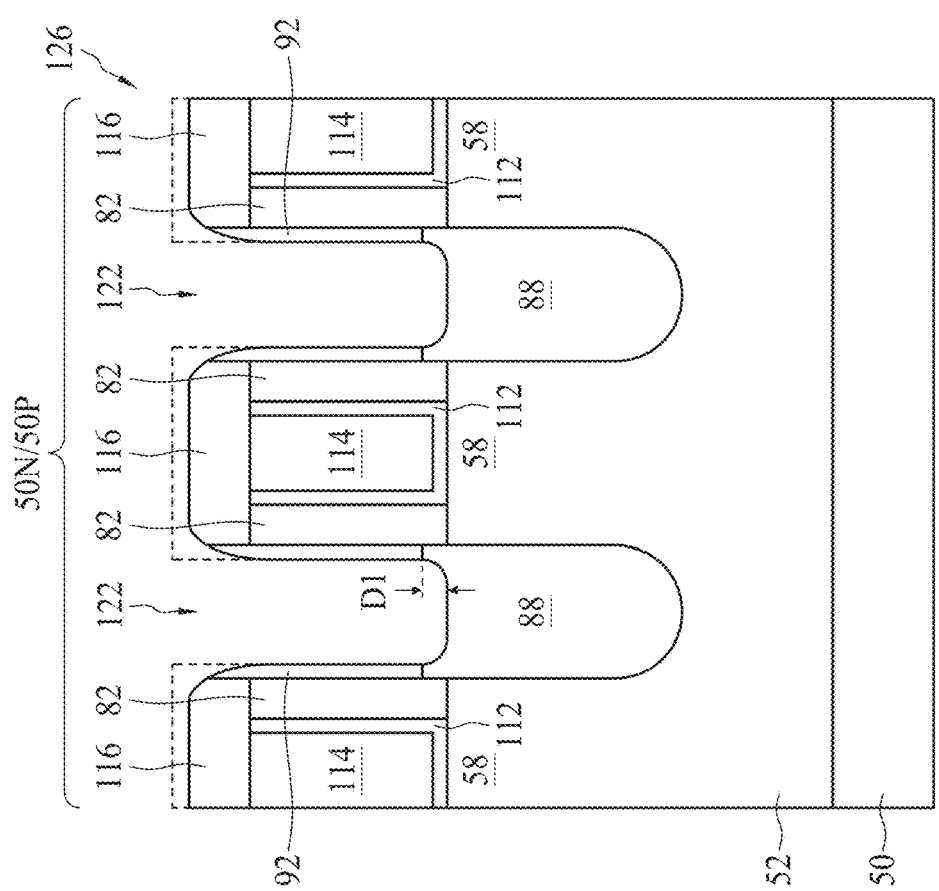

FIGS. 14A through 22B illustrate intermediate steps in the formation of source/drain contacts 140 (see FIGS. 22A-22B) that make electrical contact with the epitaxial source/drain regions 88, in accordance with some embodiments. In FIGS. 14A-14B, contact openings 122 are formed through the first ILD 94 and the CESL 92. As an example to form the contact openings 122, a contact mask 124 may be formed over the first ILD 94 and the gate masks 116. The contact mask 124 is patterned with slot openings 126 having a pattern of the contact openings 122. The contact mask 124 may be, e.g., a photoresist, such as a single layer photoresist, a bi-layer photoresist, a tri-layer photoresist, or the like, which may be patterned using acceptable photolithography techniques to form the slot openings 126. Other types of masks formed by any acceptable process may be used. The slot openings 126 are strips that run parallel to the lengthwise directions of the fins 52, overlapping the first ILD 94 and the gate masks 116. The first ILD 94 may then be etched using the contact mask 124 as an etching mask and using the CESL 92 as an etch stop layer. The etching may be any acceptable etching process, such as one that is selective to the material of the first ILD 94 (e.g., selectively etches the material of the first ILD 94 at a faster rate than the material(s) of the CESL 92 and the gate masks 116). The etching process may be anisotropic. The portions of the first ILD 94 uncovered by the contact mask 124 (e.g., exposed by the slot openings 126) are thus etched to form the contact openings 122. The contact openings 122 are then extended through the CESL 92 by any acceptable etching process to expose the epitaxial source/drain regions 88.

In some embodiments, the etching processes that form the contact openings 122 also may recess surfaces of the epitaxial source/drain regions 88. The epitaxial source/drain regions 88 may be recessed a depth D1 from top surfaces that is in the range of about 0.1 nm to about 10 nm, in some embodiments. Other depths are possible. In other embodiments, the etching processes do not significantly etch the epitaxial source/drain regions 88. After forming the contact openings 122, the exposed surfaces of the epitaxial source/drain regions 88 may be concave, flat, convex, or a combination thereof. Bottom surfaces of the contact openings 122 (e.g., exposed surfaces of the epitaxial source/drain regions 88) may be higher than, about level with, or lower than top surfaces of the fins 52. After the etching processes, the contact mask 124 is removed, such as by any acceptable ashing process.

Depending on the selectivity of the etching processes used to form the contact openings 122, some losses of the CESL 92 and/or the gate masks 116 may occur. Referring to the cross-section of FIG. 14A, the contact openings 122 may have funnel shapes, in which upper portions of the contact openings 122 have curved sidewalls (e.g., tapered sidewalls), and lower portions of the contact openings 122 have substantially straight sidewalls (e.g., non-tapered sidewalls). The dimensions of the CESL 92 and/or the gate masks 116 may be reduced. Specifically, upper portions of the gate masks 116 and the CESL 92 can have reduced widths such that the upper portions of the gate masks 116 and/or the CESL 92 have curved sidewalls, and the lower portions of the gate masks 116 and/or the CESL 92 have substantially straight sidewalls. Further, the gate masks 116 and/or the CESL 92 can have reduced heights. In some cases, top surfaces of the CESL 92 may be recessed below top surfaces of the gate masks 116, thereby exposing the curved sidewalls of the gate masks 116. In some embodiments, one or more additional etching processes may be performed that enlarge or widen bottom regions of the contact openings 122. In some cases, widening bottom regions of the contact openings 122 can form correspondingly larger lower conductive regions 137, described in greater detail below for FIGS. 17A-17B.

After forming the contact openings 122, the epitaxial source/drain regions 88 may be implanted with impurities, which may be followed by an anneal. The implantation may form highly-doped regions (not separately illustrated) in the epitaxial source/drain regions 88 that are near the surfaces exposed by the contact openings 122. The source/drain contacts 140 (see FIGS. 22A-23B) that are subsequently formed in the contact openings 122 may thus contact these highly-doped regions of the epitaxial source/drain regions 88. Forming source/drain contacts 140 that contact portions of epitaxial source/drain regions 88 having a greater concentration of impurities in this manner can decrease the contact resistance of the devices and improve device performance. The epitaxial source/drain regions 88 may be implanted with appropriate n-type and/or p-type impurities, which may be any of the impurities previously described. In embodiments with different device types, different implant steps for the n-type region 50N and the p-type region 50P may be achieved using a mask (not separately illustrated) such as a photoresist, similar to the process previously described for forming LDD regions. In other embodiments, an implantation may not be performed for n-type region 50N, p-type region 50P, or both.

Figure 15B:
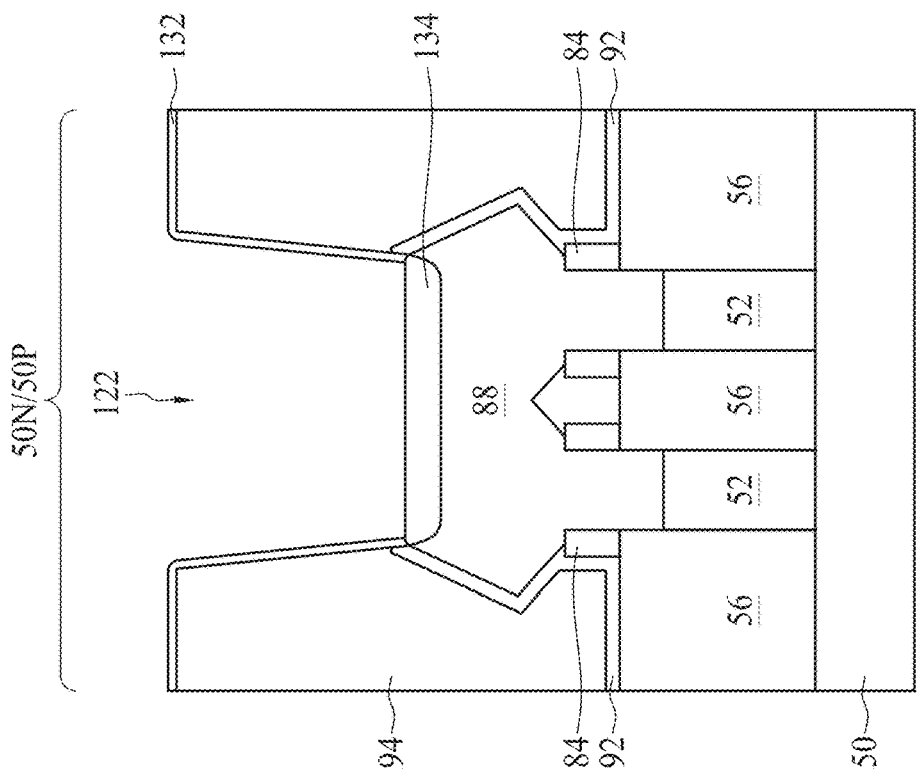
Figure 15A:
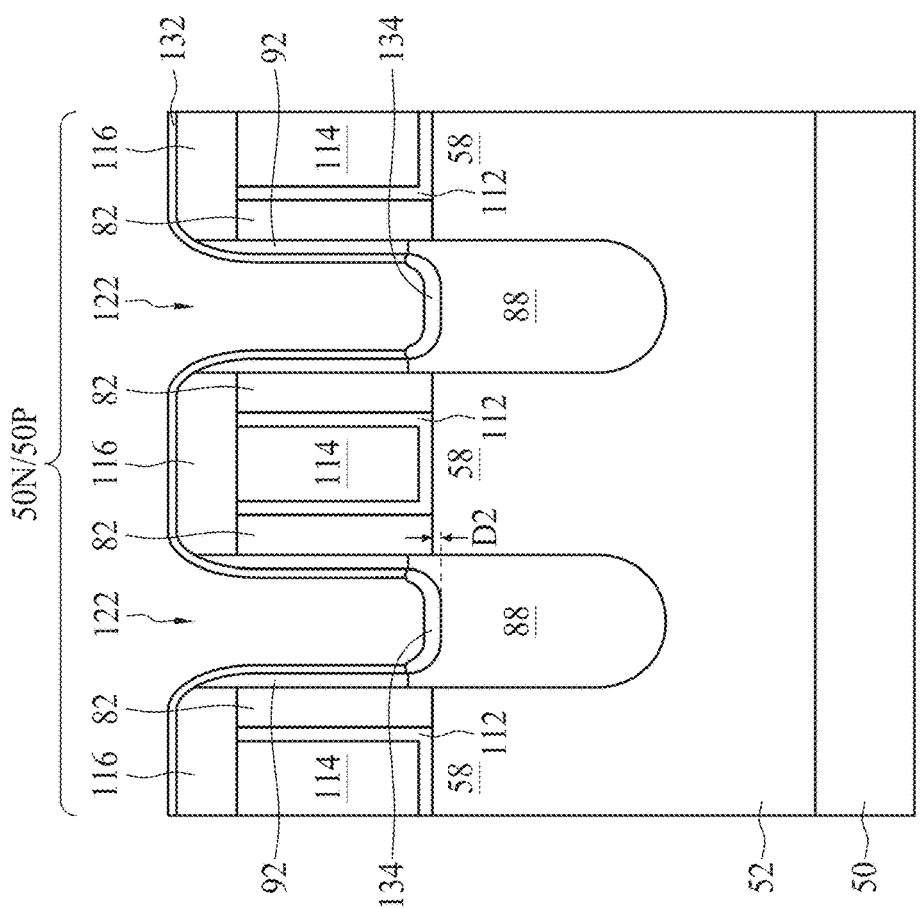

In FIGS. 15A-15B, metal-semiconductor alloy regions 134 are formed in the contact openings 122 and on the portions of the epitaxial source/drain regions 88 exposed by the contact openings 122. The metal-semiconductor alloy regions 134 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. In some embodiments, the metal-semiconductor alloy regions 134 can be formed by depositing a metal 132 and then performing a thermal anneal process. The metal 132 can be conformally deposited on the gate masks 116, the CESL 92, and the first ILD 94 and within the contact openings 122 (e.g., on the epitaxial source/drain regions 88). In some embodiments, a cleaning process is performed prior to deposition of the metal 132. The cleaning process may remove native oxide and may include a dry cleaning process and/or a wet cleaning process.

Figure 15C:
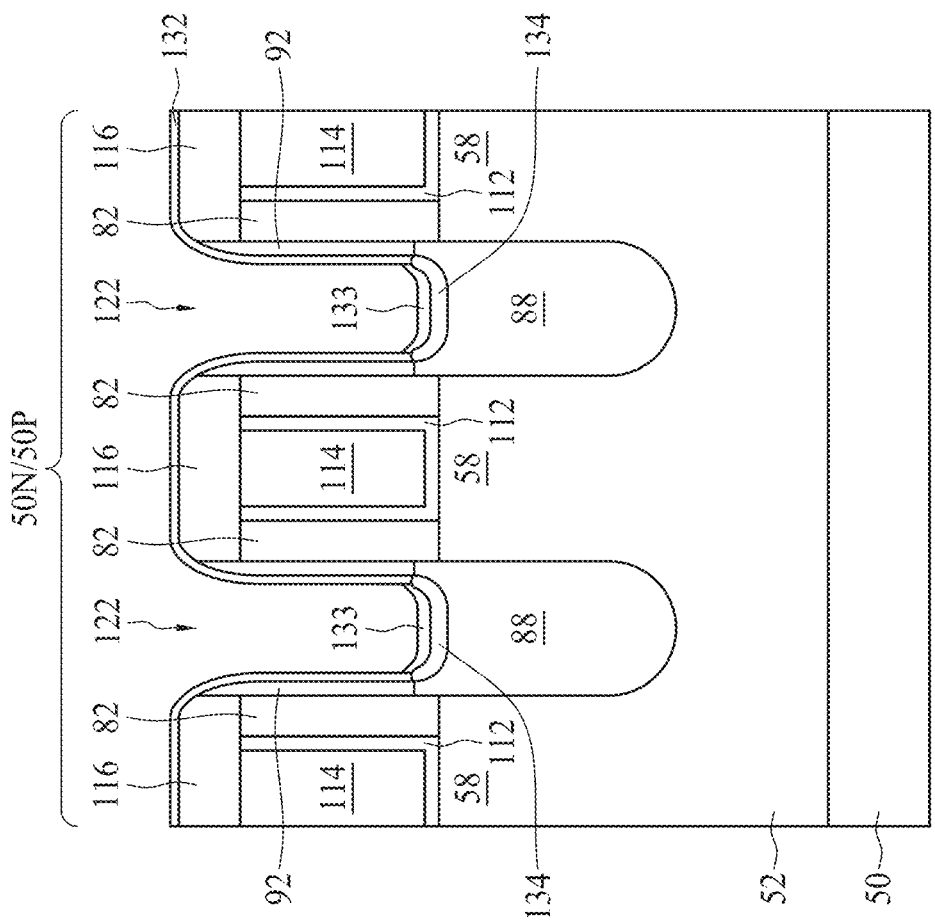

Referring to FIG. 15C, an optional nitride layer 133 may be formed on the metal-semiconductor alloy regions 134, in accordance with some embodiments. The nitride layer 133 may be formed, for example, by depositing layer of a metal nitride (e.g., TiN or the like) on the metal 132 and then performing the thermal anneal process. Other techniques are possible. The nitride layer 133 may comprise a metal nitride material and/or a metal silicide nitride material, such as TiSiN or the like. Other materials are possible.

The metal 132 can be any metal capable of reacting with the semiconductor materials (e.g., silicon, silicon-germanium, germanium, etc.) of the epitaxial source/drain regions 88 to form a low-resistance metal-semiconductor alloy, such as nickel, cobalt, titanium, tantalum, platinum, tungsten, other noble metals, other refractory metals, rare earth metals, or their alloys. The metal 132 can be deposited by a deposition process such as ALD, CVD, PVD, or the like. The metal nitride layer may be a titanium nitride layer or the like, and may be formed using ALD, CVD, or the like. In other embodiments, the metal nitride layer may be formed by nitridating the top portion of the metal 132, which may leave the bottom portion of the metal 132 not nitridated.

During the thermal anneal process, the metal 132 may react with the epitaxial source/drain regions 88 to form the metal-semiconductor alloy regions 134. After performing the thermal anneal process, reacted portions of the metal 132 (and metal nitride layer, if present) on the epitaxial source/drain regions 88 form metal-semiconductor alloy regions 134 on the epitaxial source/drain regions 88. Unreacted portions of the metal 132 (and metal nitride layer, if present) may remain on surfaces of the gate masks 116, the CESL 92, and the first ILD 94, in some embodiments. In some embodiments, there may be unreacted portions of the metal 132 (and metal nitride layer, if present) remaining on surfaces of the metal-semiconductor alloy regions 134. The metal-semiconductor alloy regions 134 on the epitaxial source/drain regions 88 may have a thickness in the range of about 4 nm to about 8 nm in some embodiments, though other thicknesses are possible. In embodiments in which a metal nitride layer was deposited, upper portions of the metal-semiconductor alloy regions 134 may comprise nitrogen. For example, the upper portions may comprise TiSiN or the like, though other materials are possible. The nitrogen-containing upper portions may have a thickness in the range of about 20 Å to about 30 Å, in some embodiments, though other thicknesses are possible. In some embodiments, the metal-semiconductor alloy regions 134 may extend a depth D2 below top surfaces of the fins 52 that is in the range of about 8 nm to about 14 nm, though other depths are possible.

Figure 16A:
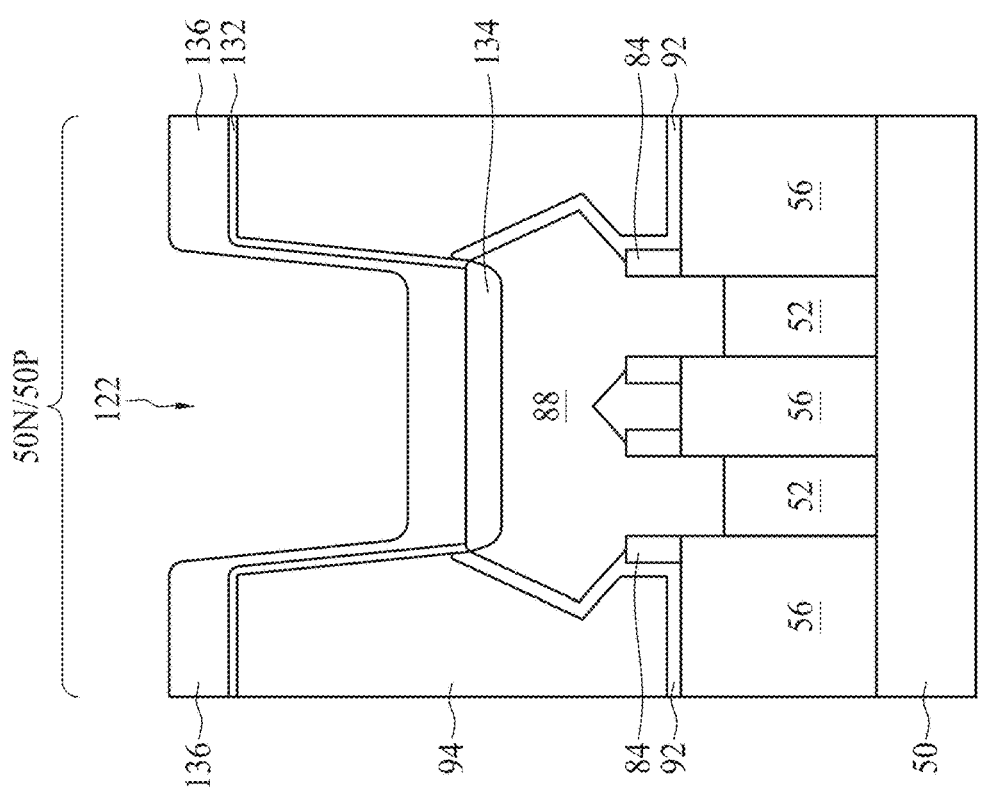
Figure 16B:
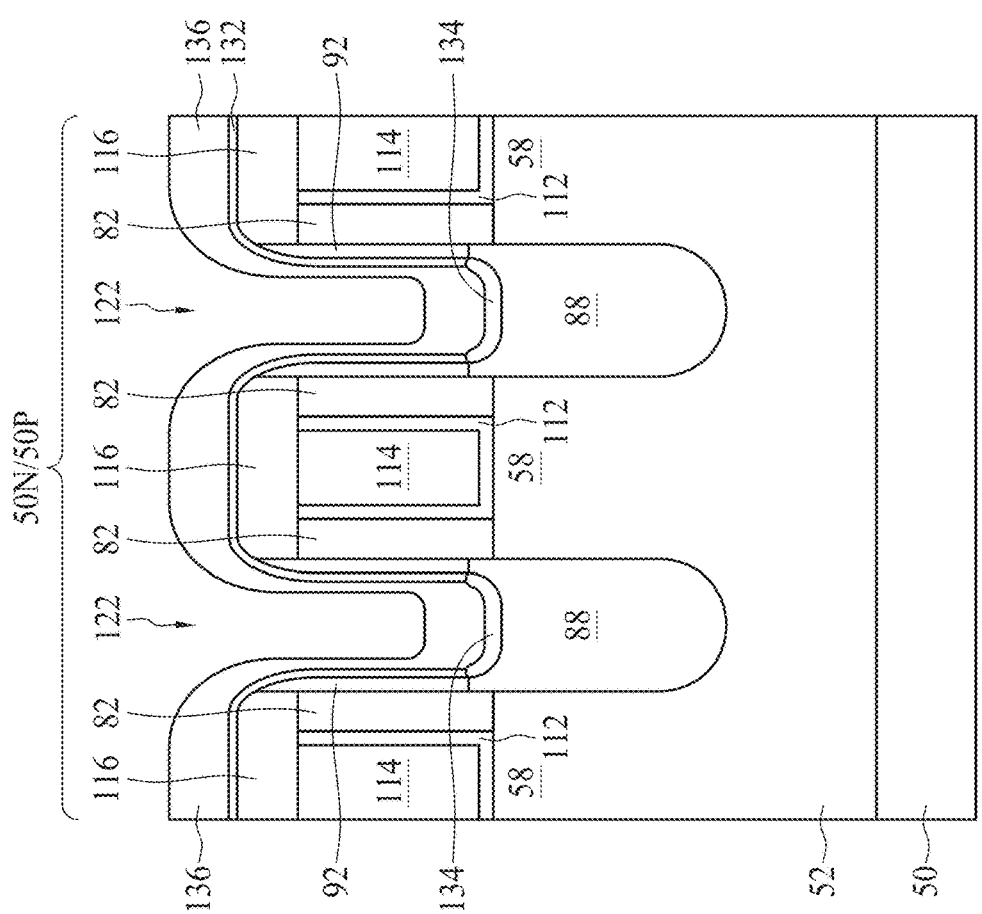

In FIGS. 16A-16B, a conductive material 136 is deposited on the metal layer 132 and the metal-semiconductor alloy regions 134, in accordance with some embodiments. The conductive material 136 may be conformally deposited and may extend over upper surfaces of the gate masks 116, the CESL 92, and the first ILD 94; over sidewalls of the CESL 92 and the first ILD 94 within the contact openings 122; and over the metal-semiconductor alloy regions 134 within the contact openings 122. The conductive material 136 may be copper, a copper alloy, silver, gold, tungsten, cobalt, aluminum, nickel, ruthenium, molybdenum, the like, or combinations thereof. The conductive material 136 can be deposited by a deposition process such as PVD, CVD, ALD, or the like. In some cases, the conductive material 136 deposited on relatively horizontal surfaces (e.g., over top surfaces of the gate masks 116 or the first ILD 94) may be thicker than the conductive material 136 deposited on relatively vertical surfaces (e.g., over sidewalls of the CESL 92 or the first ILD 94). In some embodiments, the first conductive material 136 on the metal-semiconductor alloy regions 134 may have a thickness in the range of about 3 nm to about 6 nm, though other thicknesses are possible. In some cases, depositing the first conductive material 136 over the metal-semiconductor alloy regions 134 protects the metal-semiconductor alloy regions 134 during subsequent processing steps.

In FIGS. 17A-17B, an etching process is performed to remove the conductive material 136 and the metal 132 from sidewalls of the contact openings 122, in accordance with some embodiments. The etching process may include a wet etching process, in some embodiments. The wet etching process may include etchants such as $H_2SO_4$, HCl, $NH_4OH$, $H_2O_2$, $DIO_3$, the like, or combinations thereof. Other etchants or etching processes are possible. The wet etching process may include a timed etch, in some embodiments. The wet etching process may be performed for between about 10 seconds and about 150 seconds, though other etch durations are possible. For example, the structure may be exposed to etchants until after the relatively thin conductive material 136 and metal 132 on vertical surfaces (e.g. on sidewalls of the contact openings 122) has been removed but stopped before the relatively thick conductive material 136 and metal 132 on top surfaces (e.g. on the gate masks 116 and/or the first ILD 94) has been removed. After performing the etching process, sidewalls of the CESL 92 and/or sidewalls of the first ILD 94 within the contact openings 122 may be exposed. In some cases, by removing conductive material 136 and metal 132 from sidewalls within the contact openings 122 but leaving portions of conductive material 136 and metal 132 remaining on upper surfaces, the duration of etching time may be reduced. Reducing the etching time in this manner can reduce the chance of exposing the metal-semiconductor alloy regions 134, in some cases. Reducing the etching time can also reduce the chance of etchants damaging or oxidizing the conductive material 136 or the metal-semiconductor alloy regions 134 within the contact openings 122, in some cases.

As shown in FIGS. 17A-17B, the etching process leaves upper conductive regions 135 of the conductive material 136 and lower conductive regions 137 of the conductive material 136. The upper conductive regions 135 may extend over upper surfaces of the gate masks 116, the first ILD 94, and/or the CESL 92. In some cases, the upper conductive regions 135 may extend over curved sidewalls of the gate masks 116 and/or curved top surfaces of the CESL 92. The upper conductive regions 135 may cover remaining portions of the metal 132. The lower conductive regions 137 may fill the bottom portions of the contact openings 122 and may cover the metal-semiconductor alloy regions 134. In some cases, remaining portions of the metal 132 and/or the metal-semiconductor alloy regions 134 may extend between the sidewalls of the lower conductive regions 137 and the sidewalls of the contact openings 122 (e.g., the sidewalls of the CESL 92 or the first ILD 94). In some embodiments, the lower conductive regions 137 may have a thickness in the range of about 3 nm to about 9 nm, though other thicknesses are possible. In some cases, leaving lower conductive regions 137 over the metal-semiconductor alloy regions 134 protects the metal-semiconductor alloy regions 134 during subsequent processing steps.

Figure 18B:
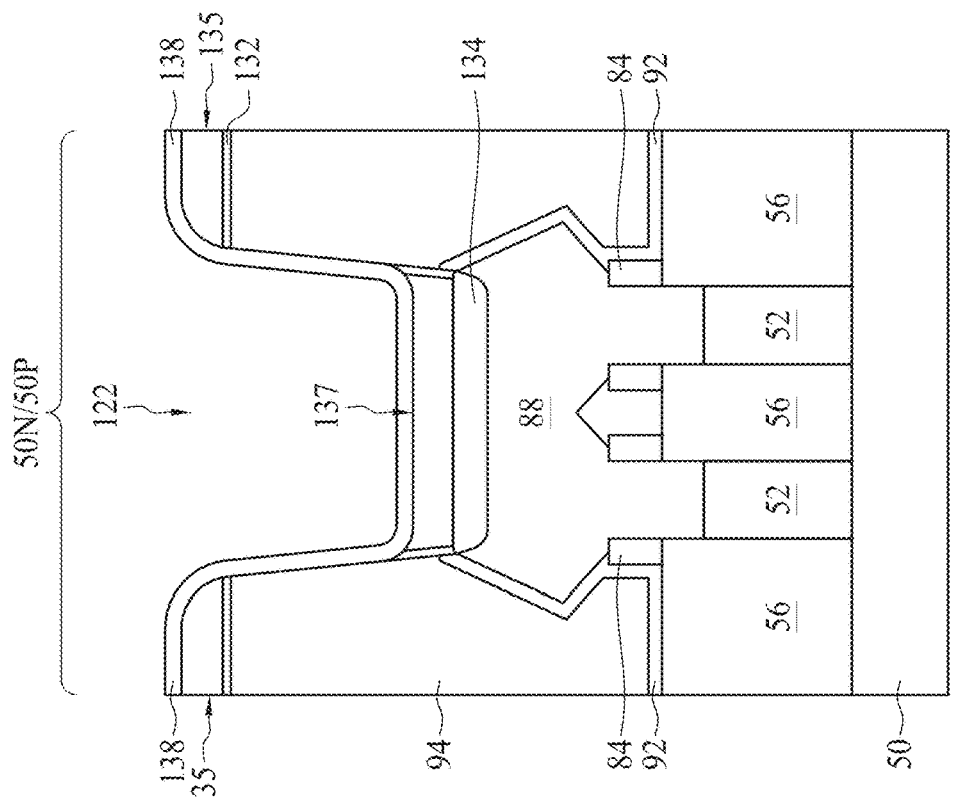
Figure 18A:
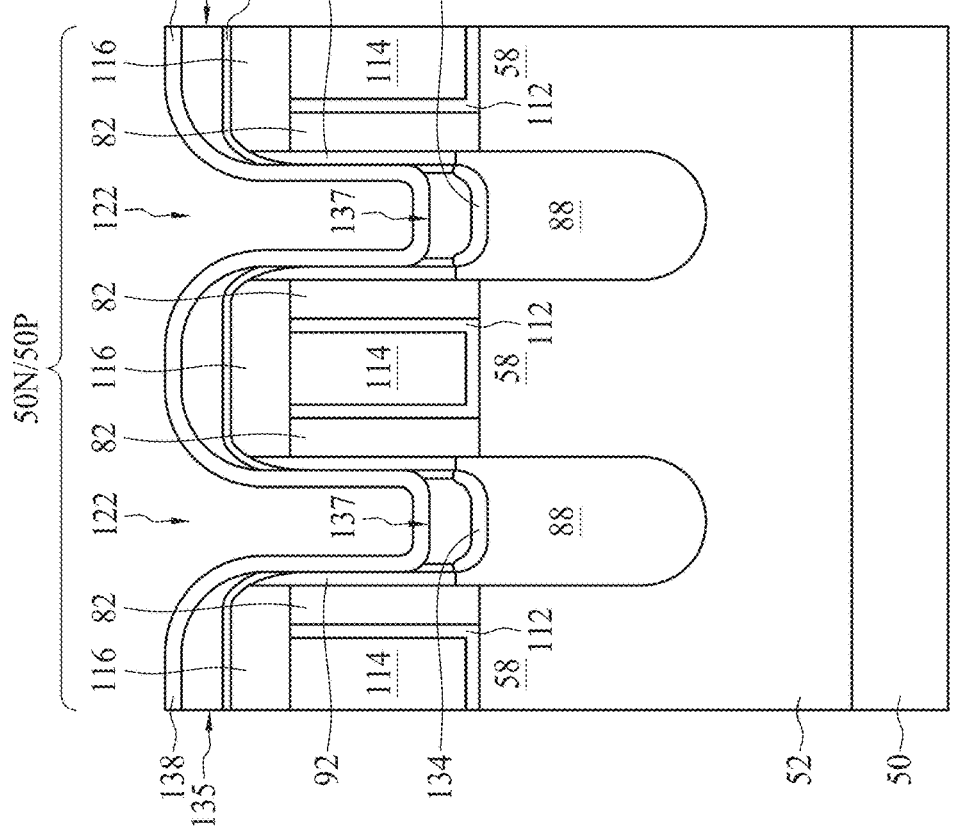

In FIGS. 18A-18B, an isolation material 138 is conformally deposited within the contact openings 122 and over the upper conductive regions 135, in accordance with some embodiments. The isolation material 138 deposited within the contact openings 122 may extend on sidewalls of the CESL 92, on sidewalls of the first ILD 94, and on the lower conductive regions 137, in some embodiments. Because the metal 132 has been previously removed from sidewalls of the contact openings 122, the isolation material 138 may physically contact sidewall surfaces of the CESL 92 or the first ILD 94. In some cases, the isolation material 138 may also extend on exposed surfaces of the metal 132.

The isolation material 138 may be formed of one or more dielectric material(s) that have a high etching selectivity from the etching of the conductive material 136. Acceptable dielectric materials may include silicon nitride, silicon carbonitride, silicon oxynitride, silicon oxycarbonitride, or the like, which may be formed by a conformal deposition process such as CVD, PECVD, ALD, PEALD, or the like. In some embodiments, the isolation material 138 is formed of the same material as the CESL 92. Other dielectric materials formed by any acceptable process may be used. In some embodiments, the isolation material 138 is formed of silicon nitride using ALD. The isolation material 138 can be formed having a thickness in the range of about 5 Å to about 35 Å, in some embodiments. Other thicknesses are possible.

In FIGS. 19A-19B, the contact openings 122 are extended through the isolation material 138 to expose the lower conductive regions 137, in accordance with some embodiments. The contact openings 122 may be extended using any acceptable etching process, such as one that is selective to the material of the isolation material 138 (e.g., selectively etches the isolation material 138 at a faster rate than the conductive material 136). The etching process may include a dry etching process, and may be anisotropic. For example, the etching process may be a dry etching process comprising etchants such as $NH_3$, $NF_3$, $C_4F_6$, $C_4F_8$, $CH_3F$, the like, or a combination thereof. In some embodiments, the etching process includes a temperature in the range of about 100° C. to about 120° C., a pressure in the range of about 3 Torr to about 10 Torr, or a time in the range of about 10 seconds to about 100 seconds.

Other etchants or etching parameters are possible. In some embodiments, one or more cleaning processes may be performed after performing the etching process. The cleaning processes may comprise a dry process (e.g., an ashing process) and/or a wet chemical process.

In some embodiments, a polymer layer (not shown) is formed on surfaces of the structure during the etching process. The polymer layer may comprise, for example, a $C_xF_y$ polymer, the like, or another polymer or polymer-like material. The composition of the polymer layer may depend on the etchants used in the etching process. In some embodiments, little or no polymer layer is formed on surfaces within the contact openings 122, such as surfaces at or near the bottom of the contact openings 122. In some embodiments, surfaces covered by the polymer layer are at least partially protected from the etchants during the etching process, and thus surfaces that are not covered by the polymer layer may be etched more than covered surfaces. This is shown in FIGS. 19A-19B, in which little or no polymer layer has formed on the isolation material 138 at the bottom of the contact openings 122, and accordingly the etching process has removed the isolation material 138 at the bottom of the contact openings 122. The isolation material 138 that was covered by the polymer layer is left remaining after the etching process. In some cases, some portions of the isolation material 138 covered by the polymer layer may be removed by the etching process, such as in regions where the polymer layer is insufficiently thick to provide protection from etching.

In some embodiments, after performing the etching process, portions of the lower conductive regions 137 are exposed, but the upper conductive regions 135 and the sidewalls of the contact openings 122 remain covered with the isolation material 138. In some embodiments, after performing the etching process, the isolation material 138 may partially extend over top surfaces of the lower conductive regions 137. For example, as shown in FIGS. 19A-19B, portions of the lower conductive regions 137 near the sidewalls of the contact openings 122 remain covered by the isolation material 138 after performing the etching process. In this manner, the lower conductive regions 137 may be exposed while the isolation material 138 covers all other metal material (e.g., the metal 132, the conductive material 136, or residues thereof) outside of the contact openings 122 or on sidewalls of the contact openings 122. In some embodiments, after performing the etching process, the lower conductive regions 137 may have a thickness in the range of about 3 nm to about 9 nm. In some embodiments, after performing the etching process, the total thickness T1 of the lower conductive region 137 and the underlying metal-semiconductor alloy regions 134 may be in the range of about 7 nm to about 16 nm. Other thicknesses are possible.

Notably, the isolation material 138 is deposited and etched after formation of the metal-semiconductor alloy regions 134 and the lower conductive regions 137. In this manner, the lower conductive regions 137 may protect the metal-semiconductor alloy regions 134 and the epitaxial source/drain regions 88 from also being etched during etching of the isolation material 138. As described previously for FIGS. 7A-7B and FIGS. 14A-14B, upper regions of the epitaxial source/drain regions 88 may be highly doped to reduce contact resistance. Accordingly, etching the epitaxial source/drain regions 88 can remove portions of these highly-doped upper regions, which can increase the contact resistance. Thus, depositing and etching the isolation material 138 after formation of the metal-semiconductor alloy regions 134 and the lower conductive regions 137 can allow for little or no etching of the epitaxial source/drain regions 88, which can improve the contact resistance and/or the reliability of the subsequently formed source/drain contacts 140 (see FIGS. 22A-23B).

Figure 20B:
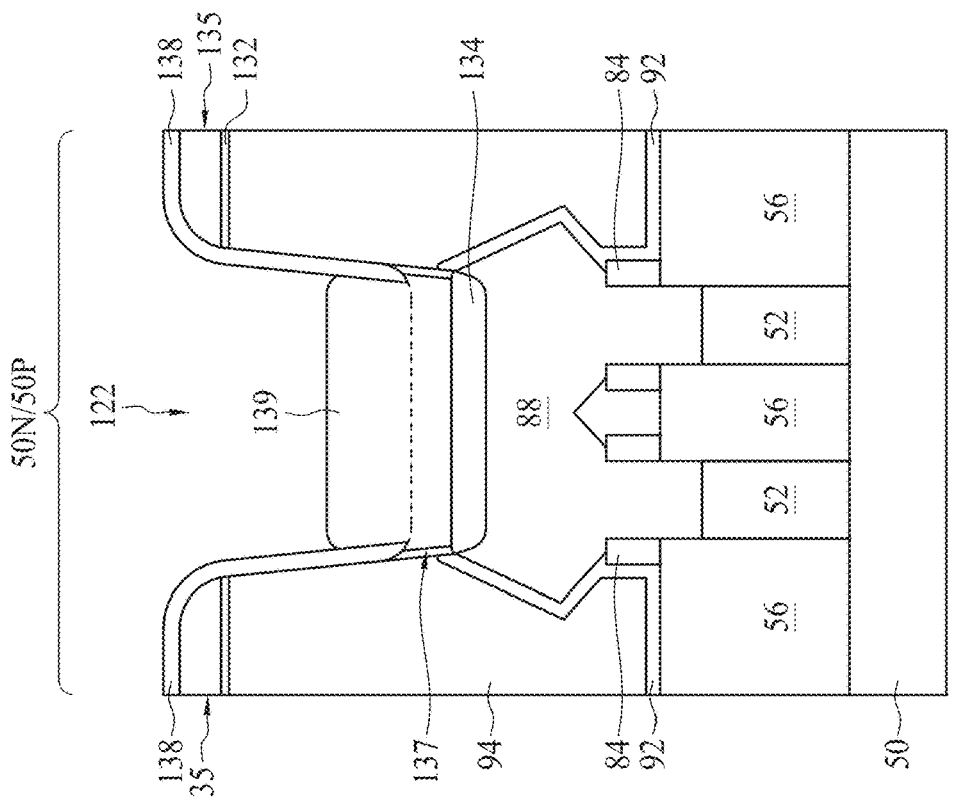
Figure 20A:
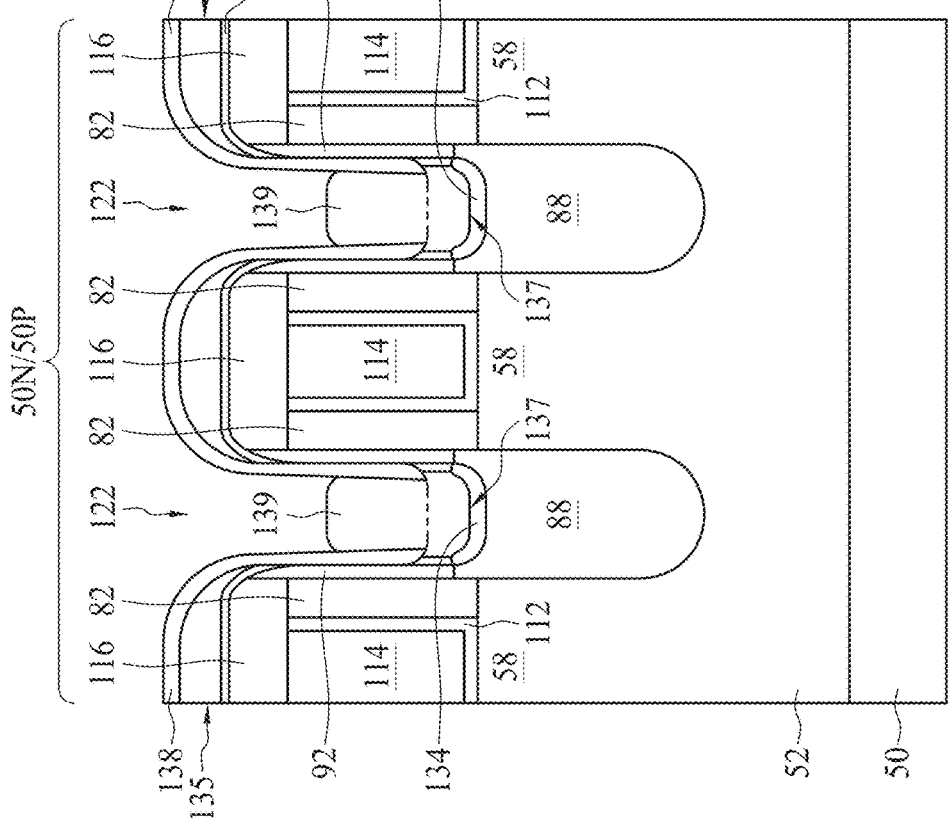

In FIGS. 20A-20B, a conductive material 139 is deposited on the lower conductive regions 137 in the contact openings 122, in accordance with some embodiments. The conductive material 139 may be similar to the conductive material 136 described previously for FIGS. 16A-16B. For example, the conductive material 139 may be copper, a copper alloy, silver, gold, tungsten (e.g., fluorine-free tungsten (FFW)), cobalt, aluminum, nickel, ruthenium, molybdenum, the like, or combinations thereof. The conductive material 139 may be the same material as the conductive material 136, in some embodiments. For example, in some embodiments both the conductive material 136 and the conductive material 139 may be tungsten, though other materials are possible. The conductive material 136 and the conductive material 139 may comprise different materials in other embodiments. In some embodiments, the conductive material 139 may be deposited on the lower conductive regions 137 to a thickness that is in the range of about 5 nm to about 20 nm, though other thicknesses are possible.

The conductive material 139 can be deposited by a deposition process such as PVD, CVD. ALD, or the like. In some embodiments, the conductive material 139 may be deposited using a selective deposition process that selectively deposits the conductive material 139 on the conductive material 136 of the lower conductive regions 137 and deposits little or no conductive material 139 on the isolation material 138. In some cases, the use of a selective deposition process can reduce the chance of depositing the conductive material 139 in unwanted regions, such as on surfaces outside of the contact openings 122. Notably, depositing the isolation material 138 after depositing the metal 132 and the conductive material 136 allows the isolation material 138 to cover metal material (e.g., the metal 132, the conductive material 136, or residues thereof) outside of the contact openings 122 or on sidewalls of the contact openings 122. Covering the metal material in this manner can reduce the chance of selectively-deposited conductive material 139 from being deposited on unwanted surfaces. For example, if a metal residue on a sidewall of a contact opening 122 is exposed, some unwanted conductive material 139 may be selectively deposited on that metal residue, which can result in voids, defects, incomplete filling, poorer-quality material, increased resistance, or other problems. By covering the metal material outside of the contact openings 122 or on sidewalls of the contact openings 122 with the isolation material 138, selectivity can be maintained and the chance of conductive material 139 being deposited in unwanted regions can be reduced. As an example, in some embodiments the conductive material 139 may be a fluorine-free tungsten (FFW) that is deposited using a selective CVD process. In some embodiments, the selective CVD process may use precursors such as $WCl_5$, $WF_6$, $WCO_6$, the like, or a combination thereof. In some embodiments, the selective CVD process may use a temperature in the range of about 400° C. to about 500° C., a pressure in the range of about 20 Torr to about 30 Torr, or a time in the range of about 100 seconds to about 300 seconds. Other precursors or deposition processes are possible.

Figures 21A, 21B:
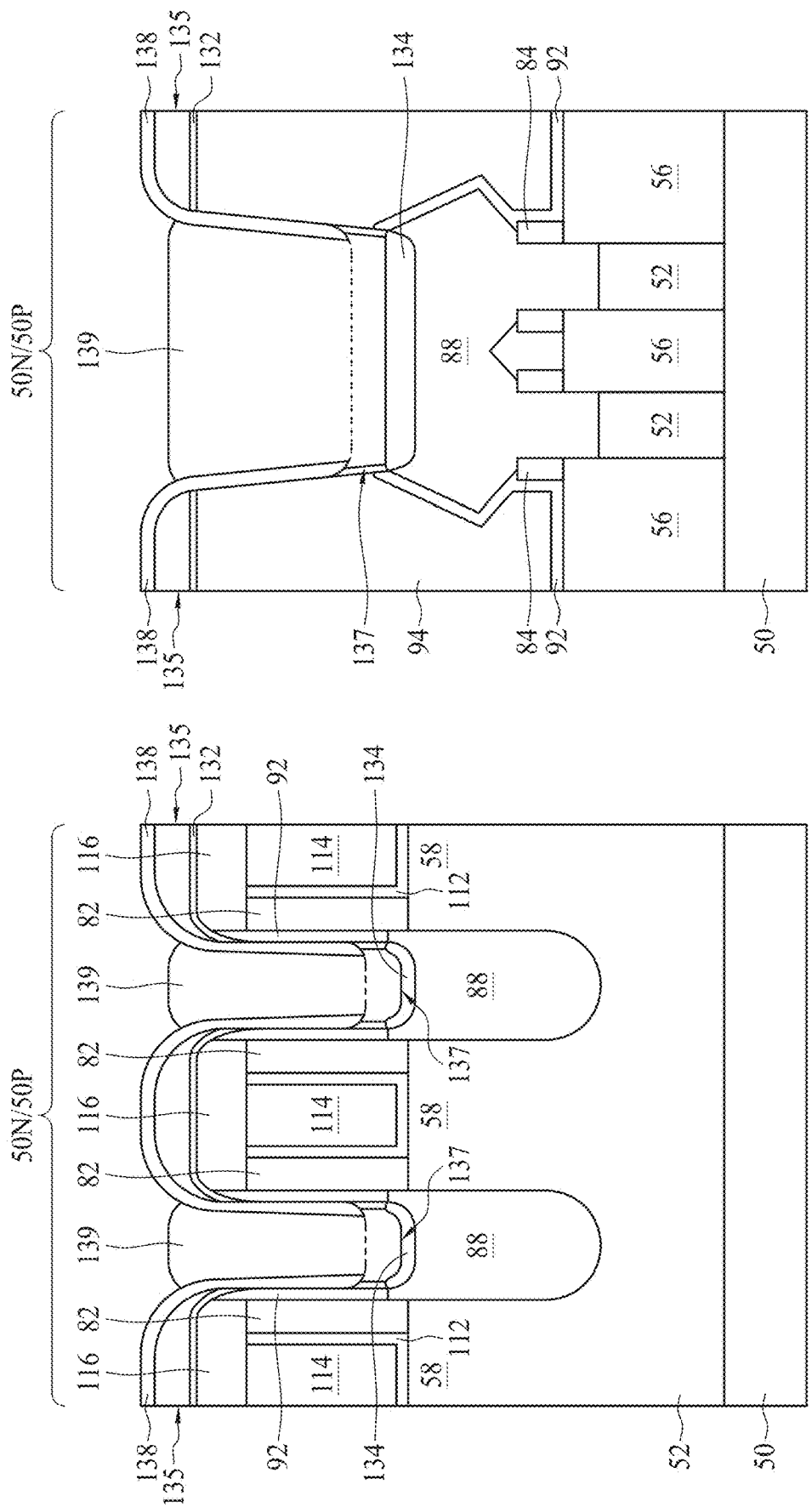

In FIGS. 21A-21B, additional conductive material 139 is deposited to at least partially fill remaining regions of the contact openings 122, in accordance with some embodiments. The additional conductive material 139 may be deposited on the previously-deposited conductive material 139 shown in FIGS. 20A-20B. The additional conductive material 139 may be deposited using the same deposition process used for the previously-deposited conductive material 139 shown in FIGS. 20A-20B or may be deposited using a different deposition process. For example, the additional conductive material 139 can be deposited by a deposition process such as PVD, CVD (including selective CVD), ALD, or the like. In some embodiments, the conductive material 139 shown in FIGS. 20A-20B and the conductive material 139 shown in FIGS. 21A-21B are deposited in the same continuous deposition step. After depositing the additional conductive material 139, a top surface of the conductive material 139 may be lower than, about level with, or higher than a top surface of the isolation material 138.

Figure 22B:
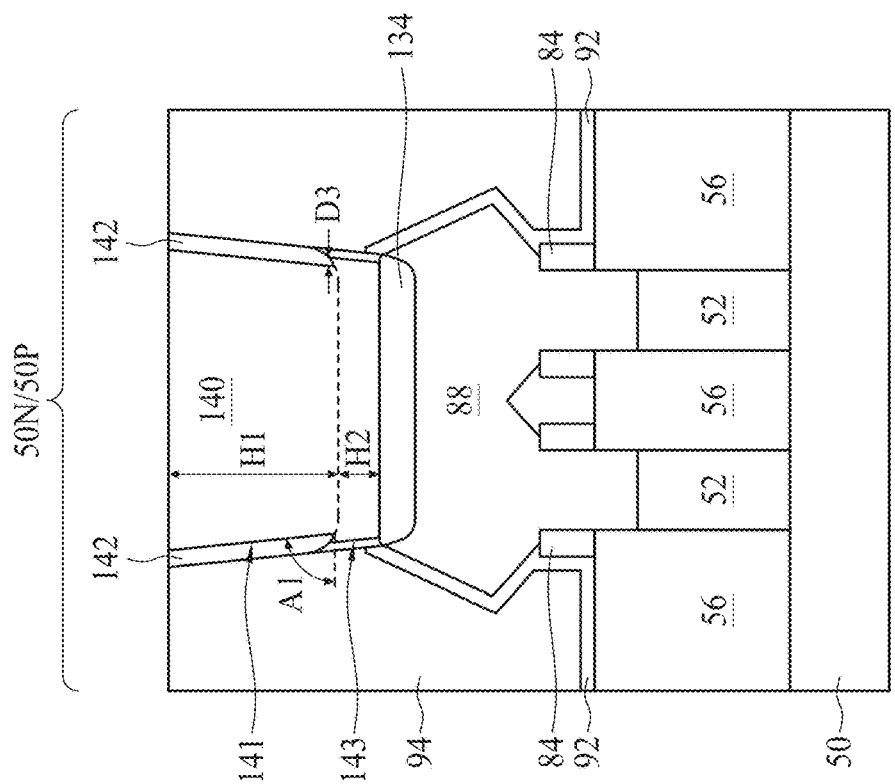
Figure 22A:
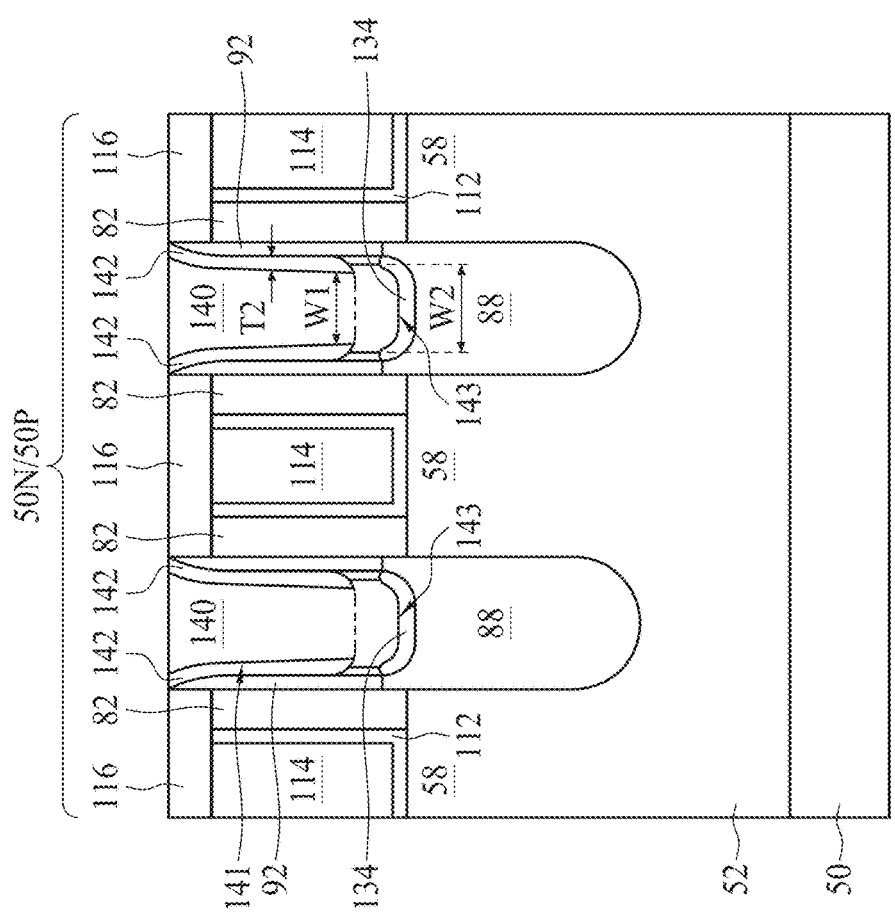

In FIGS. 22A-22B, a removal process is performed to remove excess portions of the isolation material 138, the conductive material 139, the upper conductive regions 135, and the metal 132, thereby forming source/drain contacts 140 and contact spacers 142, in accordance with some embodiments. In some embodiments, the removal process comprises a planarization process such as a chemical mechanical polish (CMP), an etch-back process, combinations thereof, or the like. The removal process may remove portions of the isolation material 138, the conductive material 139, the upper conductive regions 135, and/or the metal 132 that are over the top surfaces of the gate masks 116, the CESL 92, and/or the first ILD 94. In this manner, the removal process may expose the gate masks 116. In some embodiments, the removal process removes portions of the gate masks 116, the CESL 92, and/or the first ILD 94. FIG. 22C illustrates an embodiment similar to that shown in FIG. 22A, except that a nitride layer 133 (see FIG. 15C) has been formed on the metal-semiconductor alloy regions 134.

After the removal process, the remaining conductive material 139 and the underlying lower conductive regions 137 form the source/drain contacts 140. In this manner, the source/drain contacts 140 may comprise upper contact regions 141 formed from the remaining conductive material 139 and lower contact regions 143 formed from the lower conductive regions 137. In some embodiments, the source/drain contacts 140 may have a height in the range of about 35 nm to about 50 nm, and adjacent source/drain contacts 140 may be separated by a distance in the range of about 10 nm to about 20 nm. Other heights or separation distances are possible. In some embodiments, the upper contact regions 141 may have a height H1 that is in the range of about 20 nm to about 30 nm, and the lower contact regions 143 may have a height H2 that is in the range of about 2.5 nm to about 5 nm. In some embodiments, the ratio of H1:H2 may be between about 4:1 and about 12:1. In some embodiments, a source/drain contact 140 has a height H1 that is between about 70% and about 90% of its total height (e.g., the height equal to H1+H2).

In some embodiments, the upper contact regions 141 may have a width W1 that is smaller than a width W2 of the lower contact regions 143. The width W1 of the upper contact regions 141 may be smaller than the width W2 of the lower contact regions 143 due to the formation of contact spacers 142 (described below) on sidewalls of the upper contact regions 141. In some cases, forming lower contact regions 143 with a larger width may increase the contact area of the source/drain contacts 140 and decrease contact resistance. In some cases, the difference between the widths W1 and W2 may give the source/drain contacts 140 an "upside-down mushroom" shape, as shown in FIGS. 22A-22B. FIG. 22D shows a simplified illustration of the cross-sectional view of FIG. 22A in which the source/drain contacts 140 are emphasized, highlighting the "upside-down mushroom" shape. The upper contact regions 141 or the lower contact regions 143 may each have substantially vertical sidewalls or sidewalls that are at an oblique angle. In some embodiments, the upper contact regions 141 may have a width W1 that is in the range of about 8 nm to about 11 nm, and the lower contact regions 143 may have a width W2 that is in the range of about 12 nm to about 16 nm. In some embodiments, the lower contact regions 143 may protrude from the upper contact regions 141 a distance D3 that is in the range of about 0.5 nm to about 2.5 nm. In some embodiments, the ratio of W1:W2 may be between about 1:1 and about 2:1. Other widths, distances, or ratios are possible. In some embodiments, upper contact regions 141 near the lower contact regions 143 may have an angle A1 with respect to the horizontal that is in the range of about 40° to about 105°, though other angles are possible.

After the removal process, the remaining portions of the isolation material 138 form the contact spacers 142. The contact spacers 142 surround the upper contact regions 141 of the source/drain contacts 140. In some cases, the contact spacers 142 can reduce the chance or severity of leakage between the source/drain contacts 140 and the gate electrodes 114. The contact spacers 142 may extend on sidewalls of the source/drain contacts 140 between the lower conductive regions 137 and the top surfaces of the source/drain contacts 140, and may extend on top surfaces of the lower conductive regions 137 of the source/drain contacts 140. The contact spacers 142 may physically extend on surfaces of the gate masks 116, the CESL 92, and/or the first ILD 94. In some embodiments, the contact spacers 142 are physically separated from the sidewalls of the gate masks 116 by the CESL 92. In some embodiments, sidewalls of the contact spacers 142 are free of the metal 132, though in some cases bottom surfaces of the contact spacers 142 may physically contact portions of the metal 132. In this manner, the contact spacers 142 may separate the upper contact regions 141 from the gate masks 116, the CESL 92, and/or the first ILD 94. In some embodiments, the contact spacers 142 may have a thickness T2 in the range of about 0.4 nm to about 3.5 nm. The thickness T2 of the contact spacers 142 may be substantially uniform or may change between the top and bottom of the contact spacers 142. For example, in some embodiments, a contact spacer 142 may have a thickness T2 near the top of the contact spacer 142 that is greater than the thickness T2 near the bottom of the contact spacer 142. The thickness T2 near the top of a contact spacer 142 may be between about 0.5 nm and about 2 nm larger than the thickness T2 near the bottom of the contact spacer 142, in some cases. Other thicknesses or variations in thickness are possible.

After the removal process, top surfaces of the gate masks 116, the first ILD 94, the contact spacers 142, and the source/drain contacts 140 may be coplanar (within process variations). In some embodiments, the removal process exposes top surfaces of the CESL 92, which may also be coplanar with the other top surfaces. In some embodiments, the height of the gate masks 116 is reduced until the top surfaces of the gate masks 116 and the CESL 92 are coplanar (within process variation), so that the contact spacers 142 are physically separated from the sidewalls of the gate masks 116 by the CESL 92.

Figure 23B:
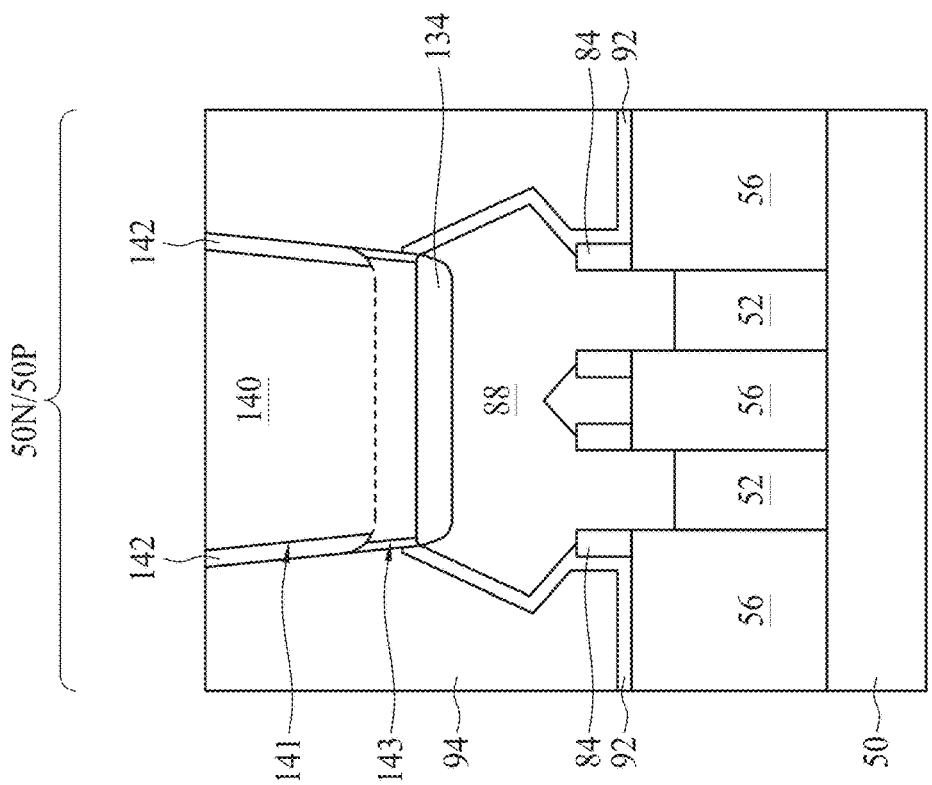
FIGS. 23A-23B are cross-sectional views of an intermediate stage in the manufacturing of FinFETs, in accordance with some embodiments.
Figure 23A:
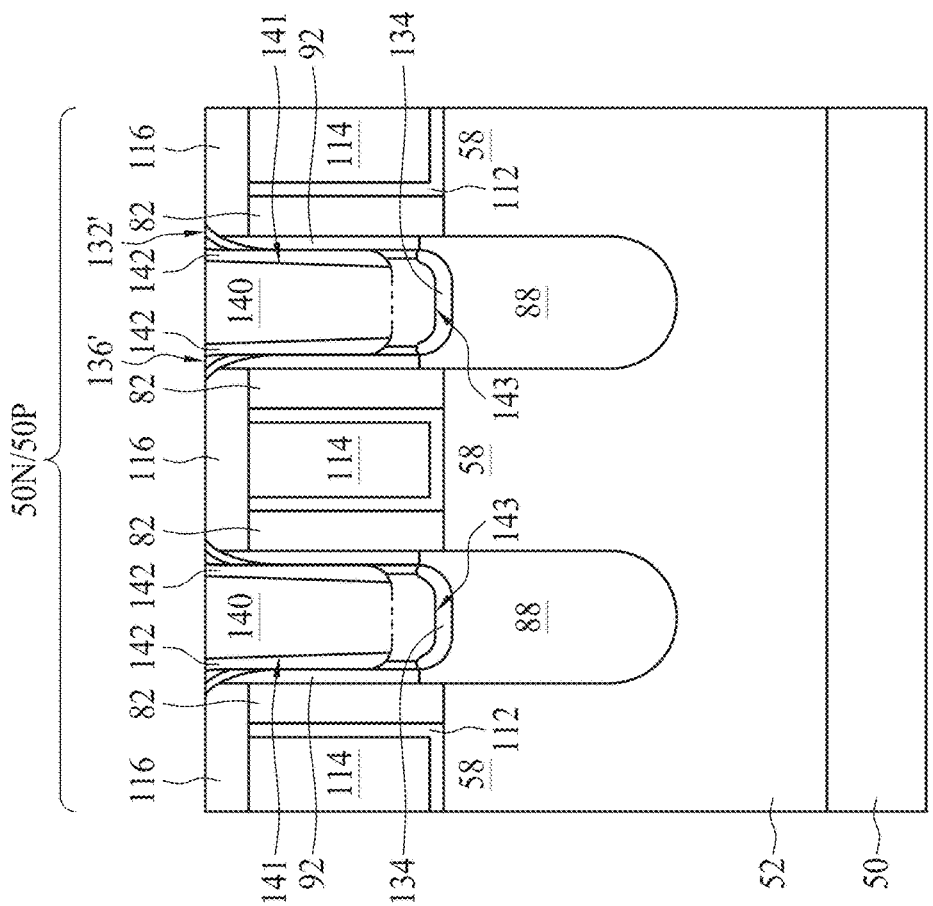

In some embodiments, portions of the conductive material 136 and/or the metal 132 may remain on the gate masks 116 and/or the CESL 92 after the removal process. FIGS. 23A-23B illustrate an example embodiment in which remaining portions 136' of the conductive material 136 and remaining portions 132' of the metal 132 are present after the removal process. The remaining portions 132' and/or 136' may be located between the contact spacers 142 and the gate masks 116 and/or between the contact spacers 142 and the CESL 92, in some cases. In some embodiments, the contact spacers 142 are physically separated from the sidewalls of the gate masks 116 by the remaining portions 132' and/or 136'. The remaining portions 132' and 136' may be from conductive material 136 or metal 132 that was previously deposited on upper portions of the gate masks 116 or the CESL 92, such as on curved sidewalls or curved top surfaces of the gate masks 116 or the CESL 92. In some cases, the remaining portions 136' of conductive material 136 may have a width in the range of about 0.5 nm and about 2 nm or a height in the range of about 0.5 nm and about 4 nm, though remaining portions 136' with other dimensions or shapes are possible. In some cases, the remaining portions 132' or 136' may have top surfaces that are coplanar with the gate masks 116, contact spacers 142, and/or the source/drain contacts 140.

In FIGS. 24A-24B, a second ILD 154 is deposited over the first ILD 94, the gate masks 116, the source/drain contacts 140, and the contact spacers 142. In some embodiments, the second ILD 154 is a flowable film formed by a flowable CVD method. In some embodiments, the second ILD 154 is formed of a dielectric material such as PSG, BSG, BPSG, USG, or the like, which may be deposited by any suitable method, such as CVD, PECVD, or the like. In some embodiments, an etch stop layer (ESL) 152 is formed between the second ILD 154 and the first ILD 94, the gate masks 116, the source/drain contacts 140, and the contact spacers 142. The ESL 152 may include a dielectric material, such as silicon nitride, silicon oxide, silicon oxynitride, or the like, having a high etching selectivity from the etching of the second ILD 154.

In FIGS. 25A-25B, source/drain contacts 162 and gate contacts 164 are formed to contact the source/drain contacts 140 and the gate electrodes 114, respectively. The source/drain contacts 162 are physically and electrically coupled to the source/drain contacts 140. The gate contacts 164 are physically and electrically coupled to the gate electrodes 114. In some embodiments, one or more source/drain contacts 162 and one or more gate contacts 164 may be formed together as a continuous conductive feature (not shown).

As an example to form the source/drain contacts 162 and the gate contacts 164, openings are formed through the second ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. In some embodiments, the conductive material is the same as the conductive material 139 of the source/drain contacts 140, which can reduce interfacial resistance. A planarization process, such as a CMP, may be performed to remove excess material from the top surface of the second ILD 154. The remaining liner and conductive material form the source/drain contacts 162 and the gate contacts 164 in the openings. The source/drain contacts 162 and the gate contacts 164 may be formed in distinct processes, or may be formed in the same process. Although shown as being formed in the same cross-sections, it should be appreciated that each of the source/drain contacts 162 and the gate contacts 164 may be formed in different cross-sections, which may avoid shorting of the contacts.

FIGS. 26A through 35B illustrate intermediate steps in the formation of source/drain contacts 240 (see FIGS. 35A-35B) that make electrical contact with the epitaxial source/drain regions 88, in accordance with some embodiments. Some of the materials, features, or steps described in the process of FIGS. 26A-35B for forming source/drain contacts 240 are similar to materials, features, or steps described in the process of FIGS. 2A-22B for forming source/drain contacts 140. Accordingly, some of the details of similar materials, features, or steps may not be repeated. For example, the step described for FIGS. 26A-26B may be performed on a structure similar to that shown in FIGS. 16A-16B, which may be formed using techniques similar to those described for FIGS. 2-16B. As such, some of the steps prior to FIGS. 26A-26B may be similar to those described previously for FIGS. 2-16B and are not repeated. FIGS. 26A, 27A, 28A, 29A, 30A, 31A, 32A, 33A, 34A, and 35A are cross-sectional views illustrated along a similar cross-section as reference cross-section A-A' in FIG. 1. FIGS. 26B, 27B, 28B, 29B, 30B, 31B, 32B, 33B, 34B, and 35B are cross-sectional views illustrated along a similar cross-section as reference cross-section B-B' in FIG. 1.

The process of FIGS. 26A-35B for forming source/drain contacts 240 has some similar advantages as the process of FIGS. 2A-22B for forming source/drain contacts 140. For example, by depositing an isolation material 138 (see FIGS. 32A-32B) after forming the metal-semiconductor alloy regions 134 and depositing a conductive material 136 in the contact openings 122 (see FIGS. 16A-16B), etching of the epitaxial source/drain regions 88 or the metal-semiconductor alloy regions 134 may be avoided during etching of the isolation material 138 (see FIGS. 33A-33B). Additionally, the isolation material 138 may be deposited as a blanket layer that covers all metal material outside of the contact openings 122 and on sidewalls of the contact openings 122, so that a subsequent selective deposition process (see FIGS. 34A-34B) is less likely to deposit conductive material in unwanted regions.

FIGS. 26A-26B illustrate the deposition of a photoresist 210 over a structure similar to the structure shown in FIGS. 16A-16B, in accordance with some embodiments. The photoresist 210 may fill the contact openings 122 (see FIGS. 16A-16B) and cover the conductive material 136. In some embodiments, the photoresist 210 may comprise one or more layers of a multi-layer photoresist structure deposited over the die. For example, the photoresist 210 may be a bottom anti-reflection coating (BARC), in some cases.

Figure 27B:
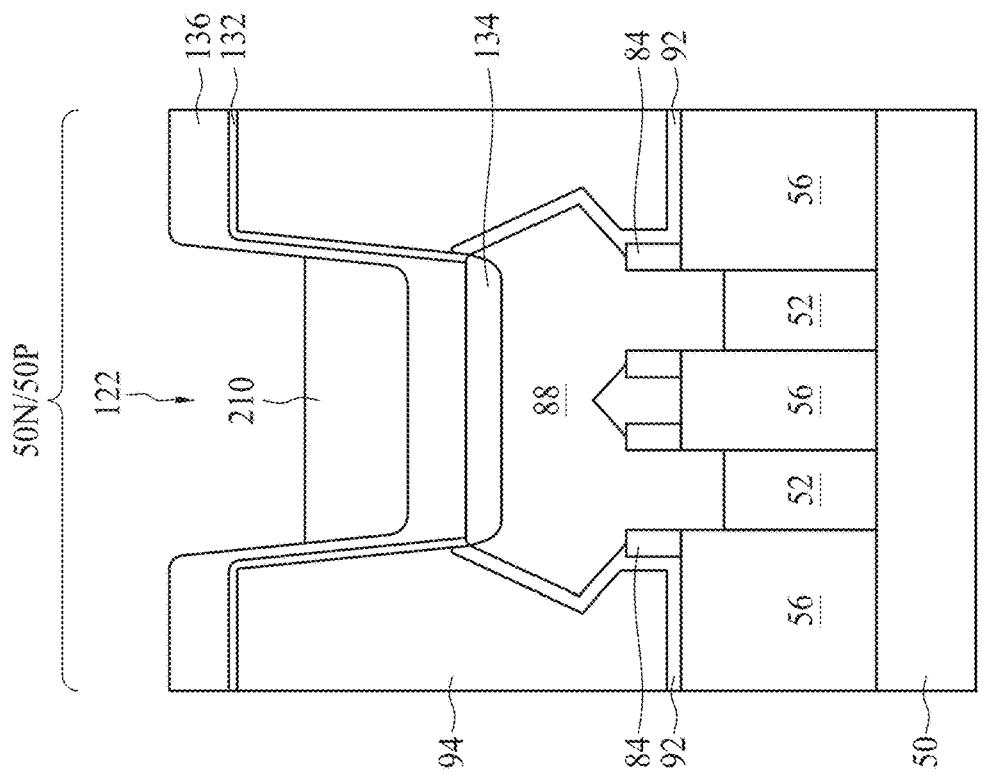
Figure 27A:
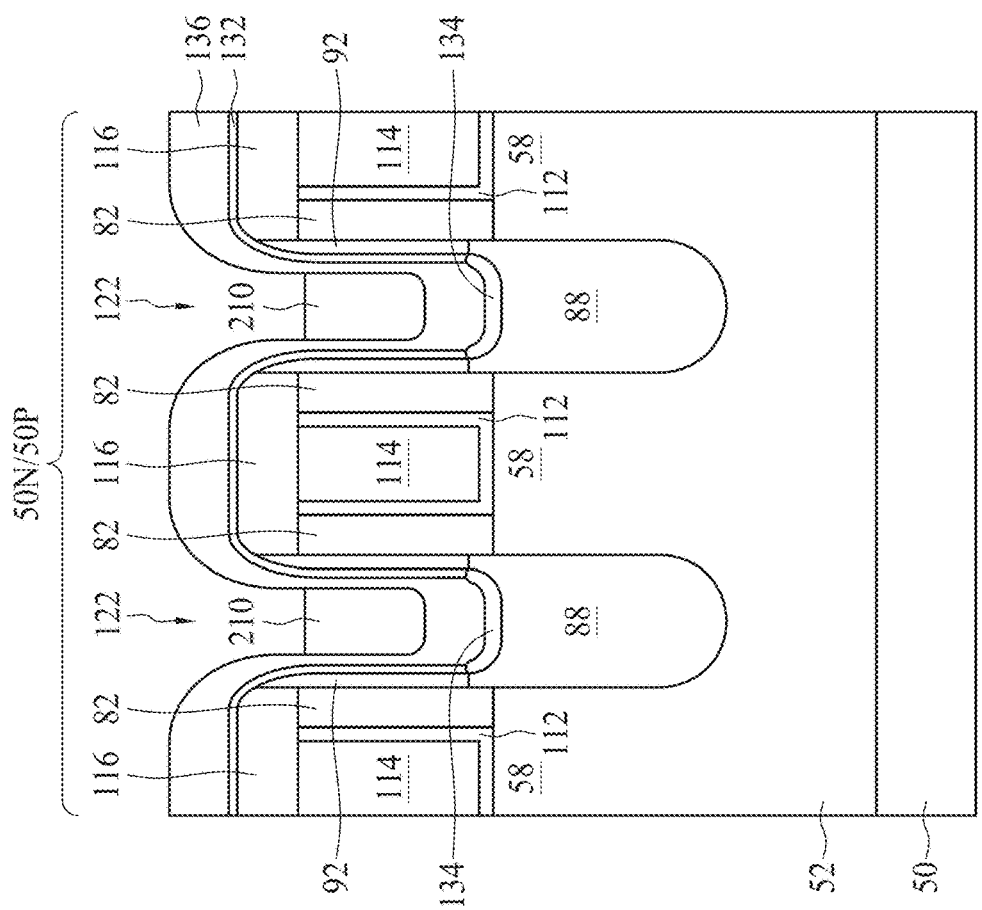

In FIGS. 27A-27B, the photoresist 210 is partially recessed, in accordance with some embodiments. The photoresist 210 may be partially recessed using, for example, a wet chemical process or the like. In some embodiments, recessing the photoresist 210 exposes the conductive material 136 that covers upper portions the gate masks 116, the first ILD 94, and/or the CESL 92. After recessing the photoresist 210, the conductive material 136 within lower portions of the contact openings 122 remains covered by the photoresist 210.

Figure 28B:
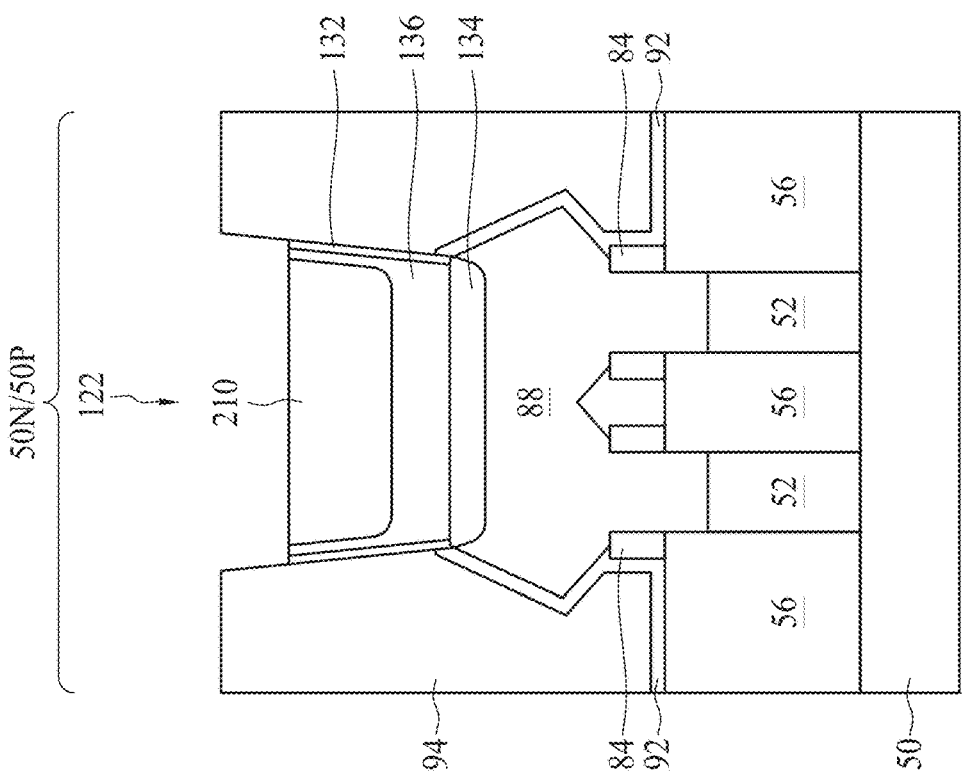
Figure 28A:
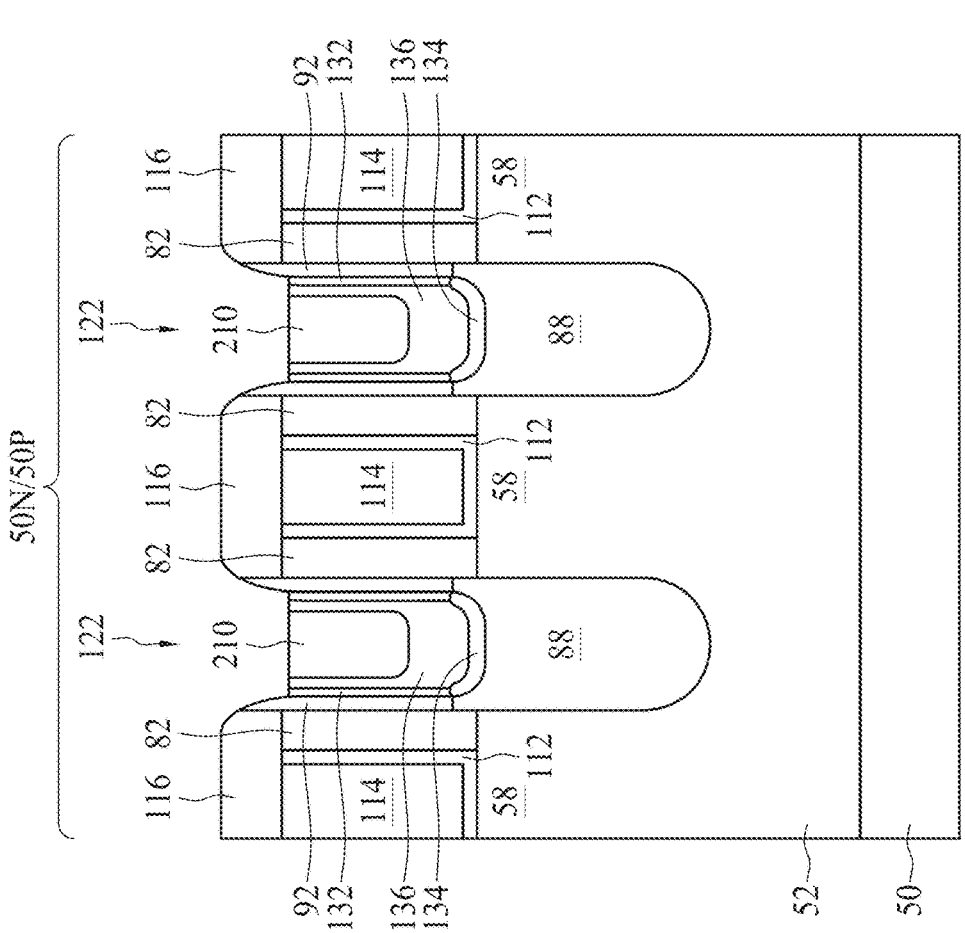

In FIGS. 28A-28B, an etching process is performed to remove excess portions of the conductive material 136 and the metal 132, in accordance with some embodiments. The etching process may include, for example, a wet etching process, which may be similar to the wet etching process described previously for FIGS. 17A-17B. In some cases, the photoresist 210 may protect covered portions of the conductive material 136 from the etching process. In this manner, the etching process may remove portions of the conductive material 136 and the metal 132 that are not covered by the photoresist 210. The etching process may expose surfaces of the gate masks 116, the first ILD 94, and/or the CESL 92. FIGS. 28A-28B show the remaining portions of the conductive material 136 and the metal 132 as having top surfaces that are approximately level with a top surface of the photoresist 210, but in other cases the conductive material 136 and/or the metal 132 may have top surfaces that are above or below a top surface of the photoresist 210.

Figure 29A:
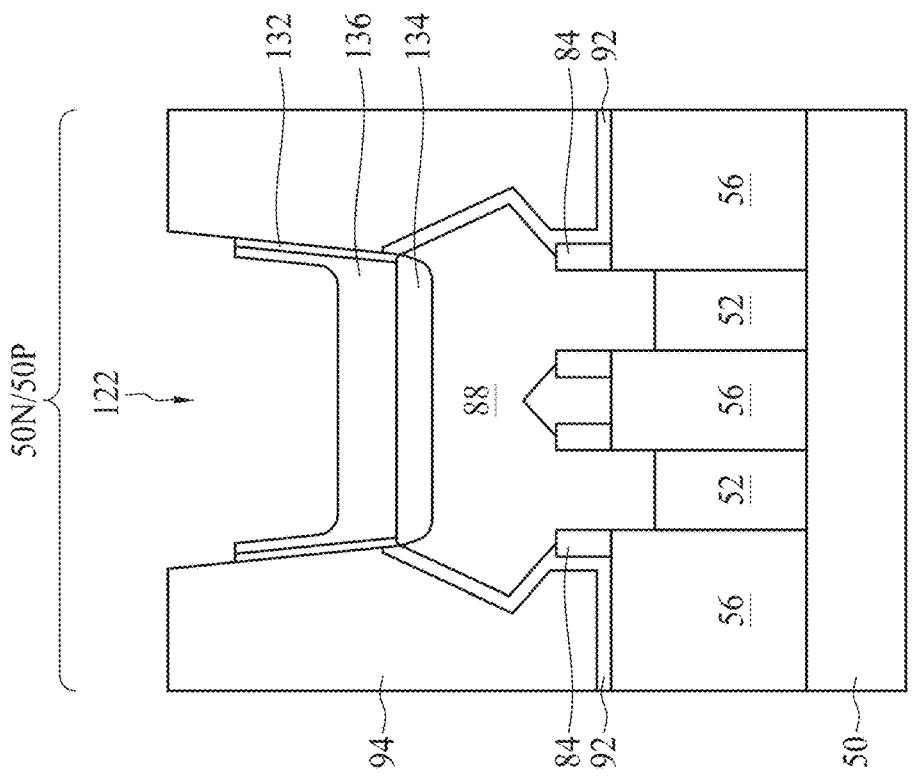
Figure 29B:
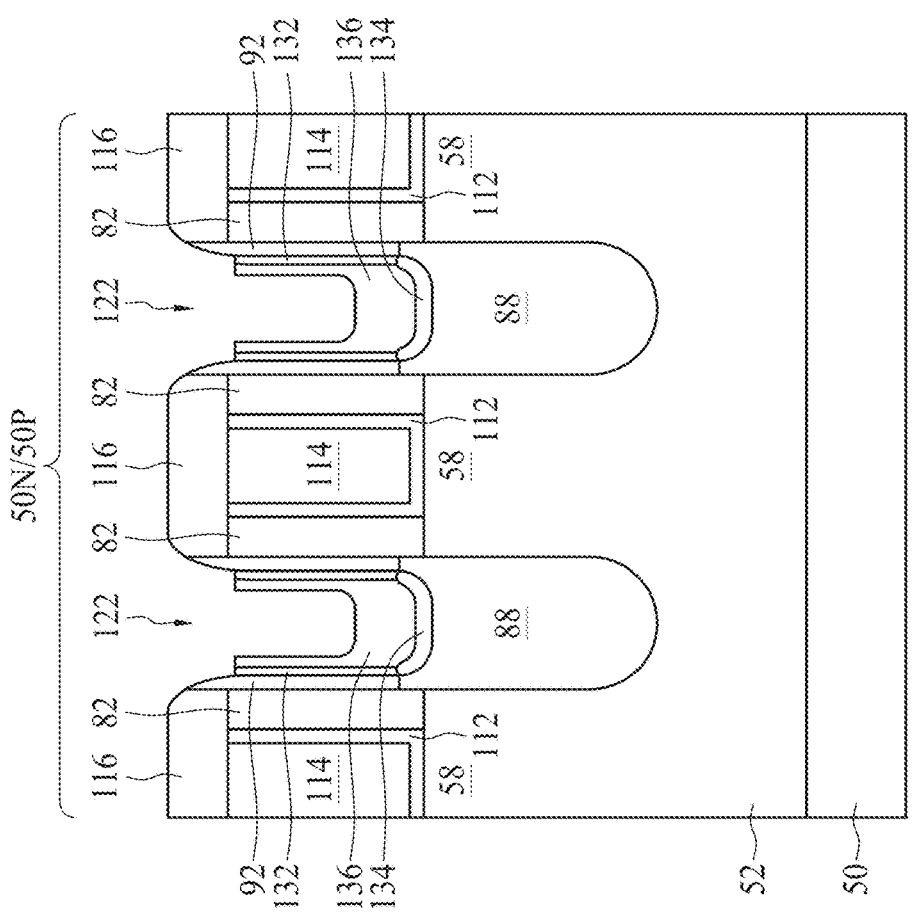

In FIGS. 29A-29B, the photoresist 210 may be removed using a suitable process, such as an ashing process. In some cases, a cleaning process may be performed after removing the photoresist 210. After removing the photoresist 210, the metal 132 and the conductive material 136 may partially or fully cover sidewalls of the contact openings 122.

Figure 30B:
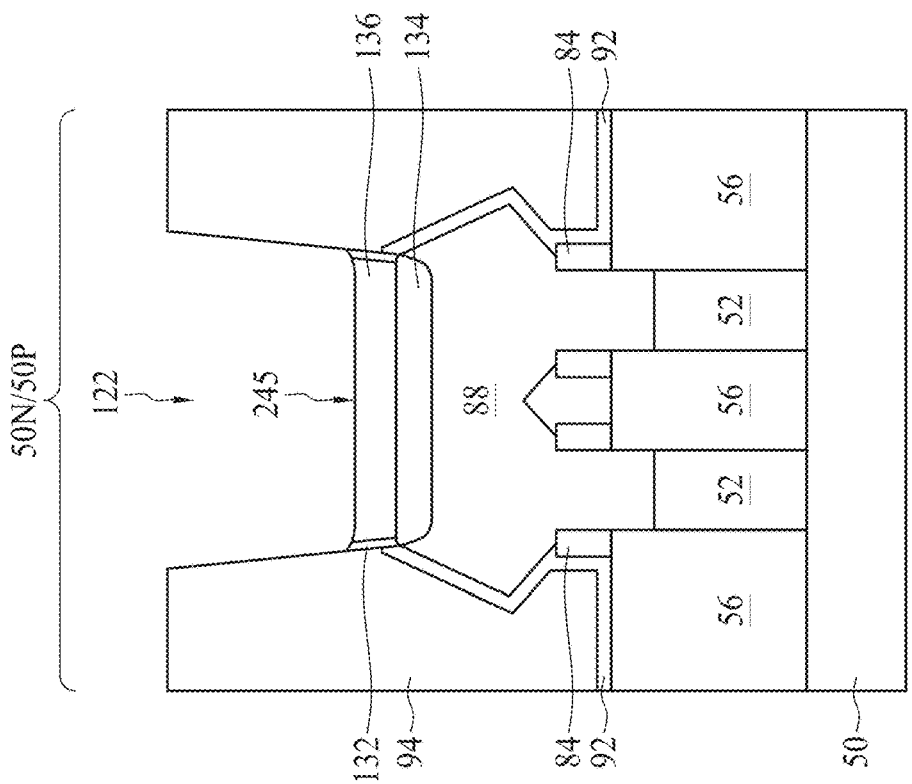
Figure 30A:
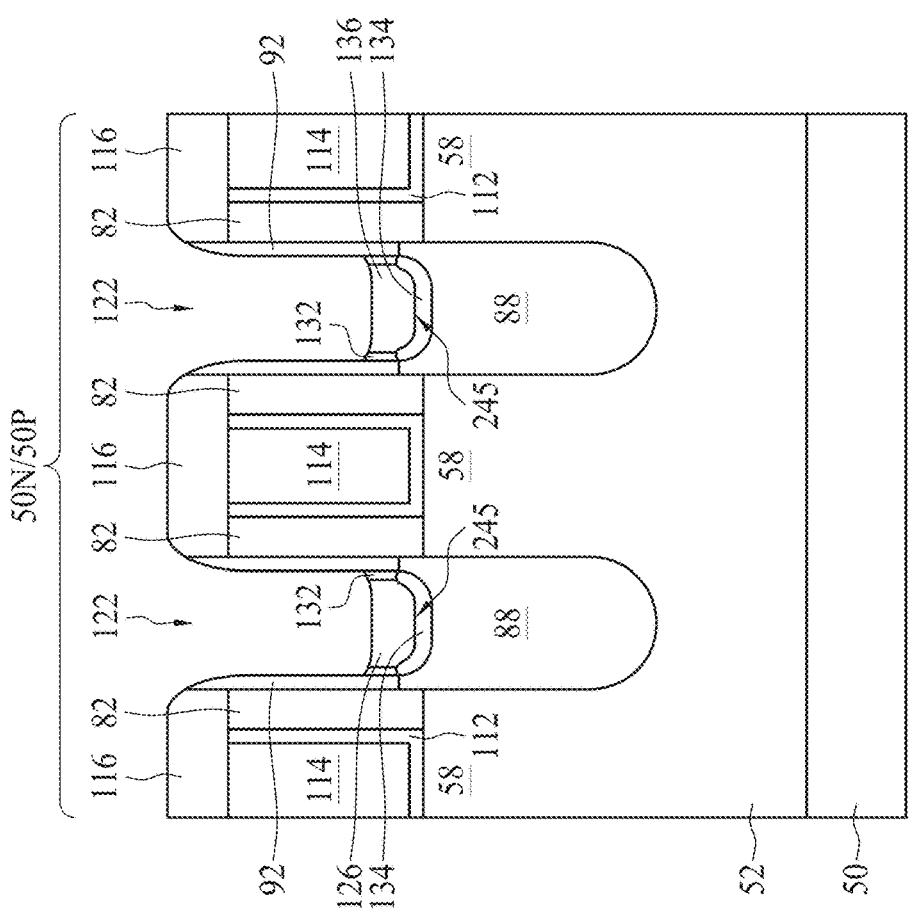

In FIGS. 30A-30B, an etching process is performed to remove the conductive material 136 and the metal 132 from sidewalls of the contact openings 122, in accordance with some embodiments. The etching process may include a wet etching process, in some embodiments. The wet etching process may be similar to the process described for FIGS. 17A-17B. After performing the etching process, lower conductive regions 245 of the conductive material 136 remain in the contact openings 122. The lower conductive regions 245 may substantially cover the metal-semiconductor alloy regions 134 and the epitaxial source/drain regions 88.

Figure 31B:
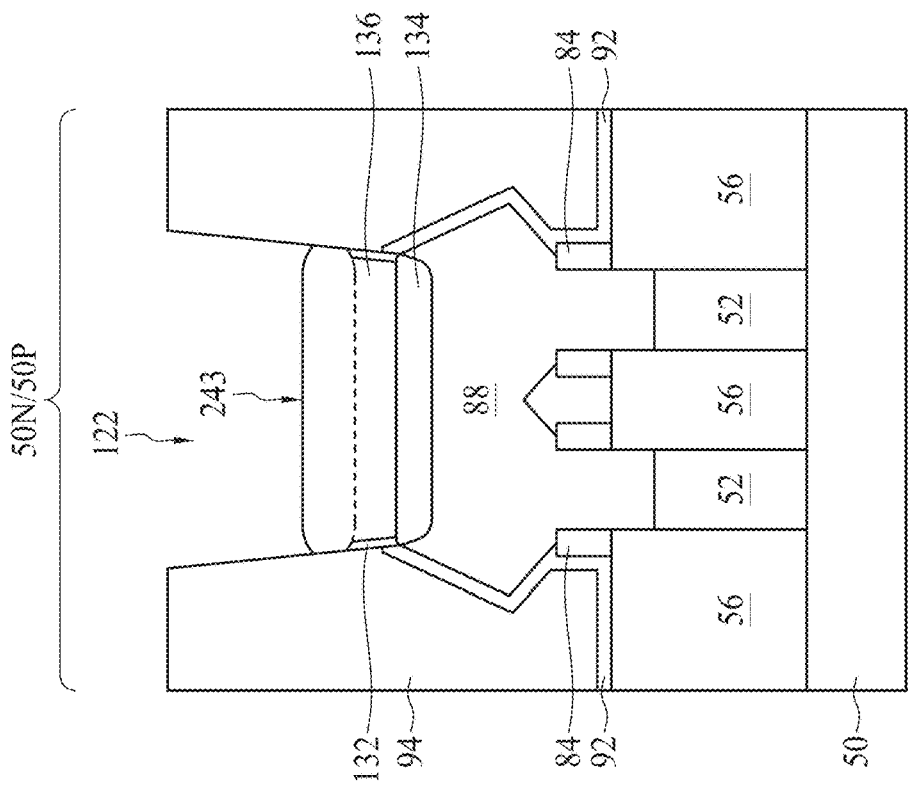
Figure 31A:
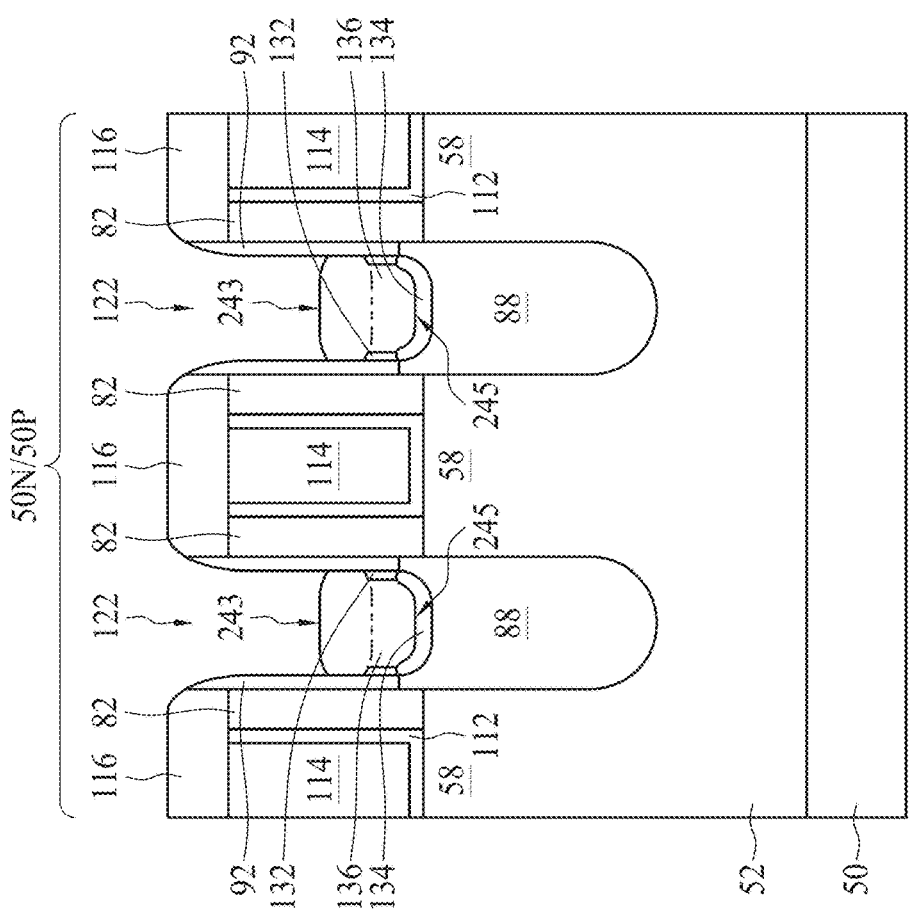

In FIGS. 31A-31B, a conductive material is deposited on the lower conductive regions 245 in the contact openings 122, forming middle conductive regions 243, in accordance with some embodiments. The conductive material may be similar to the conductive material 139 described previously for FIGS. 20A-20B, and may be deposited using similar techniques. For example, the conductive material may be a fluorine-free tungsten (FFW) that is deposited using a selective CVD process. Other materials or deposition techniques are possible. In some cases, sidewalls of the contact openings 122, upper portions of the gate masks 116, and/or upper portions of the first ILD 94 may be free of the conductive material after forming the middle conductive regions 243. Because the metal 132 has been previously removed from sidewalls of the contact openings 122, the conductive material of the middle conductive regions 243 may physically contact sidewall surfaces of the CESL 92 and/or the first ILD 94.

Figure 32B:
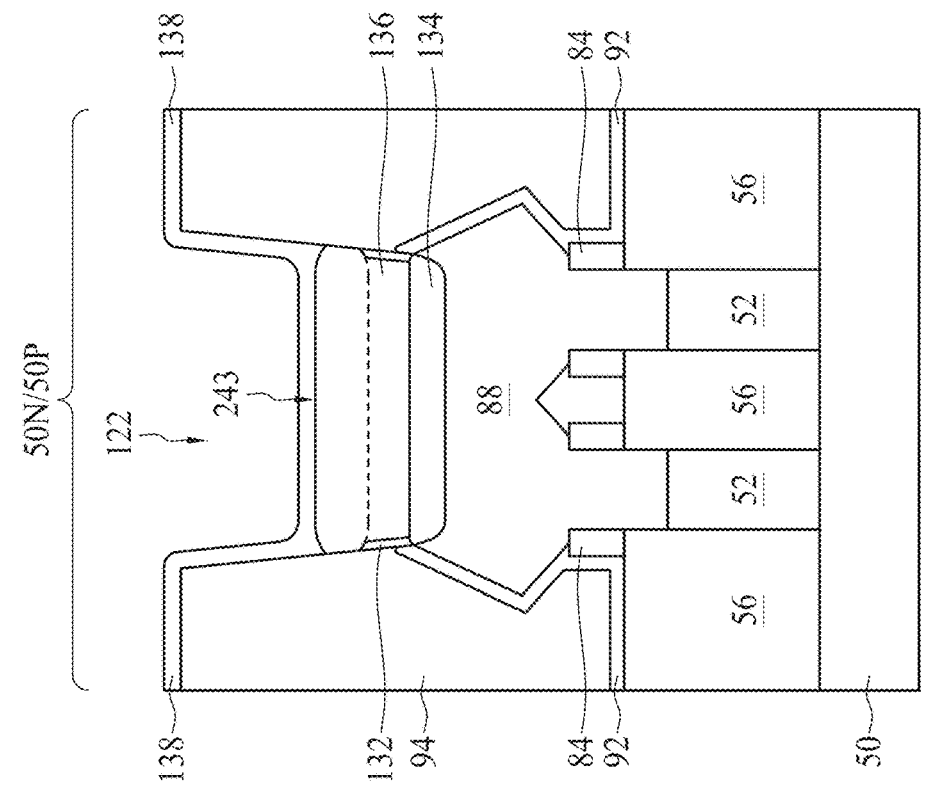
Figure 32A:
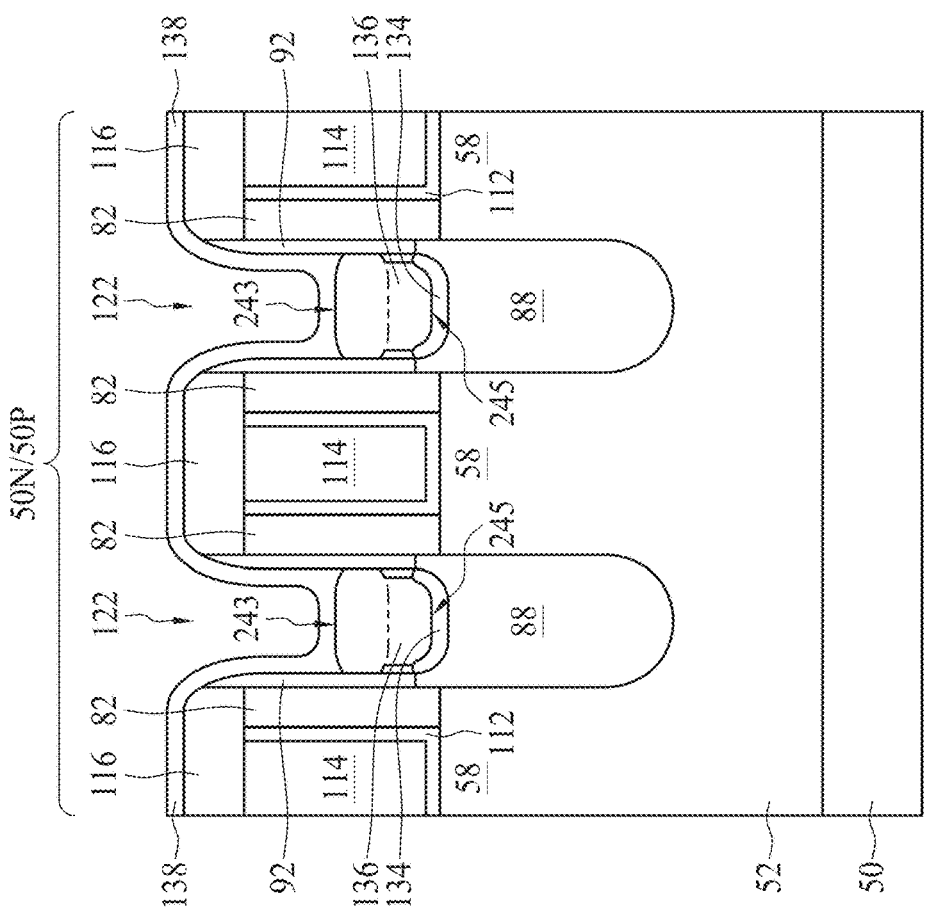

In FIGS. 32-32B, an isolation material 138 is conformally deposited within the contact openings 122 and over the middle conductive regions 243, in accordance with some embodiments. The isolation material 138 may be similar to the isolation material 138 described previously for FIGS. 18A-18B, and may be formed using similar techniques. The isolation material 138 deposited within the contact openings 122 may also extend on sidewalls of the CESL 92 and on sidewalls of the first ILD 94, in some embodiments. Because the metal 132 has been previously removed from sidewalls of the contact openings 122, the isolation material 138 may physically contact sidewall surfaces of the CESL 92 and/or the first ILD 94.

In FIGS. 33A-33B, an etching process is performed to extend the contact openings 122 through the isolation material 138 to expose the middle conductive regions 243, in accordance with some embodiments. The etching process may be similar to the etching process described previously for FIGS. 19A-19B. After performing the etching process, portions of the middle conductive regions 243 are exposed, but the sidewalls of the contact openings 122 remain covered with the isolation material 138 and upper portions of the gate masks 116, the CESL 92, and the first ILD 94 remain covered with the isolation material 138. By forming the middle conductive regions 243 and the lower conductive regions 245 before depositing the isolation material 138, etching of the epitaxial source/drain regions 88 or the metal-semiconductor alloy regions 134 may be avoided during etching of the isolation material 138.

Figure 34B:
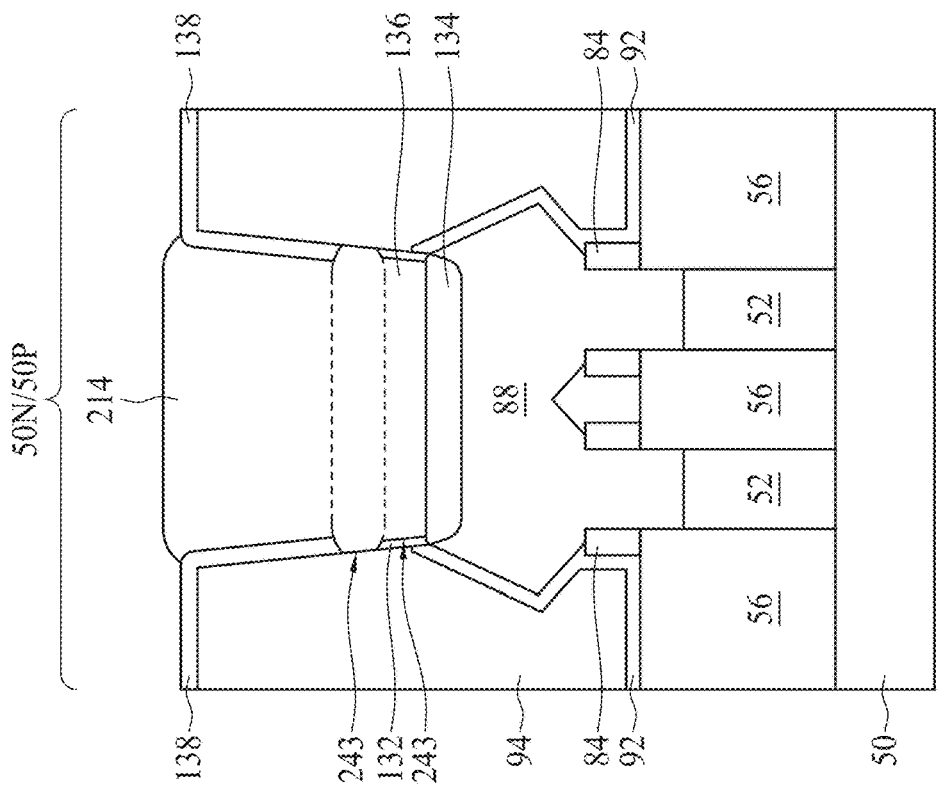
Figure 34A:
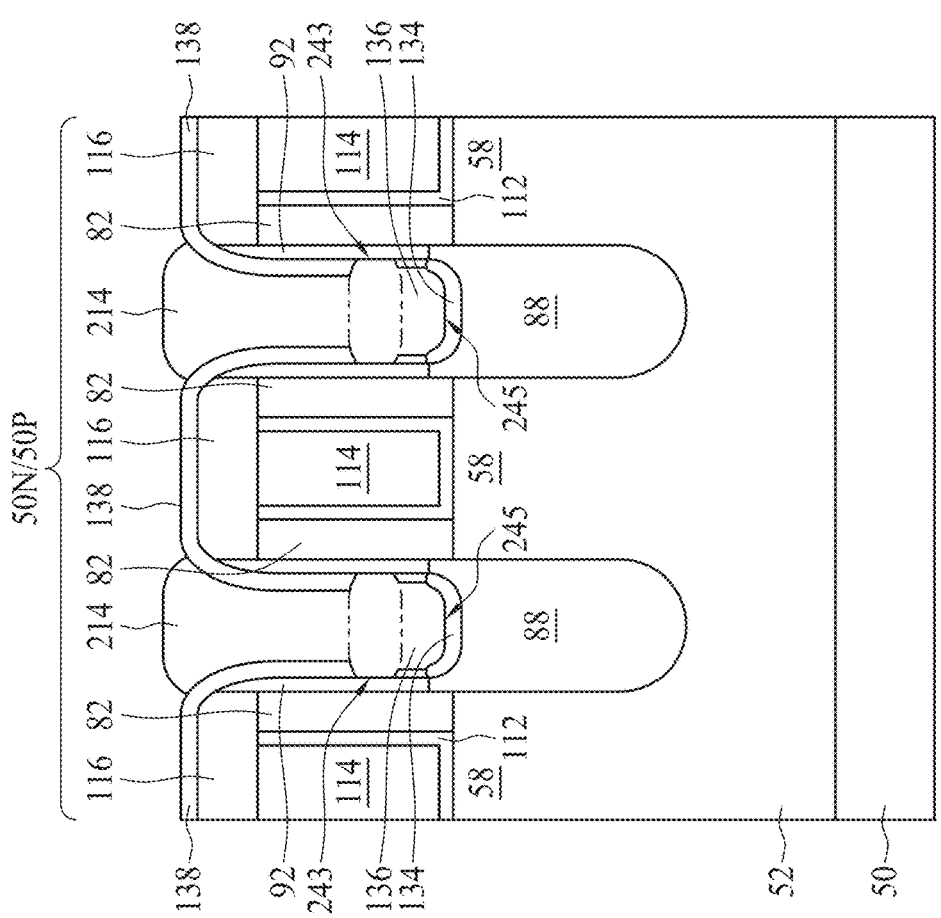

In FIGS. 34A-34B, additional conductive material 214 is deposited to at least partially fill remaining regions of the contact openings 122, in accordance with some embodiments. The additional conductive material 214 may be deposited on the previously-deposited conductive material of the middle conductive regions 243. The additional conductive material 214 may be deposited using the same deposition process used for the previously-deposited conductive material of the middle conductive regions 243 or may be deposited using a different deposition process. The additional conductive material 214 may be similar to the additional conductive material 139 described for FIGS. 21A-21B, and may be deposited using similar techniques.

In FIGS. 35A-35B, a removal process is performed to remove excess portions of the isolation material 138 and the conductive material 214, thereby forming source/drain contacts 240 and contact spacers 242, in accordance with some embodiments. In some embodiments, the removal process comprises a planarization process such as a chemical mechanical polish (CMP), an etch-back process, combinations thereof, or the like. The removal process may be similar to the removal process described previously for FIGS. 22A-22B. The removal process may expose the gate masks 116, the CESL 92, and/or the first ILD 94. In some embodiments, the removal process removes portions of the gate masks 116, the CESL 92, and/or the first ILD 94.

After the removal process, the remaining conductive material 214 forms upper conductive regions 241 on the middle conductive regions 243. The upper conductive regions 241, the middle conductive regions 243, and the underlying lower conductive regions 245 form the source/drain contacts 240. In some embodiments, sidewalls of the lower conductive regions 245 are at least partially covered by metal 132. In some embodiments, sidewalls of the middle conductive regions 243 are free of the metal 132, and may physically contact the CESL 92 and the first ILD 94. In some embodiments, the upper conductive regions 241 are free of the metal 132 and are separated from the CESL 92 and the first ILD 94 by contact spacers 242 (see below). In some embodiments, the upper conductive regions 241 may have a height H3 that is in the range of about 10 nm to about 20 nm, the middle conductive regions 243 may have a height H4 that is in the range of about 5 nm to about 15 nm, and the lower conductive regions 245 may have a height H5 that is in the range of about 3 nm to about 6 nm. Other heights are possible.

In some embodiments, the upper conductive regions 241 may have a width that is smaller than a width of the middle conductive regions 243 and/or a width of the lower conductive regions 245. In some cases, the difference between the widths of the upper conductive regions 241, the middle conductive regions 243, and the lower conductive regions 245 may give the source/drain contacts 240 an "upside-down mushroom" shape, as shown in FIGS. 35A-35B. In some embodiments, the middle conductive regions 243 may protrude from the upper conductive regions 241 a distance D4 that is in the range of about 0.5 nm to about 2.5 nm. Other widths or distances are possible. In some embodiments, the upper conductive regions 241 near the middle conductive regions 243 may have an angle A2 with respect to the horizontal that is in the range of about 40° to about 105°, though other angles are possible.

After the removal process, the remaining portions of the isolation material 138 form the contact spacers 242. The contact spacers 242 surround the upper conductive regions 241 of the source/drain contacts 240. The contact spacers 242 may physically extend on surfaces of the gate masks 116, the CESL 92, and/or the first ILD 94. In some embodiments, the contact spacers 242 are physically separated from the sidewalls of the gate masks 116 by the CESL 92. In some embodiments, the contact spacers 242 are free of the metal 132. In this manner, the contact spacers 242 may separate the upper conductive regions 241 from the gate masks 116, the CESL 92, and/or the first ILD 94. After the removal process, top surfaces of the gate masks 116, the first ILD 94, the contact spacers 242, and the source/drain contacts 240 may be coplanar (within process variations). In some embodiments, the removal process exposes top surfaces of the CESL 92, which may also be coplanar with the other top surfaces. In some embodiments, the height of the gate masks 116 is reduced until the top surfaces of the gate masks 116 and the CESL 92 are coplanar (within process variation), so that the contact spacers 142 are physically separated from the sidewalls of the gate masks 116 by the CESL 92.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 36B:
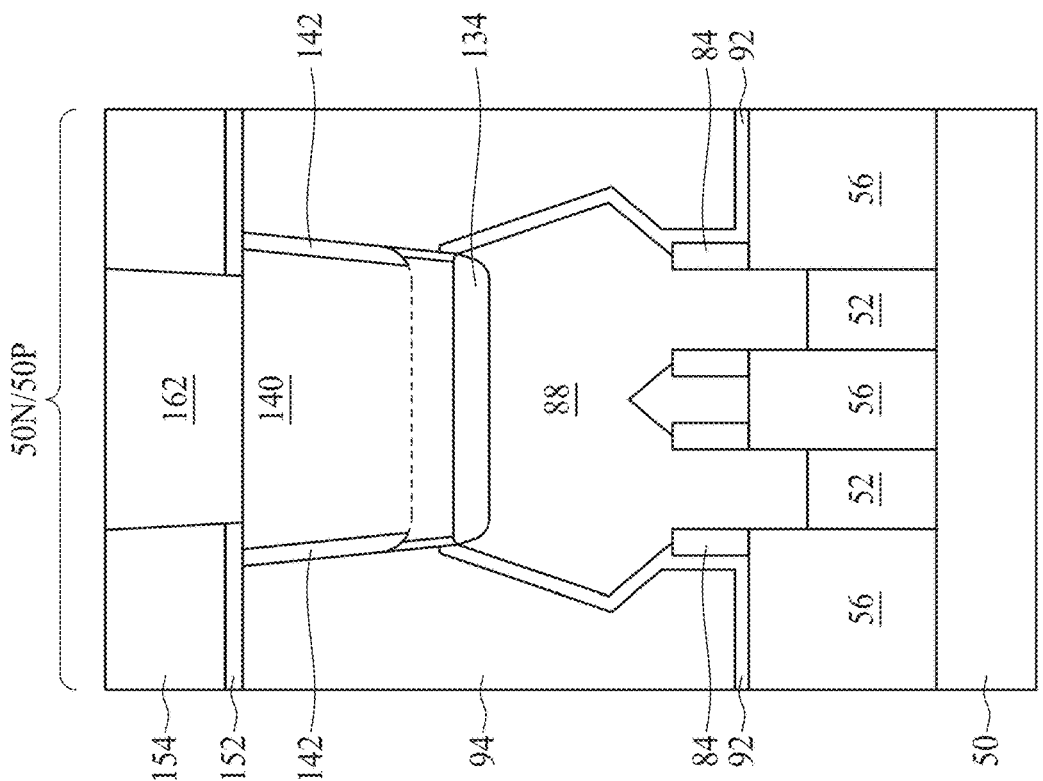
FIGS. 36A-36C are cross-sectional views of an intermediate stage in the manufacturing of nano-FETs, in accordance with some embodiments.
Figure 36A:
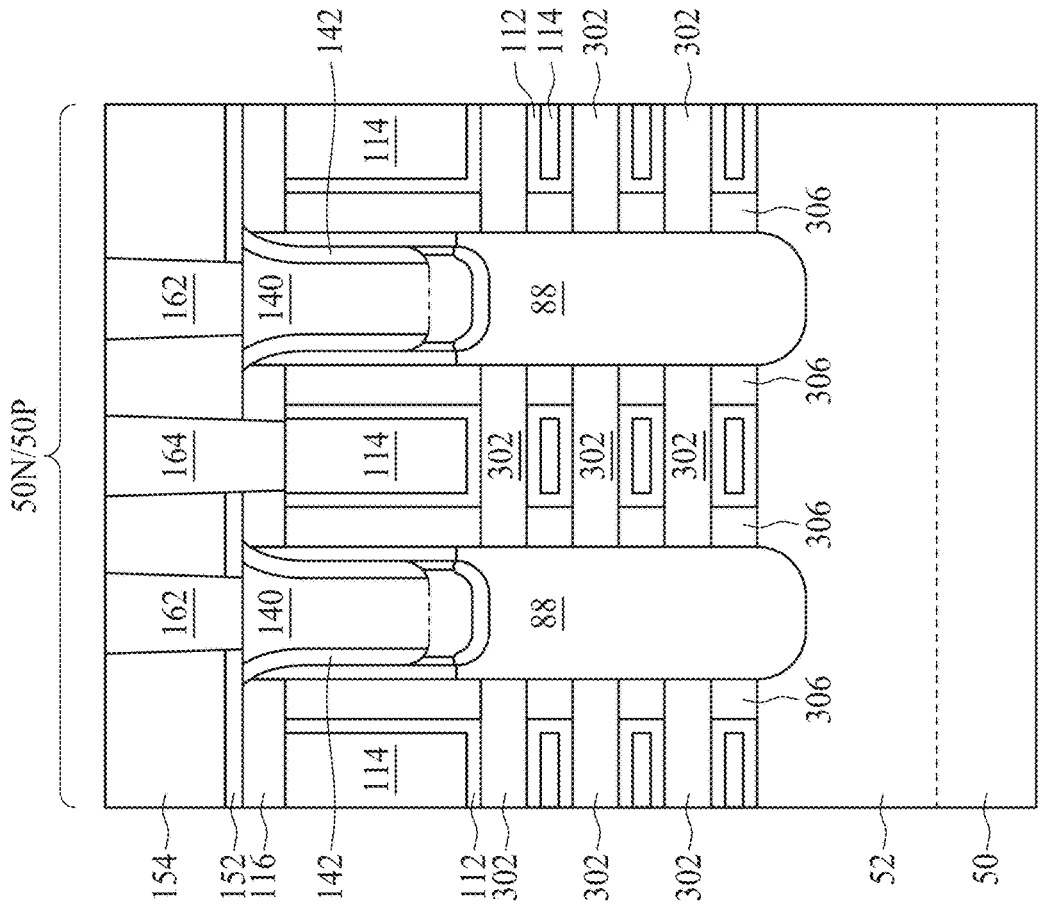
Figure 36C:
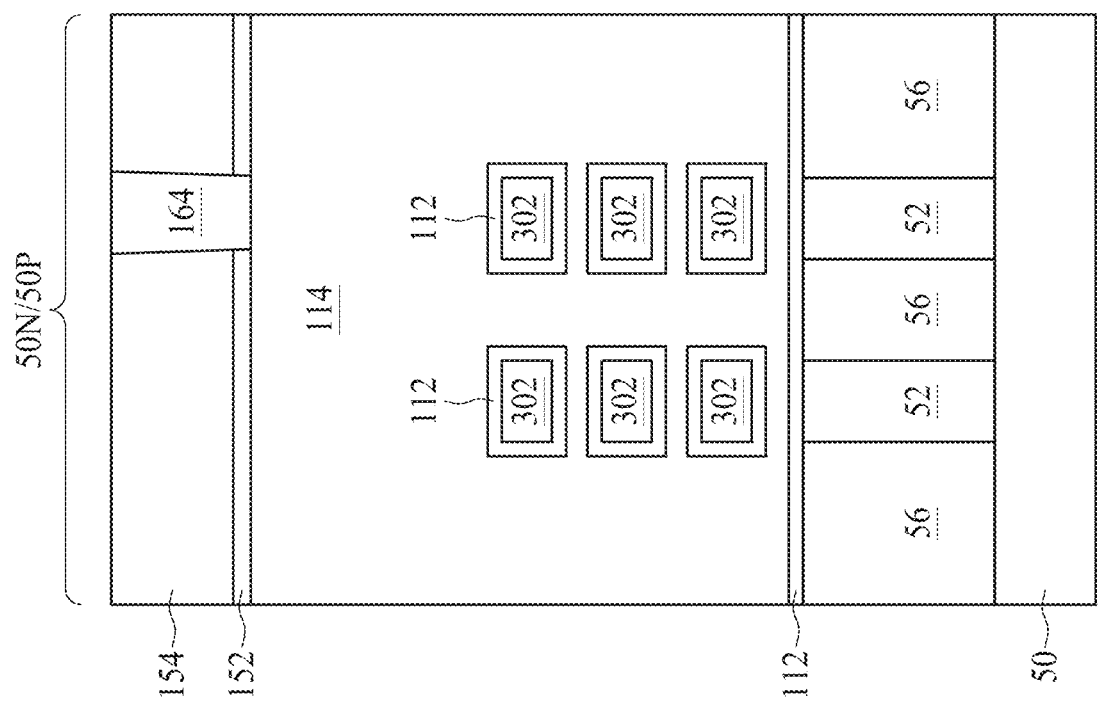

As an example, FIGS. 36A, 36B, and 36C illustrate cross-sectional views of an NSFET device, in accordance with some embodiments. FIG. 36A illustrates a cross-sectional along a similar cross-section as reference cross-section A-A' in FIG. 1, FIG. 36B illustrates a cross-sectional along a similar cross-section as reference cross-section B-B' in FIG. 1, and FIG. 36C illustrates a cross-sectional along a similar cross-section as reference cross-section C-C' in FIG. 1. The structure illustrated in FIGS. 36A-36C is similar to the structure illustrated in FIGS. 25A-25B except for nanostructures 302 (see below) instead of fins 52, with like features being labeled by like numerical references. Accordingly, descriptions of the like features are not repeated herein. For example, the NSFET shown in FIGS. 36A-36C includes source/drain contacts 140, which are similar to the source/drain contacts 140 shown in FIGS. 25A-25B and which may be formed using a similar process. In other embodiments, the source/drain contacts 140 may be similar to other embodiments described herein and may be formed using similar processes.

Instead of the fins 52 (see FIGS. 25A-25B), the structure illustrated in FIGS. 36A-36C comprises nanostructures 302, such that portions of the gate stacks (e.g., the gate dielectrics 112 and the gate electrodes 114) wrap around the nanostructures 302. In some embodiments, the portions of the gate stacks that wrap around the nanostructures 302 are isolated from adjacent epitaxial source/drain regions 88 by spacers 306. In some embodiments, the nanostructures 302 may be formed using similar materials as the substrate 50 and the description is not repeated herein. In some embodiments, the nanostructures 302 and the substrate 50 comprise a same material. In other embodiments, the nanostructures 302 and the substrate 50 comprise different materials. The spacers 306 may comprise a material such as silicon nitride or silicon oxynitride, although any suitable material, such as low-dielectric constant (low-k) materials having a k-value less than about 3.5, may be utilized.

Embodiments may achieve advantages. Source/drain contacts 140 (and source/drain contacts 240) may be formed having improved yield and reduced resistance. Initially depositing conductive material 136 to form lower conductive regions 137 within the contact openings 122 before depositing the isolation material 138 can allow for little or no etching of the epitaxial source/drain region 88 or the metal-semiconductor alloy regions 134 during etching of the isolation material 138 to form contact spacers 142. Reducing the etching of the epitaxial source/drain region 88 in this manner can allow the source/drain contacts 140 to contact regions of the epitaxial source/drain region 88 having higher doping, which can reduce contact resistance. By depositing the conductive material 136 over the metal-semiconductor alloy regions 134, the chance of the metal-semiconductor alloy regions 134 being damaged or etched may be reduced. Additionally, the isolation material 138 can cover metal material or metal residue during subsequent selective deposition of conductive material 139, and thus reduce the chance of the conductive material 139 being deposited in unwanted regions of the device, such as on surfaces outside of the contact openings 122. Manufacturing yield and device performance may thus be improved.

In accordance with an embodiment of the present disclosure, a method includes depositing an inter-layer dielectric (ILD) over a source/drain region; forming a contact opening through the ILD, wherein the contact opening exposes the source/drain region; forming a metal-semiconductor alloy region on the exposed source/drain region; depositing a first layer of a conductive material on the metal-semiconductor alloy region; depositing an isolation material along sidewalls of the contact opening and over the first layer of the conductive material; etching the isolation material to expose the first layer of the conductive material, wherein the isolation material extends along sidewalls of the contact opening after etching the isolation material; and depositing a second layer of a conductive material on the exposed first layer of the conductive material. In an embodiment, the first layer of the conductive material extends over a top surface of the ILD. In an embodiment, depositing the first layer of the conductive material also deposits the first layer of the conductive material on sidewalls of the contact opening, and the method includes, before depositing the isolation material, performing an etching process to remove the first layer of the conductive material from the sidewalls of the contact opening. In an embodiment, the isolation material includes silicon nitride. In an embodiment, no etching of the source/drain region occurs during the etching of the isolation material. In an embodiment, depositing a second layer of the conductive material includes a selective CVD process. In an embodiment, forming a metal-semiconductor alloy region includes depositing a metal layer on sidewalls of the contact opening and on the source/drain region, wherein the metal layer extends between the first layer of conductive material and the ILD. In an embodiment, the first layer of the conductive material has a greater width than the second layer of the conductive material. In an embodiment, sidewalls of the isolation material physically contact the ILD.

In accordance with an embodiment of the present disclosure, a method includes forming a source/drain region adjacent a gate structure; depositing a contact etch stop layer (CESL) on the source/drain region; forming a contact opening through the CESL, the contact opening exposing the source/drain region and a sidewall of the CESL; forming a silicide region on the exposed source/drain region; conformally depositing a conductive material over the gate structure, on the silicide region, and on the exposed sidewall of the CESL; performing a first etching process on the conductive material to expose the sidewall of the CESL, wherein the conductive material remains on the silicide region after the first etching process; conformally depositing an isolation material on the remaining conductive material and on the exposed sidewall of the CESL; performing a second etching process on the isolation material to expose the remaining conductive material, wherein isolation material remains on the CESL after the second etching process; and after the second etching process, filling the contact opening with the conductive material. In an embodiment, the isolation material is separated from the silicide region by the conductive material. In an embodiment, a portion of the conductive material remains over the gate structure after the first etching process, wherein the isolation material is deposited on the portion of the conductive material. In an embodiment, the first etching process includes a wet etching process. In an embodiment, the silicide region includes a silicide nitride region. In an embodiment, the conductive material is tungsten.

In accordance with an embodiment of the present disclosure, a device includes a gate structure on a channel region of a substrate; a gate mask on the gate structure; a source/drain region adjoining the channel region; a source/drain contact connected to the source/drain region, including: a lower contact region overlying the source/drain region; and an upper contact region on the lower contact region; and a contact spacer around the upper contact region, wherein the contact spacer is over the lower contact region. In an embodiment, the contact spacer physically contacts a sidewall of the gate mask. In an embodiment, the device includes a region of conductive material between the contact spacer and the gate mask, wherein the region of conductive material is separated from the source/drain contact by the contact spacer, wherein the source/drain contact includes the conductive material. In an embodiment, the lower contact region protrudes laterally from the upper contact region. In an embodiment, the device includes a metal-semiconductor alloy region between the source/drain region and the lower contact region of the source/drain contact, wherein the contact spacer is free of the metal-semiconductor alloy region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an inter-layer dielectric (ILD) over a source/drain region;
   forming a contact opening through the ILD, wherein the contact opening exposes the source/drain region;
   forming a metal-semiconductor alloy region on the source/drain region;
   depositing a first layer of a conductive material on the metal-semiconductor alloy region, wherein the first layer of the conductive material extends over a top surface of the ILD;
   after depositing the first layer of the conductive material, depositing an isolation material along inner sidewalls of the contact opening and over the first layer of the conductive material;
   etching the isolation material to expose the first layer of the conductive material, wherein the isolation material extends along sidewalls of the contact opening after etching the isolation material; and
   depositing a second layer of the conductive material on the first layer of the conductive material.

2. The method of claim 1, wherein depositing the first layer of the conductive material also deposits the first layer of the conductive material on sidewalls of the contact opening, and further comprising, before depositing the isolation material, performing an etching process to remove the first layer of the conductive material from the sidewalls of the contact opening.

3. The method of claim 1, wherein the isolation material comprises silicon nitride.

4. The method of claim 1, wherein no etching of the source/drain region occurs during the etching of the isolation material.

5. The method of claim 1, depositing a second layer of the conductive material comprises a selective CVD process.

6. The method of claim 1, wherein forming a metal-semiconductor alloy region comprises depositing a metal layer on sidewalls of the contact opening and on the source/drain region, wherein the metal layer extends between the first layer of conductive material and the ILD.

7. The method of claim 1, wherein the first layer of the conductive material has a greater width than the second layer of the conductive material.

8. The method of claim 1, wherein sidewalls of the isolation material physically contact the ILD.

9. The method of claim 1, wherein the forming the metal-semiconductor alloy region forms a silicide nitride region.

10. A method comprising:
    forming a source/drain region adjacent a gate structure;
    depositing a contact etch stop layer (CESL) on the source/drain region;
    forming a contact opening through the CESL, the contact opening exposing the source/drain region and a sidewall of the CESL;
    forming a silicide region on the source/drain region;
    conformally depositing a conductive material over the gate structure, on the silicide region, and on the sidewall of the CESL;
    performing a first etching process on the conductive material to expose the sidewall of the CESL, wherein conductive material remains on the silicide region after the first etching process;
    conformally depositing an isolation material on the conductive material and on the exposed sidewall of the CESL;
    performing a second etching process on the isolation material to expose the conductive material, wherein isolation material remains on the CESL after the second etching process; and
    after the second etching process, filling the contact opening with the conductive material.

11. The method of claim 10, wherein the isolation material is separated from the silicide region by the conductive material.

12. The method of claim 11, wherein a portion of the conductive material remains over the gate structure after the first etching process, wherein the isolation material is deposited on the portion of the conductive material.

13. The method of claim 10, wherein the first etching process comprises a wet etching process.

14. The method of claim 10, wherein the silicide region comprises a silicide nitride region.

15. A device comprising:
- a gate structure on a channel region of a substrate;
- a gate mask on the gate structure;
- a source/drain region adjoining the channel region;
- a contact etch stop layer (CESL) over the source/drain region;
- an inter-layer dielectric (ILD) over the CESL;
- a source/drain contact connected to the source/drain region, comprising:
  - a lower contact region overlying the source/drain region; and
  - an upper contact region on the lower contact region; and
- a contact spacer around the upper contact region, wherein the contact spacer is over the lower contact region, wherein the contact spacer physically contacts a sidewall of the gate mask.

16. The device of claim 15 further comprising a region of conductive material between the contact spacer and the gate mask, wherein the region of conductive material is separated from the source/drain contact by the contact spacer, wherein the source/drain contact comprises the conductive material.

17. The device of claim 15, wherein the lower contact region protrudes laterally from the upper contact region.

18. The device of claim 15 further comprising:
- a metal-semiconductor alloy region between the source/drain region and the lower contact region of the source/drain contact, wherein the contact spacer is free of the metal-semiconductor alloy region.

19. The device of claim 15, wherein a top surface of the lower contact region is higher than a bottom surface of the contact spacer.

20. The device of claim 15, wherein the lower contact region has a greater width than the upper contact region.

* * * * *